(12) United States Patent
Ito et al.

(10) Patent No.: US 9,893,289 B2
(45) Date of Patent: Feb. 13, 2018

(54) ORGANIC LIGHT-EMITTING DEVICE

(71) Applicant: SAMSUNG DISPLAY CO., LTD., Yongin, Gyeonggi-Do (KR)

(72) Inventors: Naoyuki Ito, Yongin (KR); Seul-Ong Kim, Yongin (KR); Youn-Sun Kim, Yongin (KR); Dong-Woo Shin, Yongin (KR); Jung-Sub Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 639 days.

(21) Appl. No.: 14/496,756

(22) Filed: Sep. 25, 2014

(65) Prior Publication Data

US 2015/0357574 A1    Dec. 10, 2015

(30) Foreign Application Priority Data

Jun. 9, 2014  (KR) .................. 10-2014-0069566

(51) Int. Cl.
| | | |
|---|---|---|
| *B32B 9/00* | (2006.01) | |
| *B32B 19/00* | (2006.01) | |
| *H01L 51/00* | (2006.01) | |
| *H01L 51/50* | (2006.01) | |

(52) U.S. Cl.
CPC ...... *H01L 51/0052* (2013.01); *H01L 51/0058* (2013.01); *H01L 51/006* (2013.01); *H01L 51/0054* (2013.01); *H01L 51/0061* (2013.01); *H01L 51/0067* (2013.01); *H01L 51/0072* (2013.01); *H01L 51/0073* (2013.01); *H01L 51/5012* (2013.01); *H01L 51/5016* (2013.01); *H01L 51/5056* (2013.01); *H01L 51/5072* (2013.01); *H01L 51/5096* (2013.01); *H01L 2251/308* (2013.01)

(58) Field of Classification Search
None
See application file for complete search history.

(56) References Cited

U.S. PATENT DOCUMENTS

| 2010/0295445 A1 | 11/2010 | Kuma et al. |
| 2012/0305904 A1 | 12/2012 | Kai et al. |

FOREIGN PATENT DOCUMENTS

| JP | 5208271 B2 | 3/2013 |
| KR | 10-2012-0026513 A | 3/2012 |
| KR | 10-2012-0039470 A | 4/2012 |
| KR | 10-2012-0041110 A | 4/2012 |
| KR | 10-2013-0009765 A | 1/2013 |
| WO | WO-2010-137678 A1 | 12/2010 |
| WO | WO-2012/070234 A1 | 5/2012 |

*Primary Examiner* — Jeffrey H Murray
(74) *Attorney, Agent, or Firm* — Lee & Morse, P.C.

(57) ABSTRACT

An organic light-emitting device including a first electrode; a second electrode facing the first electrode; and an organic layer between the first electrode and the second electrode, wherein the organic layer includes at least one first material represented by Formula 1 and at least one second material represented by Formula 2:

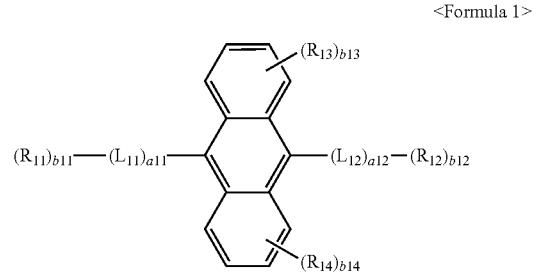

<Formula 1>

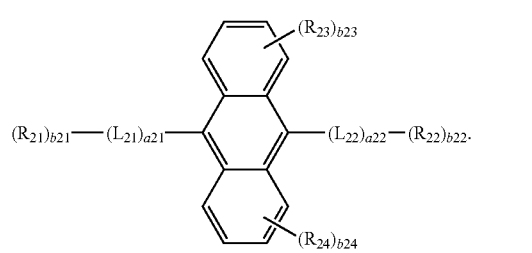

<Formula 2>

8 Claims, 1 Drawing Sheet

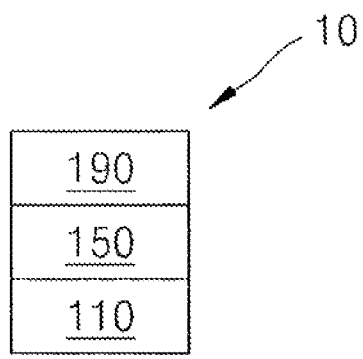

ORGANIC LIGHT-EMITTING DEVICE

CROSS-REFERENCE TO RELATED APPLICATION

Korean Patent Application No. 10-2014-0069566, filed on Jun. 9, 2014, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light emitting devices are self-emission devices that have wide viewing angles, high contrast ratios, short response times, and excellent brightness, driving voltage, and response speed characteristics, and produce full-color images.

The organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, may be recombined in the emission layer to produce excitons. These excitons may change from an excited state to a ground state, thereby generating light.

SUMMARY

Embodiments are directed to an organic light-emitting device

One or more embodiments provides an organic light-emitting device including a first electrode; a second electrode facing the first electrode; and an organic layer disposed between the first electrode and the second electrode, the organic layer includes at least one material selected from first materials represented by Formula 1 and at least one material selected from second materials represented by Formula 2:

<Formula 1>

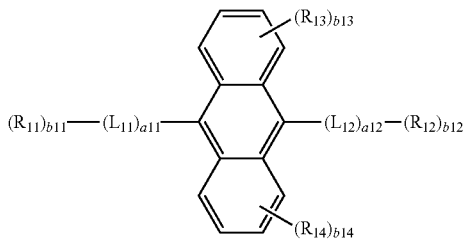

<Formula 2>

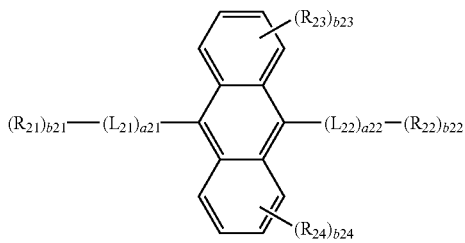

wherein in Formulae 1 and 2, $L_{11}$, $L_{21}$, and $L_{22}$ may be each independently selected from a substituted or unsubstituted $C_6$-$C_{60}$ arylene group and a substituted or unsubstituted $C_1$-$C_{60}$ heteroarylene group;

$L_{12}$ may be selected from a substituted or unsubstituted phenylene group and a substituted or unsubstituted naphthylenyl group;

a11 may be 0 or 1;

a12 may be 1 or 2;

a21 and a22 may be each independently selected from 0, 1, and 2;

$R_{11}$ and $R_{12}$ may be each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{21}$ and $R_{22}$ may be each independently selected from a substituted or unsubstituted pyridyl group, a substituted or unsubstituted quinolinyl group, and a substituted or unsubstituted isoquinolinyl group;

b11, b12, b21, and b22 may be each independently selected from 1, 2, and 3;

$R_{13}$, $R_{14}$, $R_{23}$, and $R_{24}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group a substituted or unsubstituted monovalent non-aromatic condensed polycyclic group, a substituted or unsubstituted monovalent non-aromatic condensed heteropolycyclic group, and —Si($Q_1$)($Q_2$)($Q_3$);

b13, b14, b23, and b24 may be each independently selected from 1, 2, 3 and 4;

at least one of substituents of the substituted $C_6$-$C_{60}$ arylene group, the substituted $C_1$-$C_{60}$ heteroarylene group, the substituted a phenylene group, the substituted naphthylenyl group, the substituted $C_6$-$C_{60}$ aryl group, the substituted $C_1$-$C_{60}$ heteroaryl group, the substituted monovalent non-aromatic condensed polycyclic group, the substituted monovalent non-aromatic condensed hetero-polycyclic group, the substituted pyridyl group, the substituted quinolinyl group, the substituted isoquinolinyl group, the substituted $C_1$-$C_{60}$ alkyl group, the substituted $C_1$-$C_{60}$ alkoxy group, the substituted $C_3$-$C_{10}$ cycloalkyl group, and the substituted $C_6$-$C_{60}$ aryloxy group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed hetero-polycyclic group, and —Si($Q_{11}$)($Q_{12}$)($Q_{13}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed hetero-polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed hetero-polycyclic group, and —Si($Q_{21}$)($Q_{22}$)($Q_{23}$); and —Si($Q_{31}$)($Q_{32}$)($Q_{33}$), $Q_1$ to $Q_3$, $Q_{11}$ to $Q_{13}$, $Q_{21}$ to $Q_{23}$ and $Q_{31}$ to $Q_{33}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWING

Features will be apparent to those of skill in the art by describing in detail exemplary embodiments with reference to the attached drawing in which:

FIG. 1 illustrates a schematic cross-sectional view of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

Expressions such as "at least one of," when preceding a list of elements, modify the entire list of elements and do not modify the individual elements of the list.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it can be directly or indirectly formed on the other layer, region, or component. That is, for example, intervening layers, regions, or components may be present.

The term "(an organic layer) includes at least one selected from first materials" or "(an organic layer) includes a first material" used herein includes a case in which "(an organic layer) includes one kind of material selected from first materials represented by Formula 1 and a case in which (an organic layer) includes two or more different kinds of materials selected from first materials represented Formula 1".

In FIG. 1, a substrate may be additionally disposed under a first electrode 110 or above a second electrode 190. The substrate may be a glass substrate or transparent plastic substrate, each with excellent mechanical strength, thermal stability, transparency, surface smoothness, ease of handling, and water repellency.

The first electrode 110 may be formed by depositing or sputtering a material for forming the first electrode on the substrate. When the first electrode 110 is an anode, the material for the first electrode 110 may be selected from materials with a high work function to facilitate hole injection. The first electrode 110 may be a reflective electrode or a transmissive electrode. The material for the first electrode 110 may be a transparent and highly conductive material, and examples of such a material may include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode, at least one of magnesium (Mg), aluminum (Al), aluminum-lithium (Al—Li), calcium (Ca), magnesium-indium (Mg—In), magnesium-silver (Mg—Ag) may be used.

The first electrode 110 may have a single-layer structure, or a multi-layer structure including two or more layers. For example, the first electrode 110 may have a three-layered structure of ITO/Ag/ITO, but the structure of the first electrode 110 is not limited thereto.

An organic layer 150 may be disposed on the first electrode 110. The organic layer 150 may include an emission layer.

The organic layer 150 may include at least one selected from first materials represented by Formula 1 and at least one selected from second materials represented by Formula 2. For example, the organic layer 150 may include a first material represented by Formula 1 and a second material represented by Formula 2.

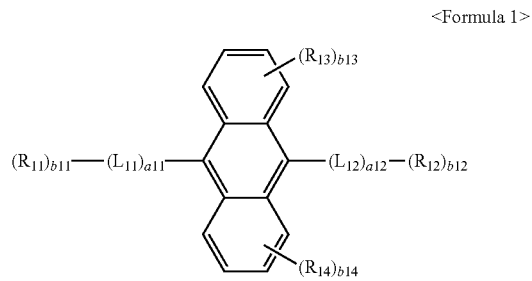

<Formula 1>

<Formula 2>

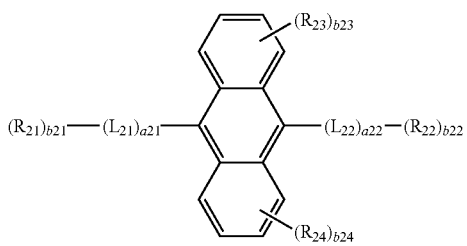

In Formulae 1 and 2, $L_{11}$, $L_{21}$, and $L_{22}$ may be each independently selected from a substituted or unsubstituted $C_6$-$C_{60}$ arylene group and a substituted or unsubstituted $C_1$-$C_{60}$ heteroarylene group;

$L_{12}$ may be selected from a substituted or unsubstituted phenylene group and a substituted or unsubstituted naphthylenyl group;

a11 may be 0 or 1;

a12 may be 1 or 2;

a21 and a22 may be each independently selected from 0, 1, and 2;

$R_{11}$ and $R_{12}$ may be each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{21}$ and $R_{22}$ may be each independently selected from a substituted or unsubstituted pyridyl group, a substituted or unsubstituted quinolinyl group, and a substituted or unsubstituted isoquinolinyl group;

b11, b12, b21, and b22 may be each independently selected from 1, 2, and 3;

$R_{13}$, $R_{14}$, $R_{23}$, and $R_{24}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{60}$ aryl group, a substituted or unsubstituted $C_6$-$C_{60}$ aryloxy group, a substituted or unsubstituted $C_1$-$C_{60}$ heteroaryl group a substituted or unsubstituted monovalent non-aromatic condensed polycyclic group, a substituted or unsubstituted monovalent non-aromatic condensed hetero-polycyclic group, and —Si($Q_1$)($Q_2$)($Q_3$);

b13, b14, b23, and b24 may be each independently selected from 1, 2, 3 and 4;

at least one of substituents of the substituted $C_6$-$C_{60}$ arylene group, the substituted $C_1$-$C_{60}$ heteroarylene group, the substituted a phenylene group, the substituted naphthylenyl group, the substituted $C_6$-$C_{60}$ aryl group, the substituted $C_1$-$C_{60}$ heteroaryl group, the substituted monovalent non-aromatic condensed polycyclic group, the substituted monovalent non-aromatic condensed hetero-polycyclic group, the substituted pyridyl group, the substituted quinolinyl group, the substituted isoquinolinyl group, the substituted $C_1$-$C_{60}$ alkyl group, the substituted $C_1$-$C_{60}$ alkoxy group, the substituted $C_3$-$C_{10}$ cycloalkyl group, and the substituted $C_6$-$C_{60}$ aryloxy group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed hetero-polycyclic group, and —Si($Q_{11}$)($Q_{12}$)($Q_{13}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_1$-$C_{60}$ aryl group, a $C_1$-$C_{60}$ aryloxy group, a $C_1$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed hetero-polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed hetero-polycyclic group, and —Si($Q_{21}$)($Q_{22}$)($Q_{23}$); and —Si($Q_{31}$)($Q_{32}$)($Q_{33}$), wherein $Q_1$ to $Q_3$, $Q_{11}$ to $Q_{13}$, $Q_{21}$ to $Q_{23}$ and $Q_{31}$ to $Q_{33}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, $L_{11}$, $L_{21}$, and $L_{22}$ in Formulae 1 and 2 may be each independently selected from a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene triazinylene group, a dibenzofuranylene group, and a dibenzothiophenylene group; and a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, dibenzofuranyl group, a dibenzothiophenyl group, a benzocarbazolyl group, a dibenzocarbazolyl group, a thiadiazolyl group, and an imidazopyridinyl group, but they are not limited thereto.

In some embodiments, $L_{11}$, $L_{21}$, and $L_{22}$ in Formulae 1 and 2 may be each independently selected from a phenylene group, a naphthylene group, a pyridinylene group, a quinolinylene group and an isoquinolinylene group; and a phenylene group, a naphthylene group, a pyridinylene group, a quinolinylene group, and an isoquinolinylene group, each substituted with at least one selected from a deuterium, —F, —Cl, —Br, —I, a cyano group, a nitro group, a $C_1$-$C_{20}$ alkyl group, a phenyl group, and a naphthyl group, but they are not limited thereto.

In some embodiments, $L_{11}$, $L_{21}$, and $L_{22}$ in Formulae 1 and 2 may be each independently selected from a group represented by any one of Formulae 3-1 to 3-6, but they are not limited thereto.

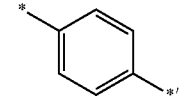

3-1

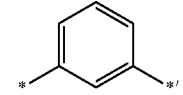

3-2

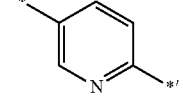

3-3

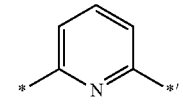

3-4

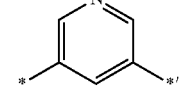

3-5

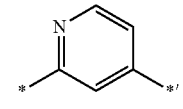

3-6

In Formulae 3-1 to 3-6, * and *' indicate binding sites to a neighboring atom.

For example, $L_{12}$ in Formula 1 may be selected from a phenylene group and a naphthylenyl group, but is not limited thereto.

a11 in Formula 1 indicates the number of $L_{11}$, and when a11 is 0, $(L_{11})_{a11}$ may indicate a direct bond.

a12 in Formula 1 indicates the number of $L_{12}$, and when a12 is 2, a plurality of $L_{12}$ may be identical or different.

a21 in Formula 2 indicates the number of $L_{21}$, and when a21 is 2, a plurality of $L_{21}$ may be identical or different. When a21 is 0, $(L_{21})_{a21}$ may indicate a direct bond.

a22 in Formula 2 indicates the number of $L_{22}$, and when a22 is 2, a plurality of $L_{22}$ may be identical or different. When a22 is 0, $(L_{22})_{a22}$ may indicate a direct bond.

For example, $R_{11}$ and $R_{12}$ in Formula 1 may be each independently selected from a phenyl group, a pentalenyl group, an indenyl group, a naphthyl group, a azulenyl group, a heptalenyl group, an indacenyl group, an acenaphthyl group, a fluorenyl group, a spiro-fluorenyl group, a benzofluorenyl group, a dibenzofluorenyl group, phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, a ovalenyl group, a pyrrolyl group, a thiophenyl group, a furanyl group, a imidazolyl group, a pyrazolyl group, a thiazolyl group, an isothiazolyl group, a oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group group, a benzocarbazolyl group, and a dibenzocarbazolyl group; and a phenyl group, a pentalenyl group, an indenyl group, a naphthyl group, an azulenyl group, a heptalenyl group, an indacenyl group, acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, dibenzofuranyl group, a dibenzothiophenyl group, a dibenzosilolyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, dibenzofuranyl group, a dibenzothiophenyl group, a benzocarbazolyl group, and a dibenzocarbazolyl group, but they are not limited thereto.

In some embodiments, $R_{11}$ and $R_{12}$ in Formula 1 may be each independently selected from a phenyl group, a naphthyl group, a fluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a quinolinyl group, an isoquinolinyl group, a carbazolyl group, a benzoquinolinyl group, a phthalazinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, dibenzofuranyl group, a dibenzothiophenyl group, a dibenzosilolyl group, a benzocarbazolyl group, and a dibenzocarbazolyl group; and a phenyl group, a naphthyl group, a fluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a quinolinyl group, an isoquinolinyl group, a carbazolyl group, a benzoquinolinyl group, a phthalazinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, dibenzofuranyl group, a dibenzothiophenyl group, a dibenzosilolyl group, a benzocarbazolyl group, and a dibenzocarbazolyl group, each substituted with at least one selected from a deuterium, —F, —Cl, —Br, —I, a cyano group, a nitro group, a $C_1$-$C_{20}$ alkyl group, a phenyl group, and a naphthyl group, but they are not limited thereto.

In some embodiments, $R_{11}$ and $R_{12}$ in Formula 1 may be each independently selected from a phenyl group, a naphthyl group, a fluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a furanyl group, a thiophenyl group, a carbazolyl group, a benzofuranyl group, a benzothiophenyl group, dibenzofuranyl group, a dibenzothiophenyl group, a dibenzosilolyl group, a benzocarbazolyl group, and a dibenzocarbazolyl group; and a phenyl group, a naphthyl group, a fluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a furanyl group, a thiophenyl group, a carbazolyl group, a benzofuranyl group, a benzothiophenyl group, dibenzofuranyl group, a dibenzothiophenyl group, a dibenzosilolyl group, a benzocarbazolyl group, and a dibenzocarbazolyl group, each substituted with at least one selected from a deuterium, —F, —Cl, —Br, —I, a cyano group, a nitro group, a $C_1$-$C_{20}$ alkyl group, a phenyl group, and a naphthyl group, but they are not limited thereto.

In other embodiments, $R_{11}$ and $R_{12}$ in Formula 1 may be each independently selected from a group represented by any one of one of Formulae 4-1 to 4-9 below, but they are not limited thereto.

In Formulae 4-1 to 4-9, * indicates a binding site to a neighboring atom.

For example, $R_{21}$ and $R_{22}$ in Formula 2 may be each independently selected from a pyridyl group, a quinolinyl group, and an isoquinolinyl group, but they are not limited thereto.

In some embodiments, $R_{21}$ and $R_{22}$ in Formula 2 may be each independently selected from a group represented by any one of one of Formulae 5-1 to 5-17 below, but they are not limited thereto.

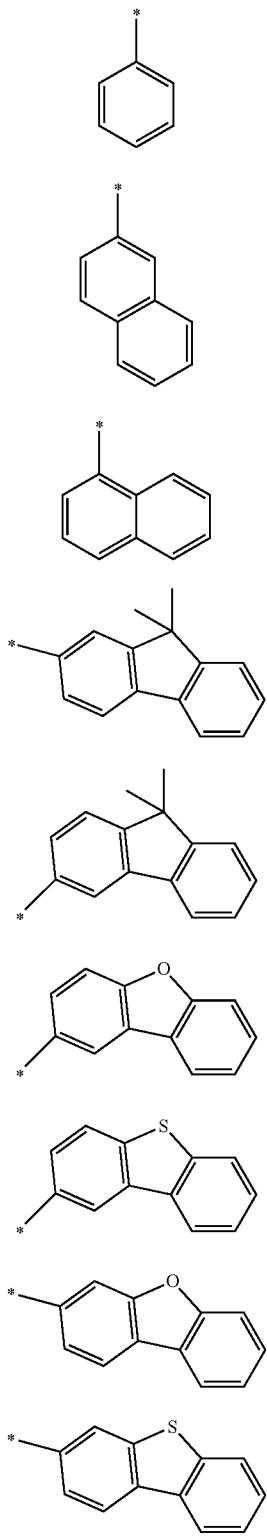
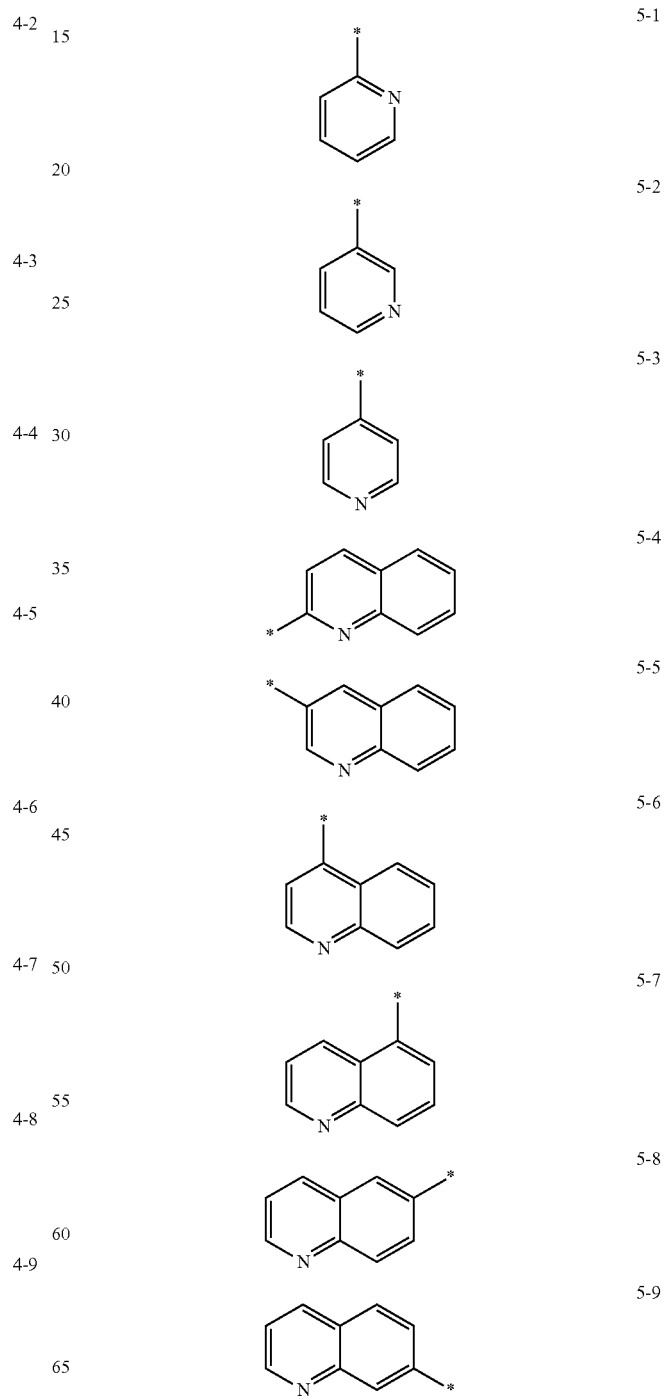

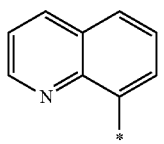
5-10

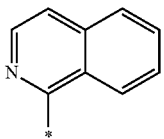
5-11

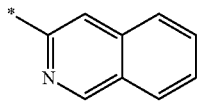
5-12

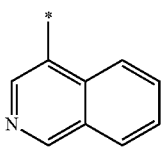
5-13

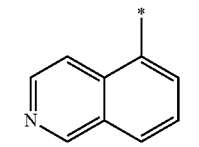
5-14

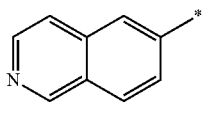
5-15

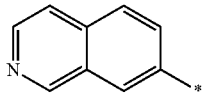
5-16

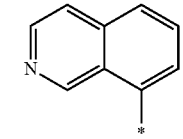
5-17

In Formulae 5-1 to 5-17, * indicates a binding site to a neighboring atom.

In some embodiments, $R_{21}$ and $R_{22}$ in Formula 2 may be each independently a group selected from Formulae 5-1, 5-2, 5-5, and 5-13, but they are not limited thereto.

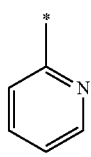
5-1

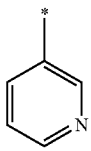
5-2

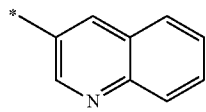
5-5

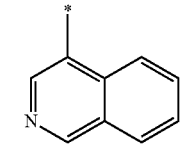
5-13

In Formulae 5-1, 5-2, 5-5, and 5-13, * indicates a binding site to a neighboring atom.

b11, b12, b21 and b22 in Formula 1 and 2 respectively indicate the number of $R_{11}$, $R_{12}$, $R_{21}$, and $R_{22}$, and when each of b11, b12, b21, and b22 is 2 or 3, a plurality of $R_{11}$, $R_{12}$, $R_{21}$, and $R_{22}$ may be identical or different.

For example, $R_{13}$, $R_{14}$, $R_{23}$, and $R_{24}$ in Formulae 1 and 2 may be each independently selected from a hydrogen, a deuterium, —F, —Cl, —Br, —I, a cyano group, a nitro group, a methyl group, an ethyl group, n-a propyl group, iso-a propyl group, an n-butyl group, a sec-butyl group, iso-butyl group, a tert-butyl group, an n-pentyl group, an n-hexyl group, an n-heptyl group, an n-octyl group, a phenyl group, a pentalenyl group, an indenyl group, a naphthyl group, an azulenyl group, a heptalenyl group, an indacenyl group, acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, dibenzofuranyl group, a dibenzothiophenyl group, a dibenzosilolyl group, a benzocarbazolyl group, and a dibenzocarbazolyl group, but they are not limited thereto.

In some embodiments, $R_{13}$, $R_{14}$, $R_{23}$, and $R_{24}$ in Formulae 1 and 2 may be each independently selected from a hydrogen, a deuterium, —F, —Cl, —Br, —I, a cyano group, a nitro group, a methyl group, an ethyl group, n-a propyl group, iso-a propyl group, an n-butyl group, a sec-butyl group, iso-butyl group, a tert-butyl group, an n-pentyl group, an n-hexyl group, an n-heptyl group, and an n-octyl group, a group represented by one of Formulae 4-1 to 4-9 and a group represented by one of Formulae 5-1 to 5-17, but they are not limited thereto.
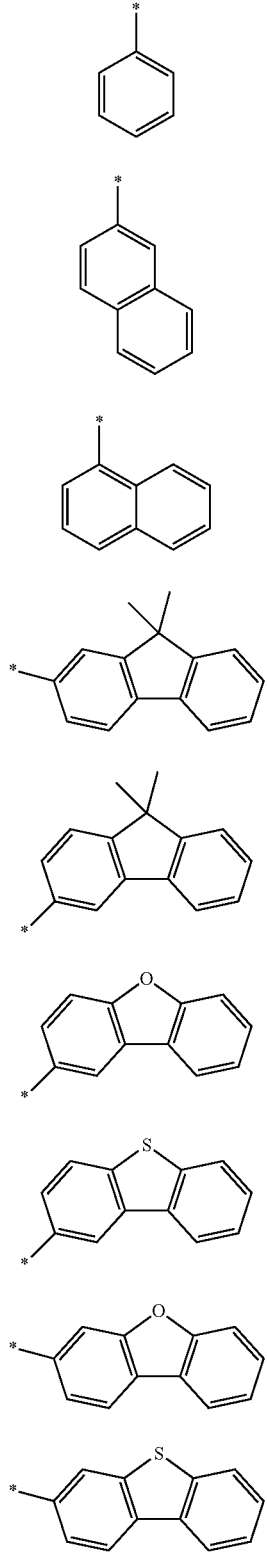
4-1
4-2
4-3
4-4
4-5
4-6
4-7
4-8
4-9
-continued
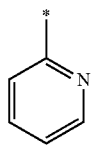
5-1
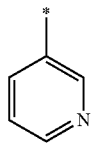
5-2
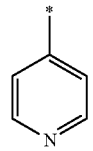
5-3
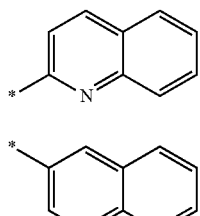
5-4
5-5
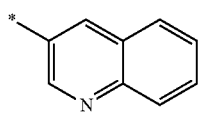
5-6
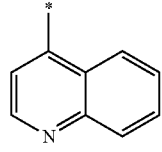
5-7
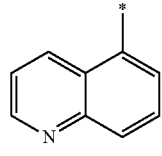
5-8
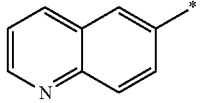
5-9
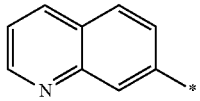
5-10
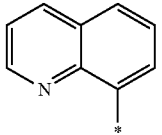
5-11
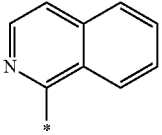

-continued 5-12
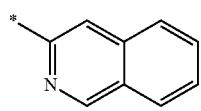

5-13
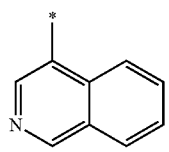

5-14
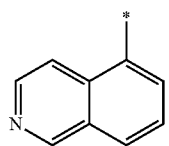

5-15
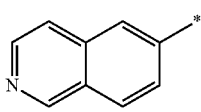

5-16
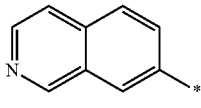

5-17
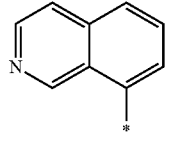

In Formulae 4-1 to 4-9 and 5-1 to 5-17, * indicates a binding site to a neighboring atom.

b13, b14, b23, and b24 in Formula 1 and 2 respectively indicate the number of $R_{13}$, $R_{14}$, $R_{23}$, and $R_{24}$, and when each of b13, b14, b23, and b24 is selected from 2, 3, and 4, a plurality of $R_{13}$, $R_{14}$, $R_{23}$, and $R_{24}$ may be identical or different.

For example, the first materials may be represented by any one of Formulae 1A and 1B below, and the second materials may be represented by Formula 2 below, but they are not limited thereto.

<Formula 1A>
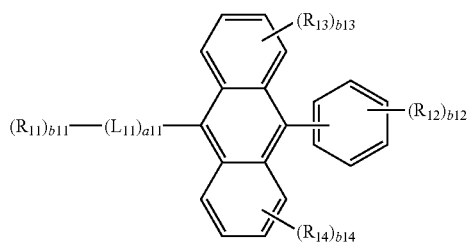

<Formula 1B>
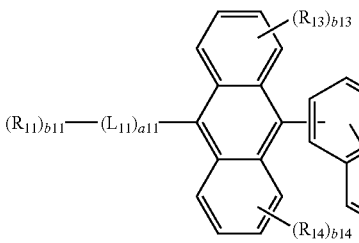

<Formula 2>
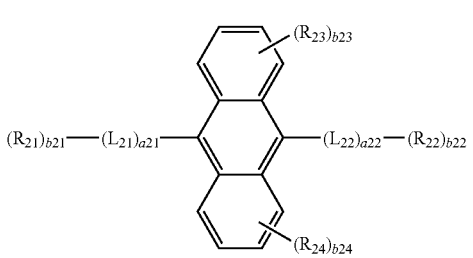

In Formulae 1A, 1B, and 2, $L_{11}$, a11, $R_{11}$ to $R_{14}$, b11 to b14, $L_{21}$, $L_{22}$, a21, a22, $R_{21}$ to $R_{24}$, and b21 to b24 have already described above.

In some embodiments, the first materials may be represented by any one of Formulae 1A and 1B below, and the second materials may be represented by one of Formulae 2A to 2C below, but they are not limited thereto.

<Formula 1A>
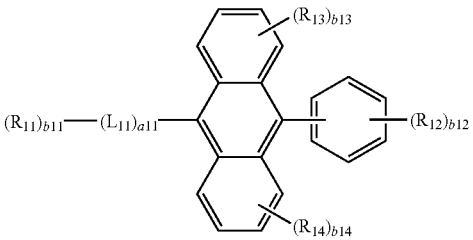

<Formula 1B>
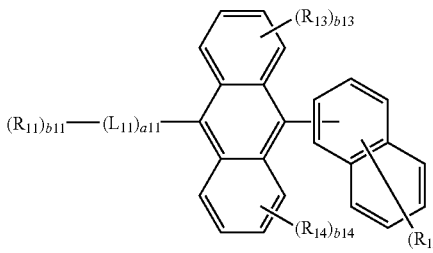

<Formula 2A>
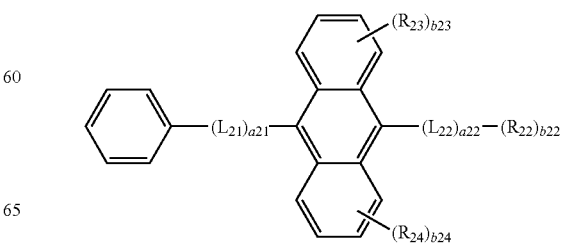

<Formula 2B>

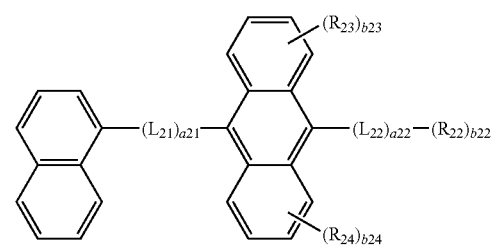

<Formula 2C>

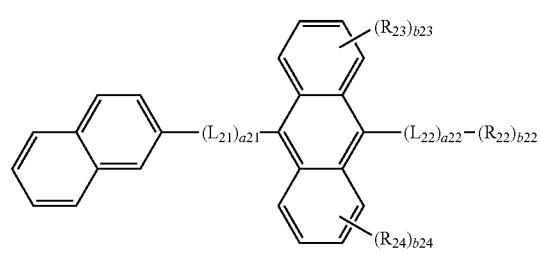

<Formula 2B>

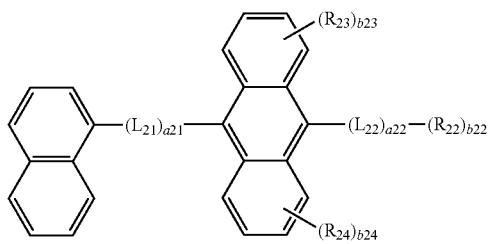

<Formula 2C>

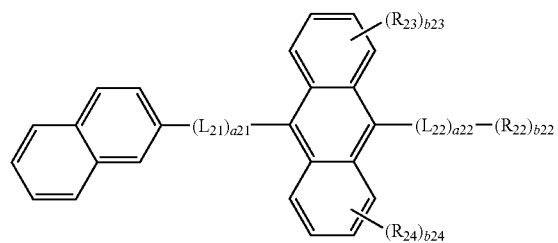

In Formulae 1A, 1B, and 2A to 2C, $L_{11}$, a11, $R_{11}$ to $R_{14}$, b11 to b14, $L_{21}$, $L_{22}$, a21, a22, $R_{22}$ to $R_{24}$, and b22 to b24 have already described above.

In some embodiments, the first materials may be represented by any one of Formulae 1A-1 and 1B-1 below, and the second materials may be represented by one of Formulae 2A to 2C below, but they are not limited thereto.

In Formulae 1A-1, 1B-1, and 2A to 2C, $L_{11}$, a11, $R_{11}$ to $R_{14}$, b11 to b14, $L_{21}$, $L_{22}$, a21, a22, $R_{22}$ to $R_{24}$, and b22 to b24 have already described above.

In some embodiments, the first materials may be selected from Compounds 100 to 263 below, and the second materials may be selected from Compounds 300 to 397, but they are not limited thereto.

<Formula 1A-1>

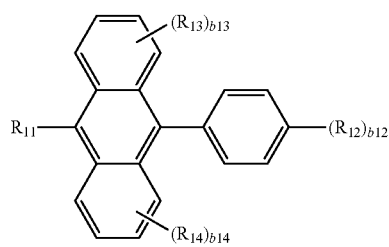

<Formula 1B-1>

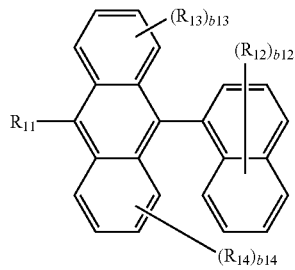

<Formula 2A>

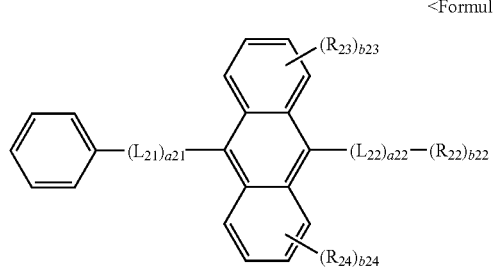

100

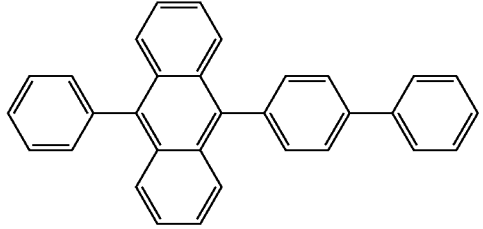

101

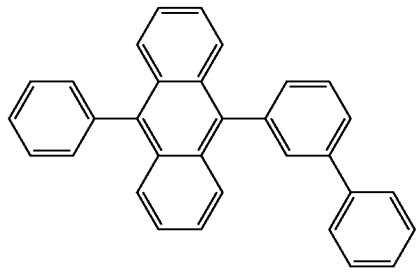

102

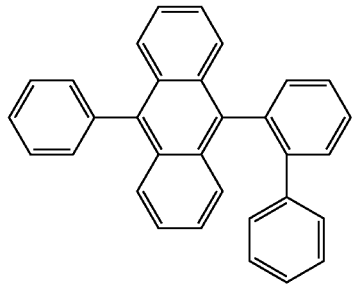

-continued
103
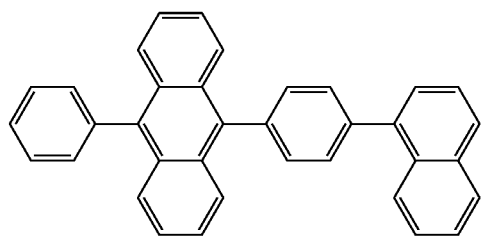
104
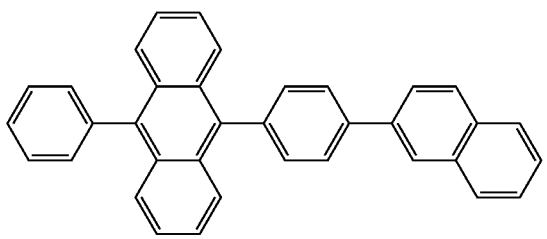
105
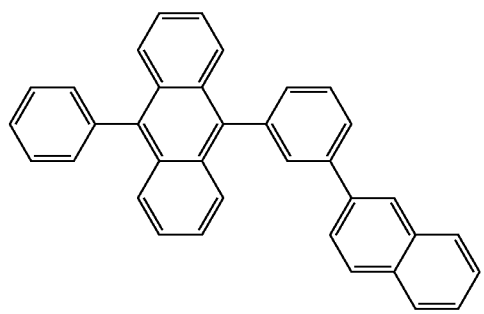
106
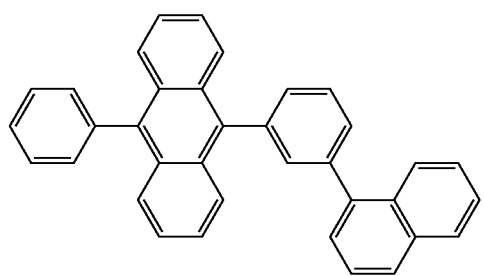
107
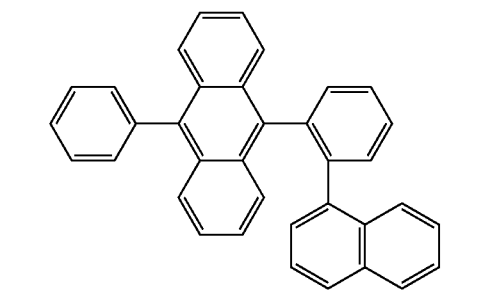
108
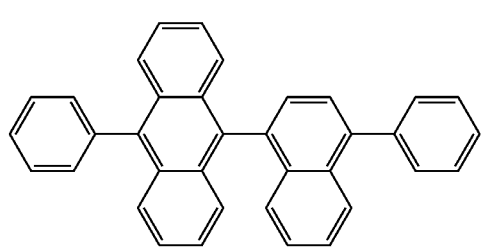
-continued
109
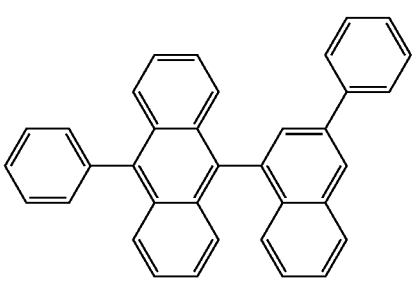
110
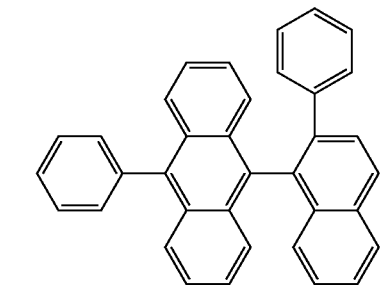
111
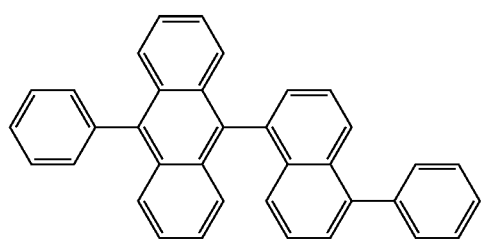
112
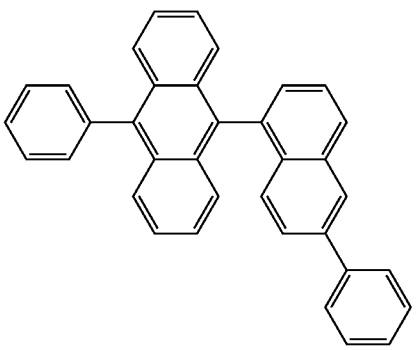
113
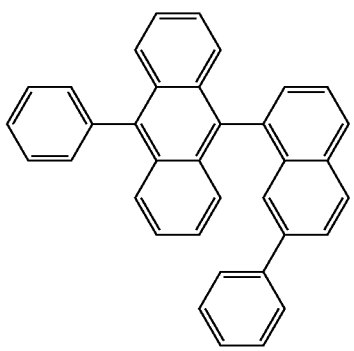

114
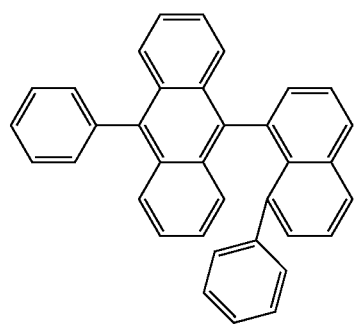
115
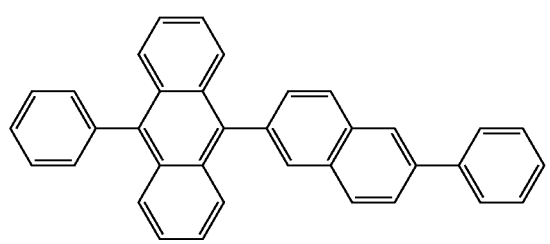
116
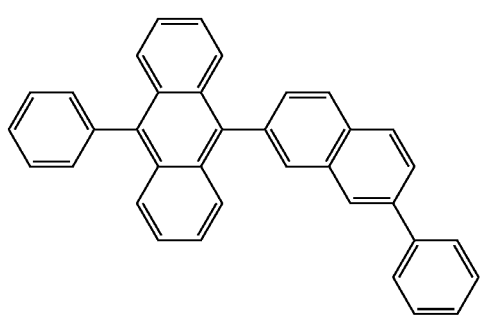
117
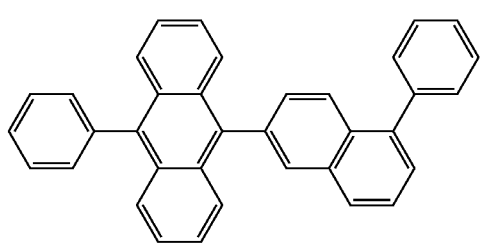
118
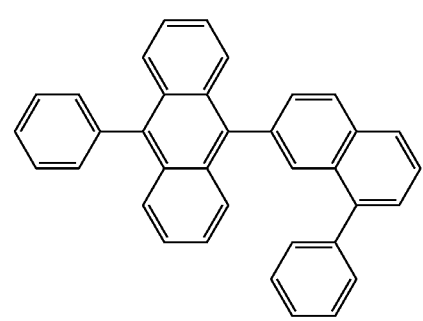
119
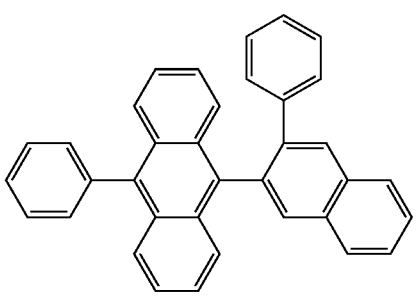
120
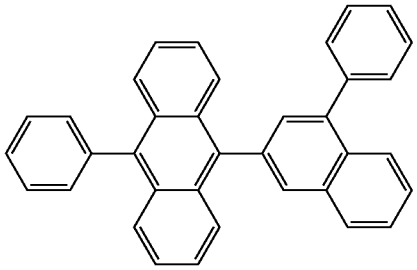
121
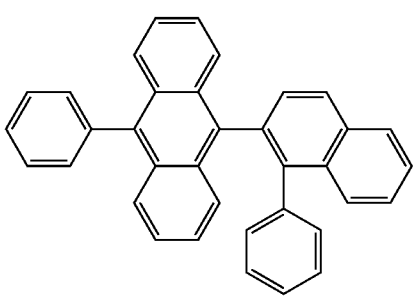
122
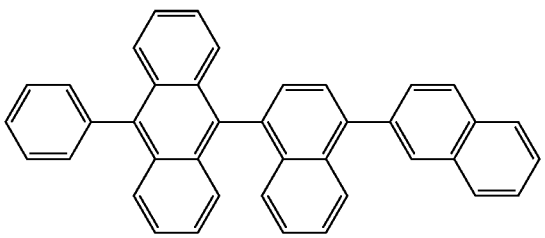
123
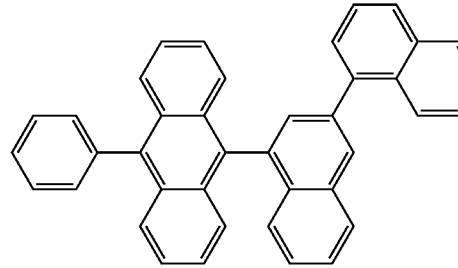

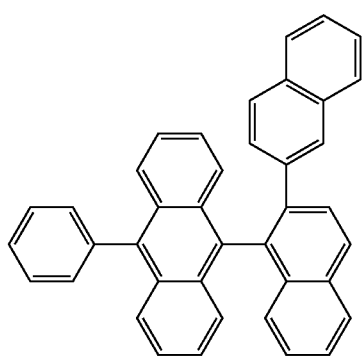
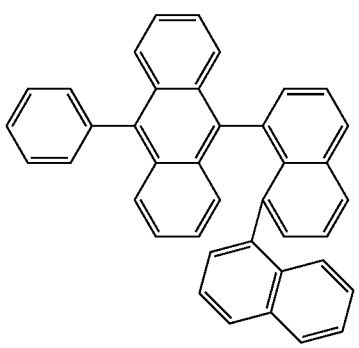

133
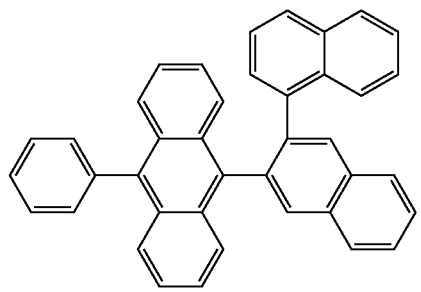
134
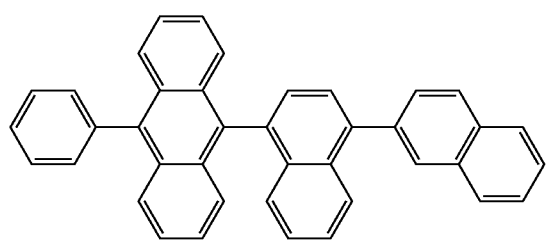
135
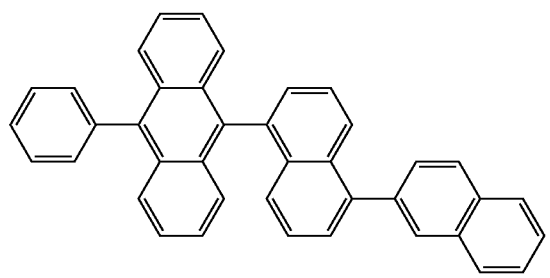
136
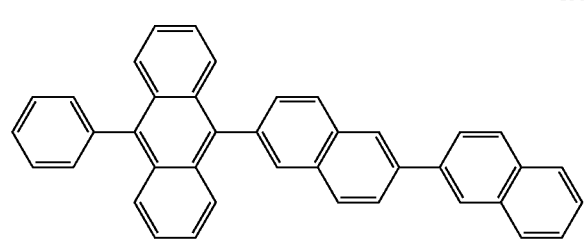
137
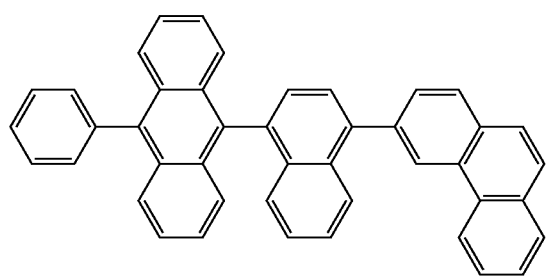
138
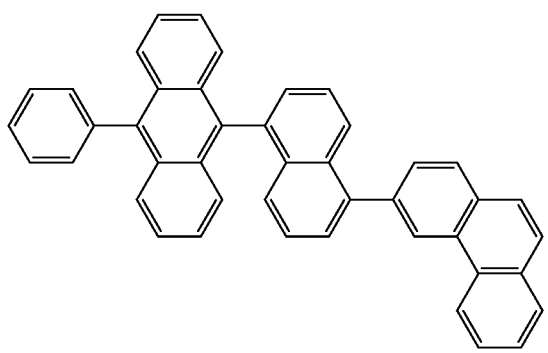
139
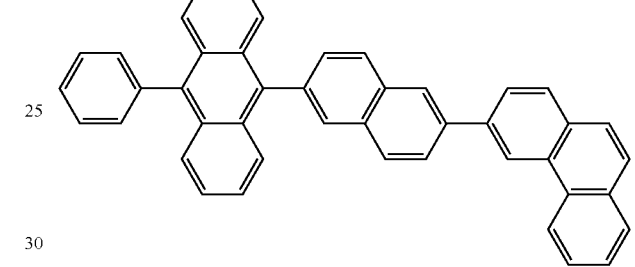
140
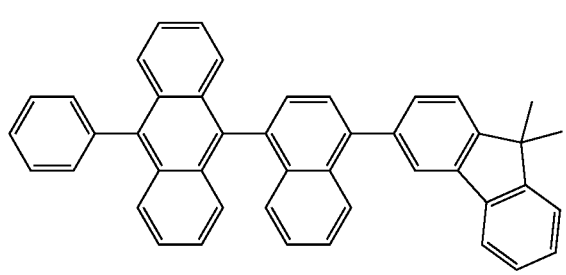
141
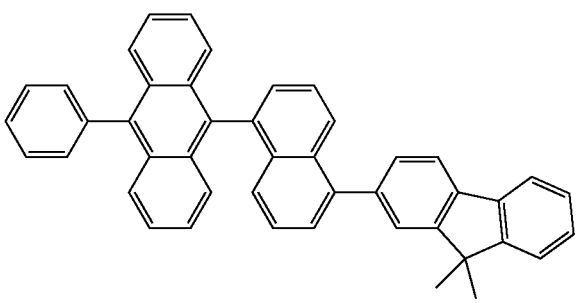
142
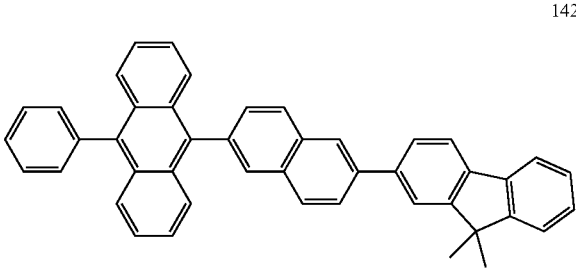

143
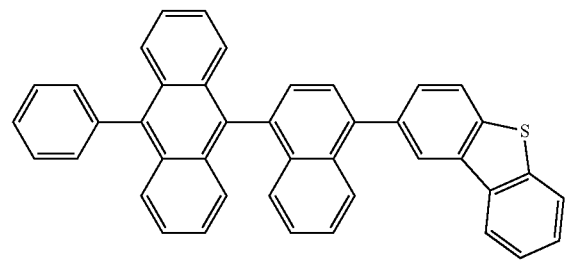
144
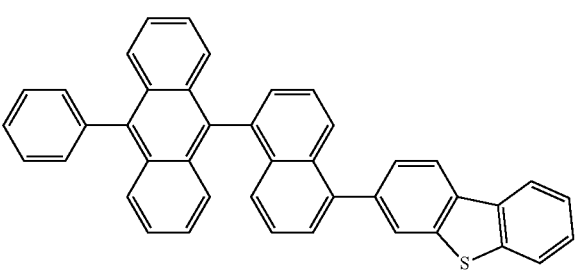
145
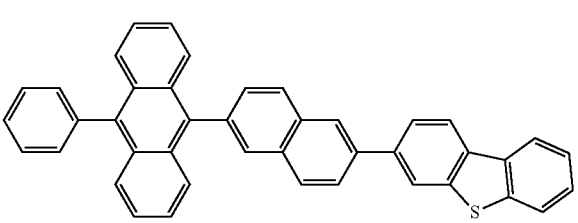
146
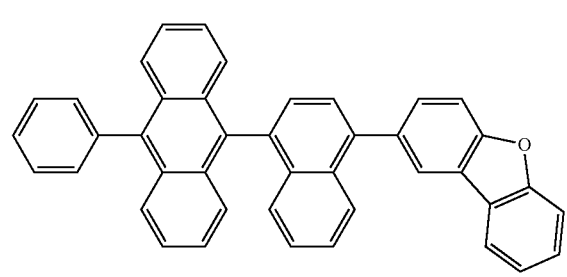
147
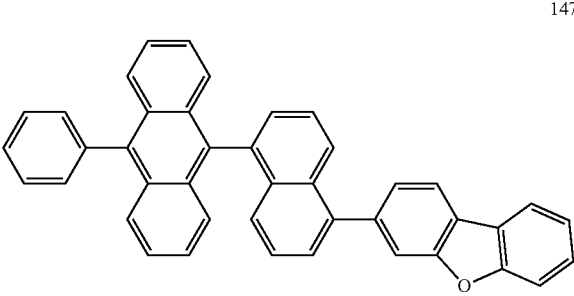
148
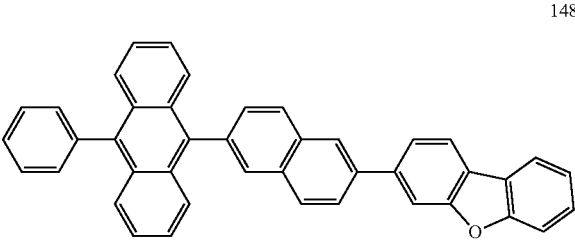
149
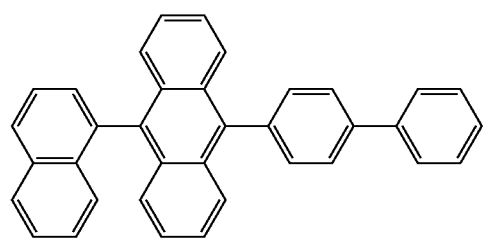
150
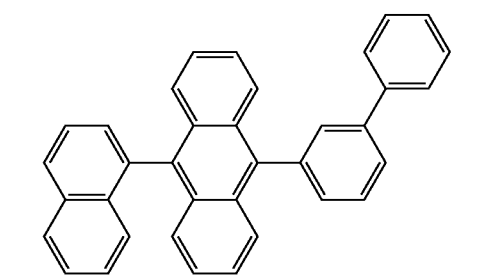
151
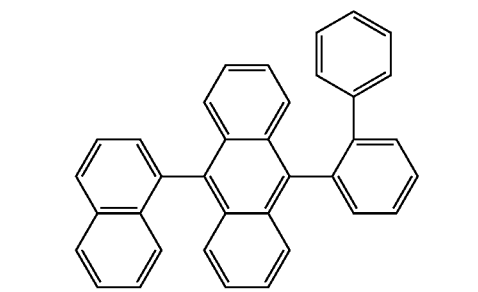
152
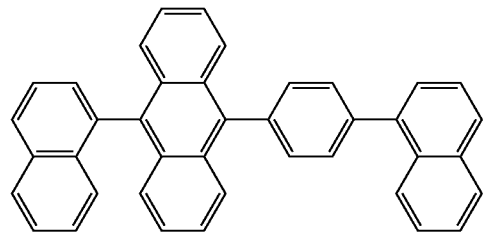
153
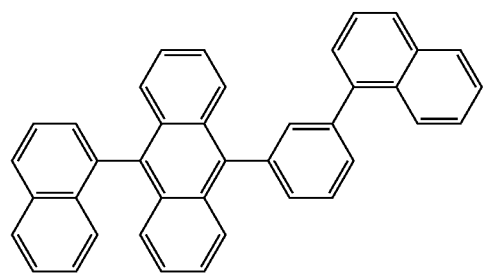
154
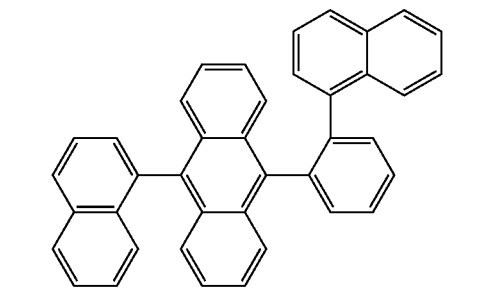

155
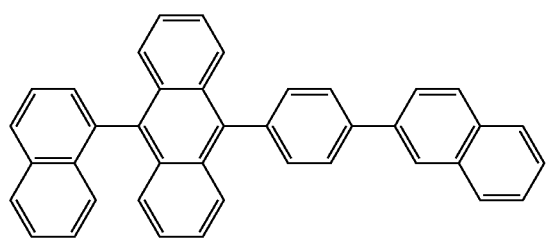
156
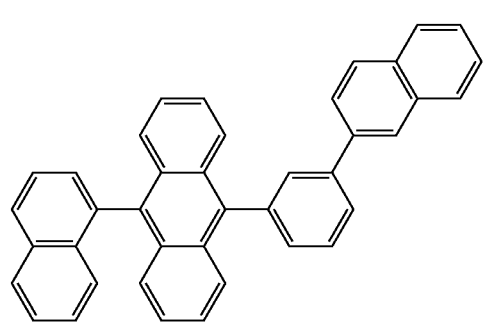
157
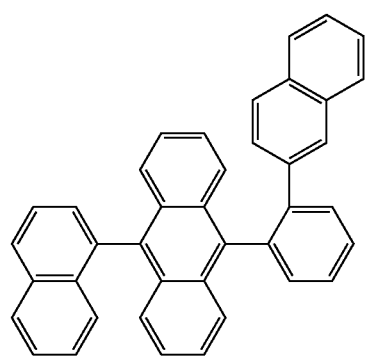
158
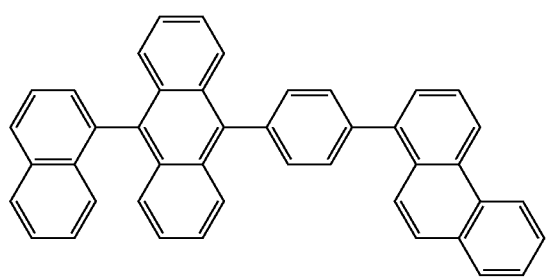
159
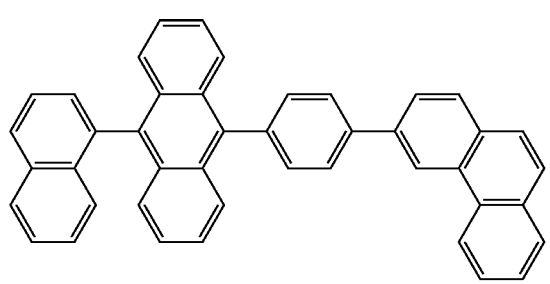
160
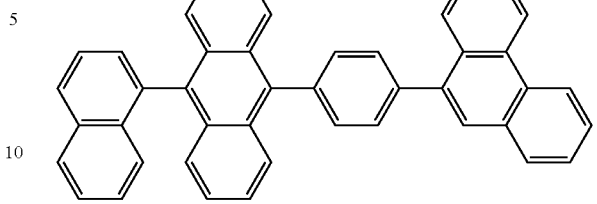
161
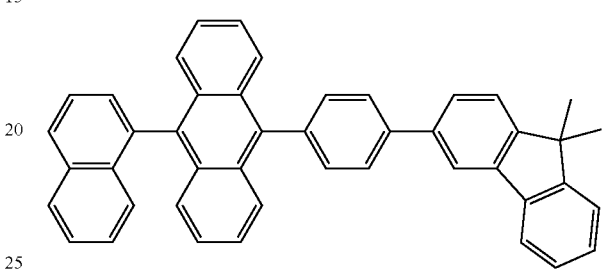
162
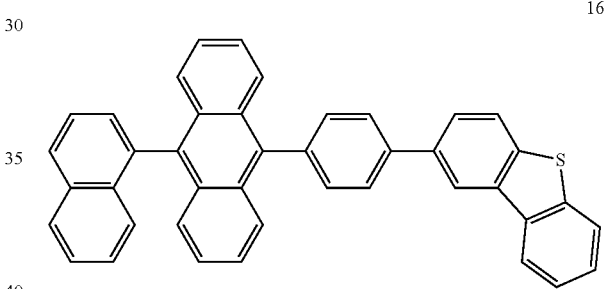
163
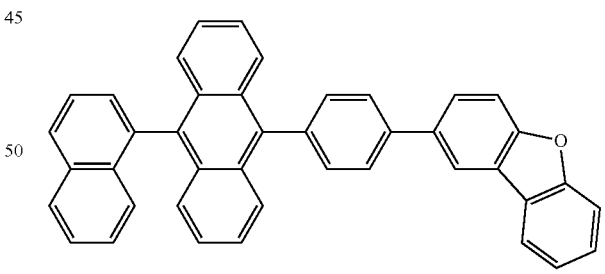
164
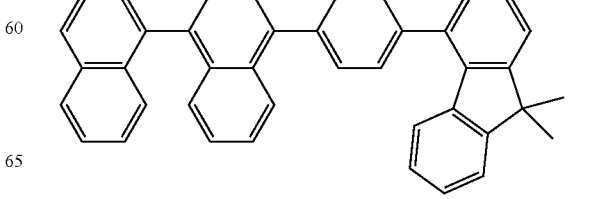

165
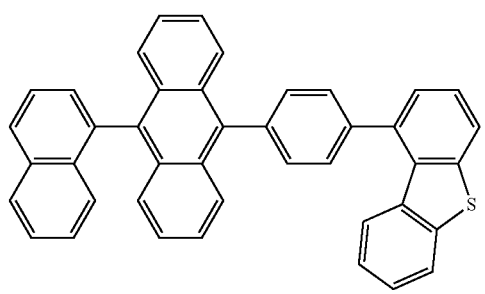
166
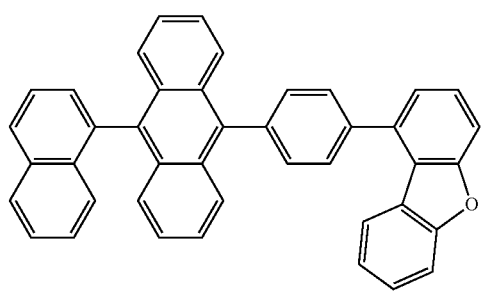
167
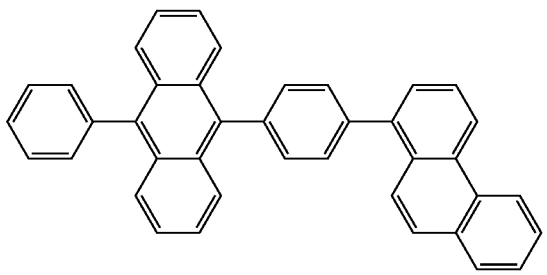
168
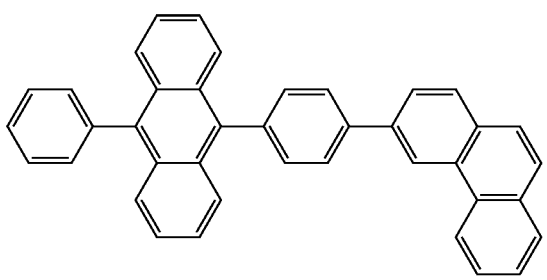
169
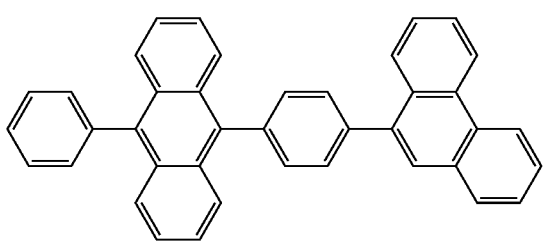
170
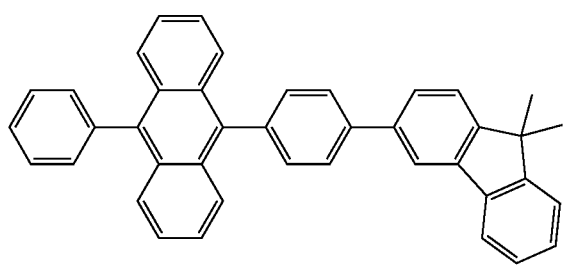
171
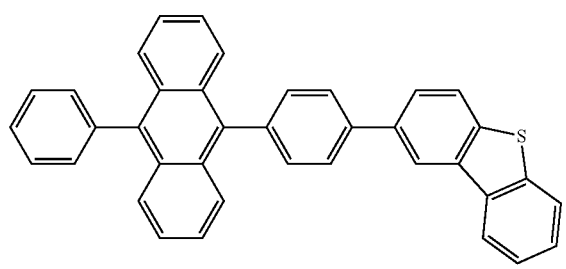
172
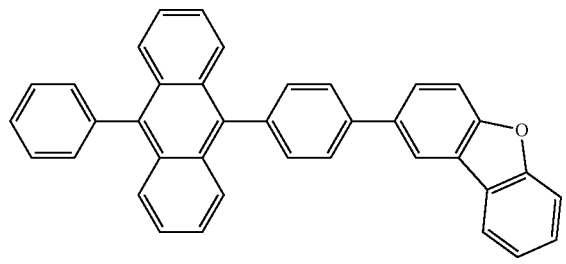
173
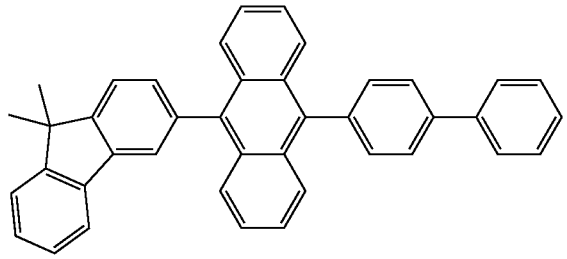
174
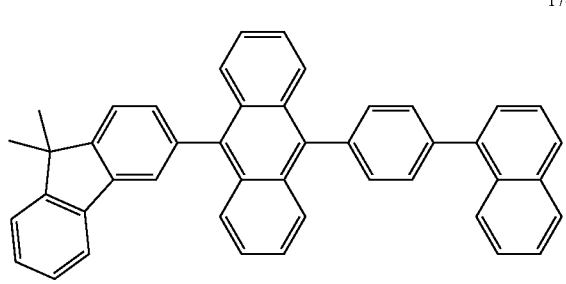

175
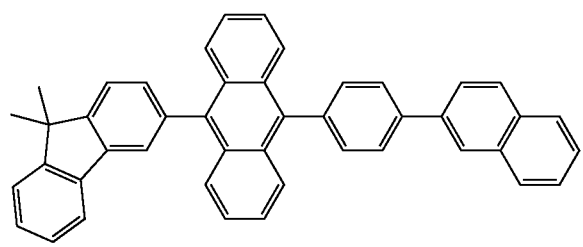
176
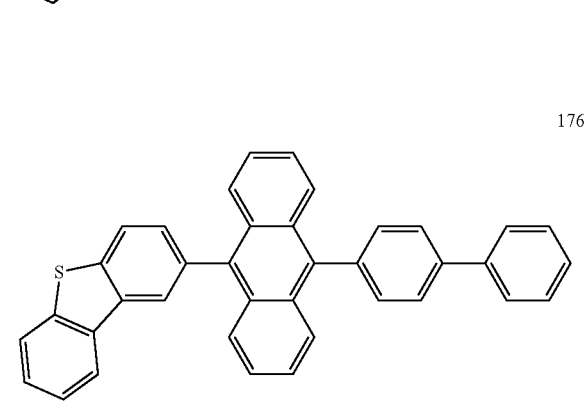
177
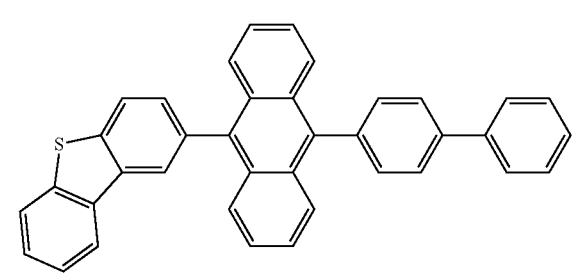
178
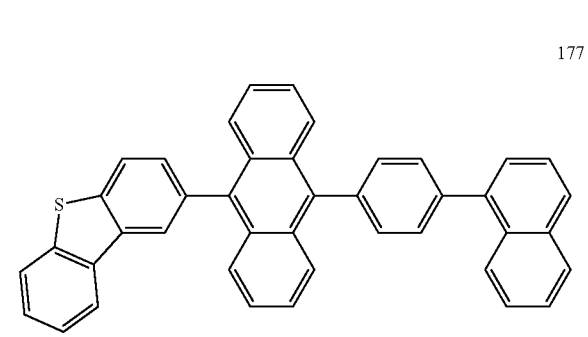
179
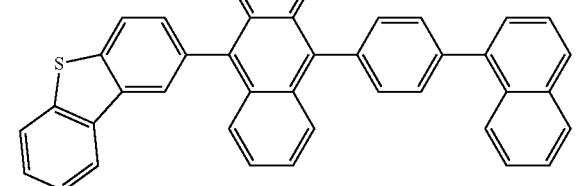
180
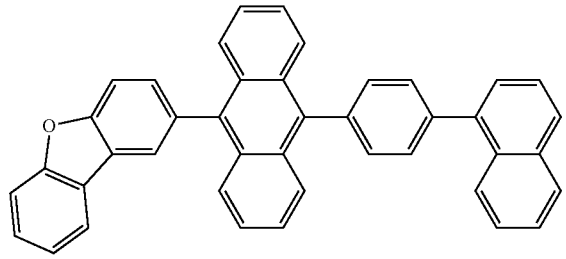
181
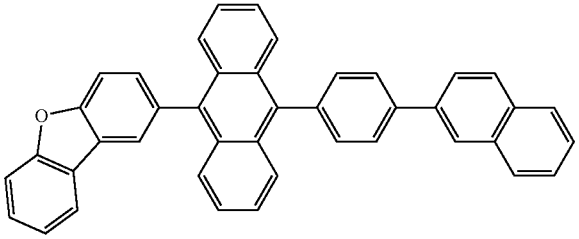
182
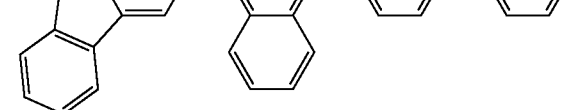
183
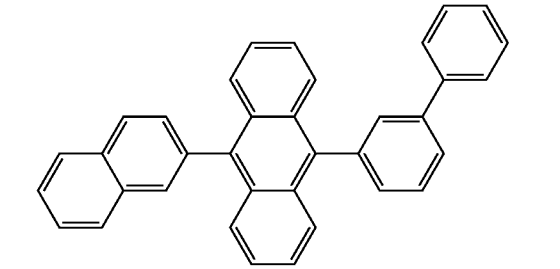
184
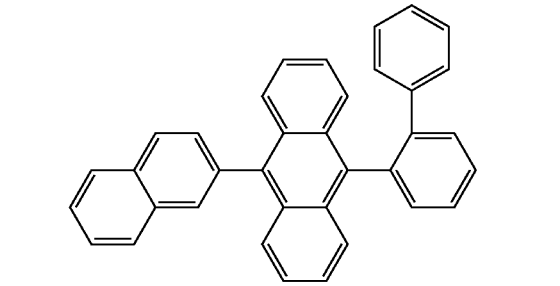
185
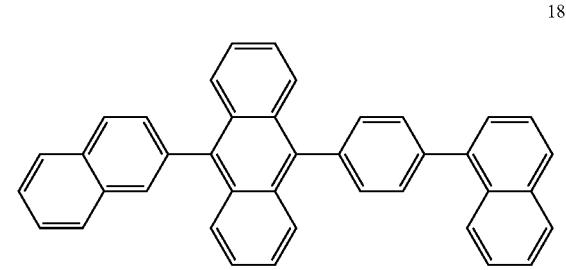

186
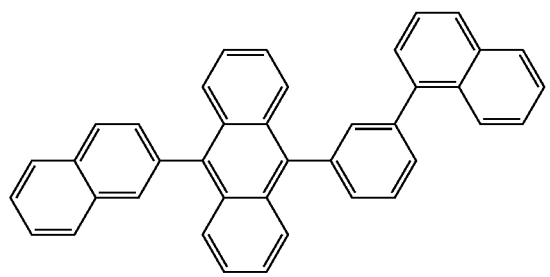
187
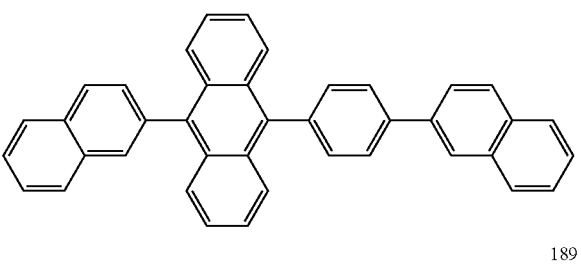
188
189
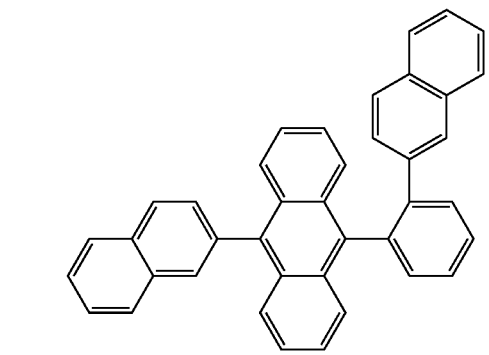
190
191
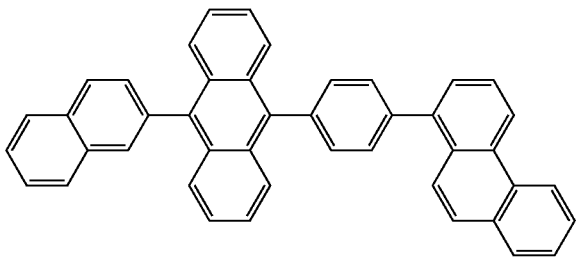
192
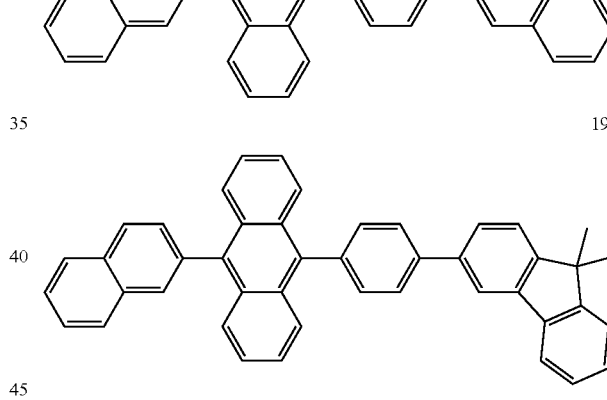
193
194
195
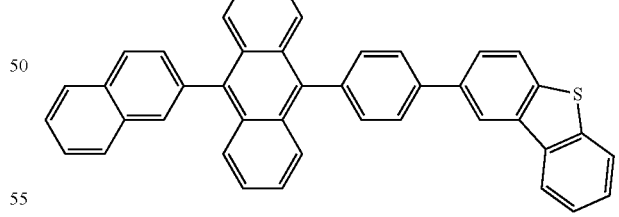
196
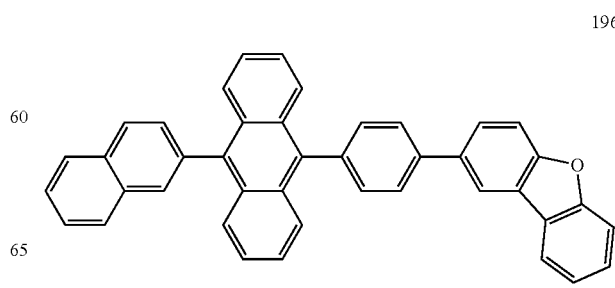

197
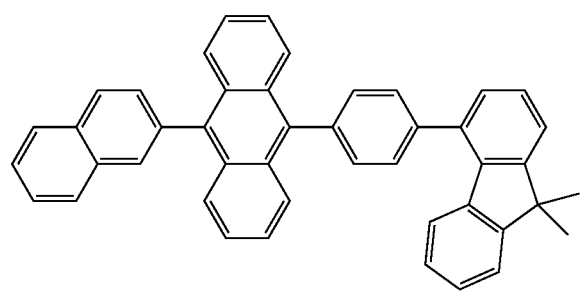
198
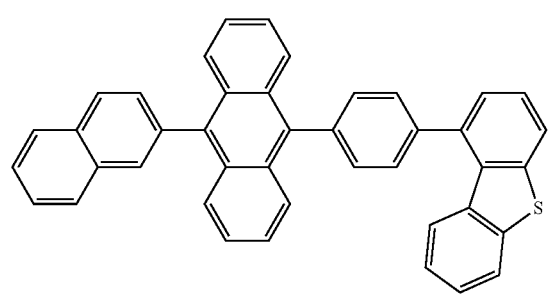
199
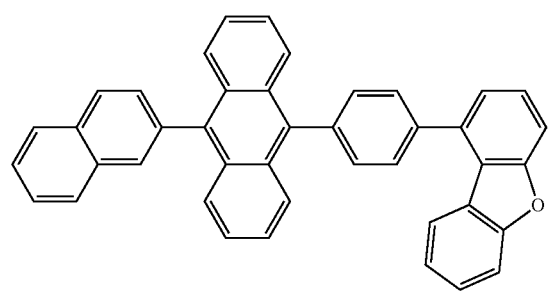
200
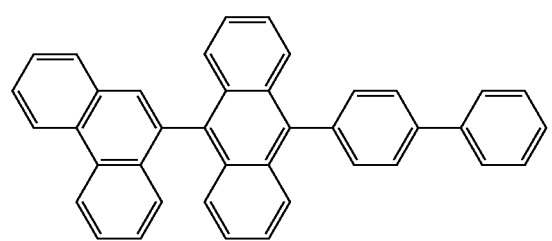
201
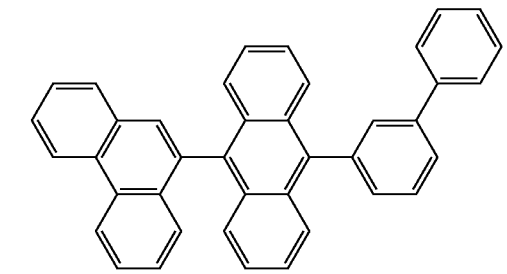
202
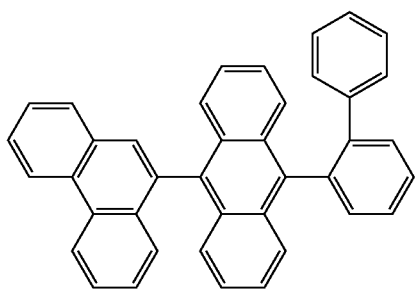
203
204
205
206
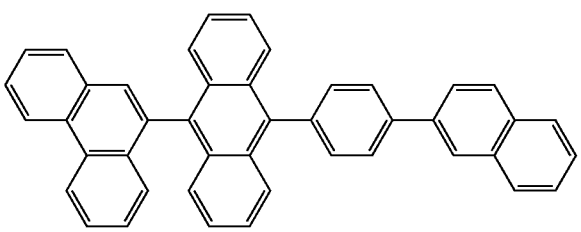

207
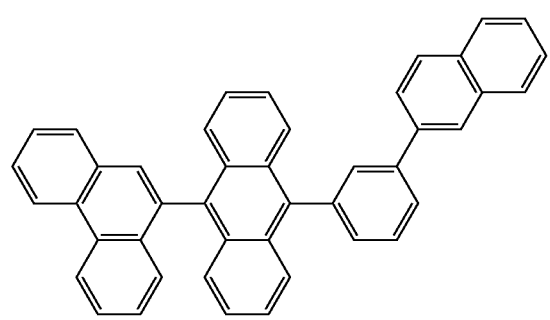
212
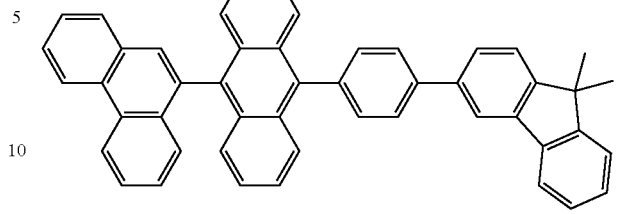
208
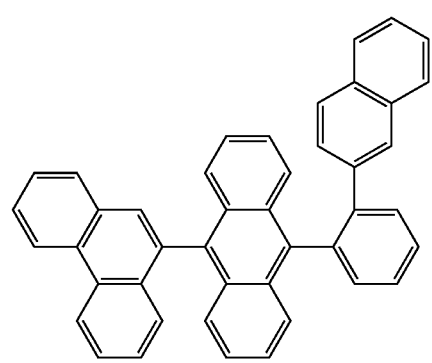
213
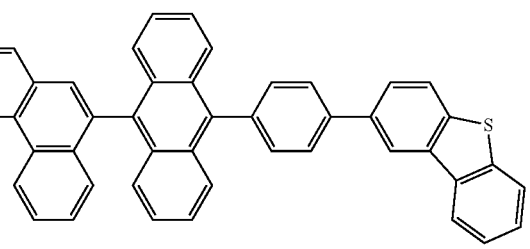
209
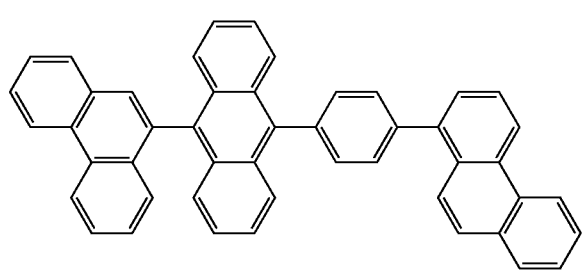
214
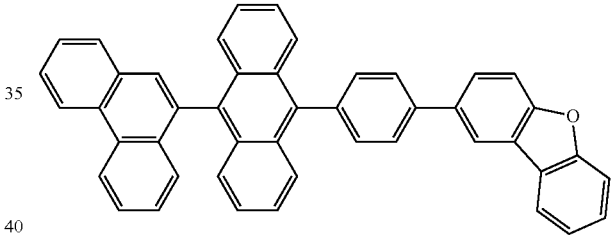
210
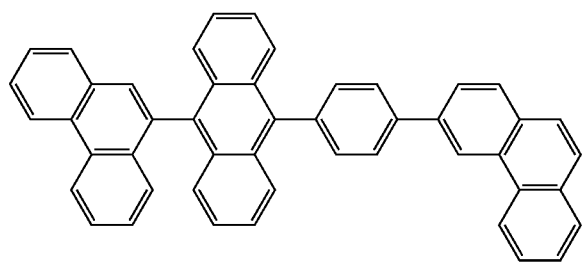
215
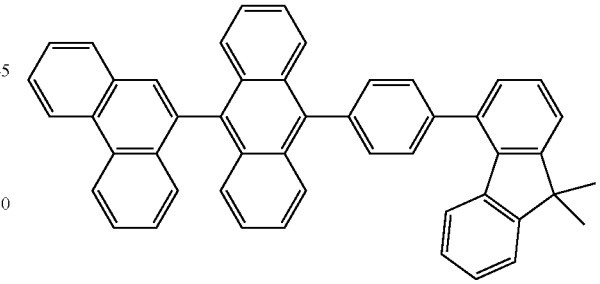
211
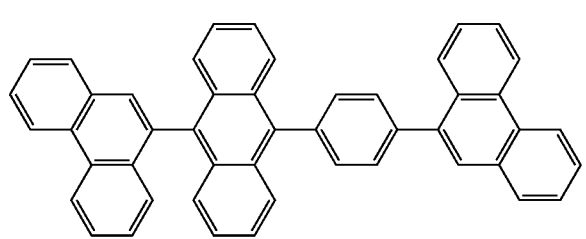
216
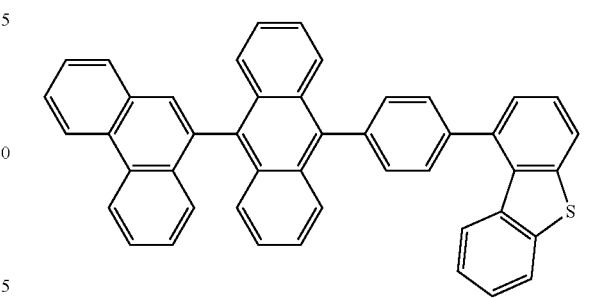

217
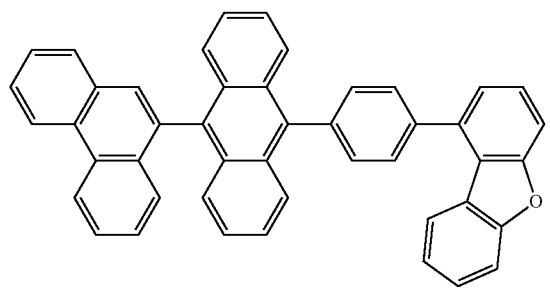
218
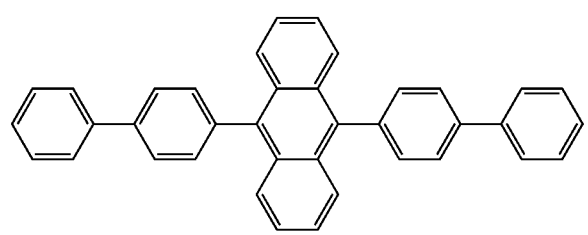
219
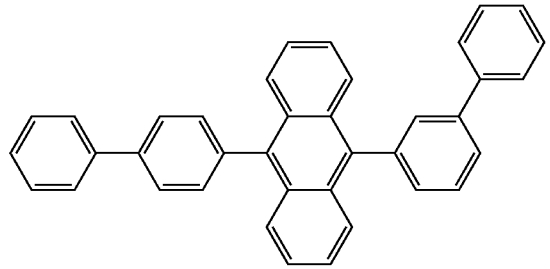
220
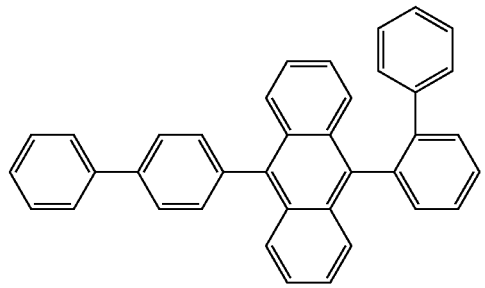
221
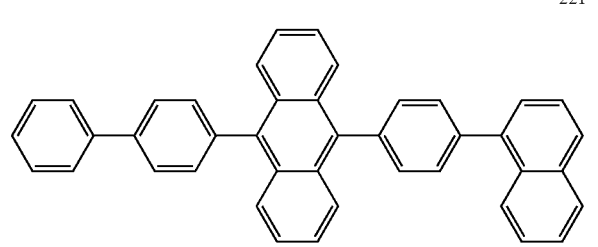
222
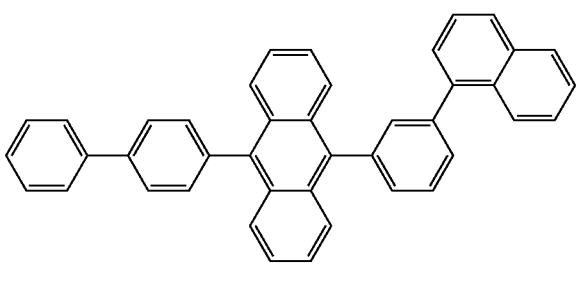
223
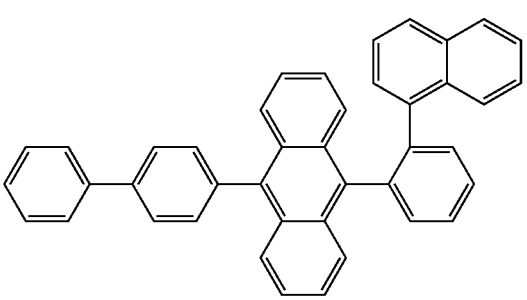
224
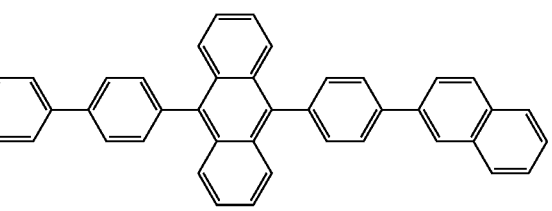
225
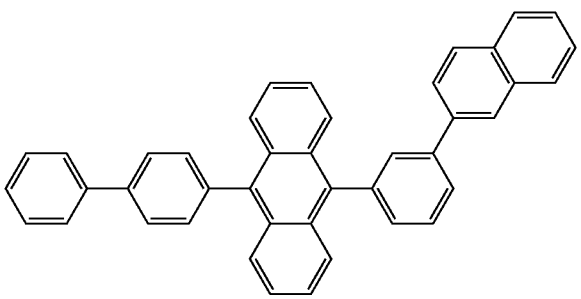
226
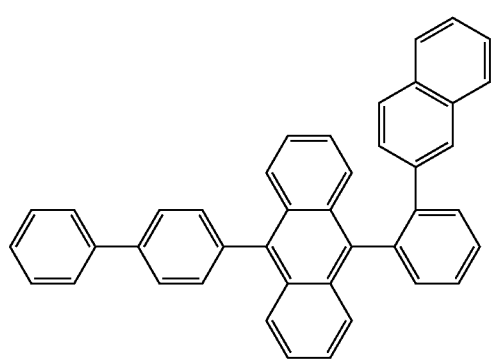

227
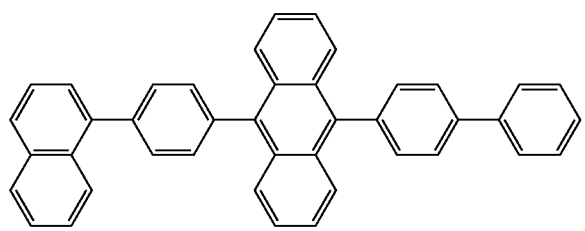
228
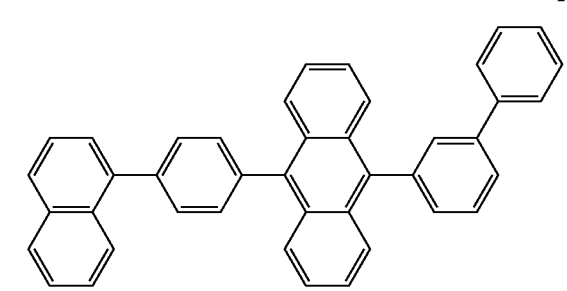
229
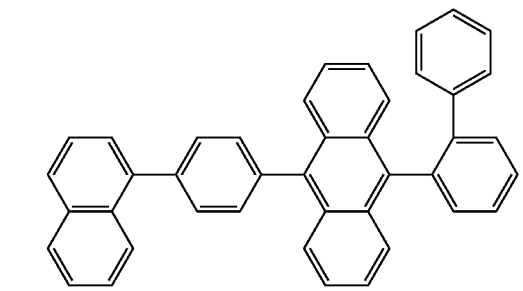
230
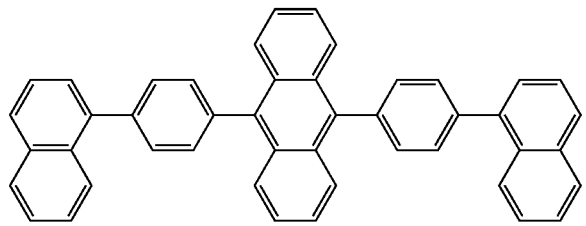
231
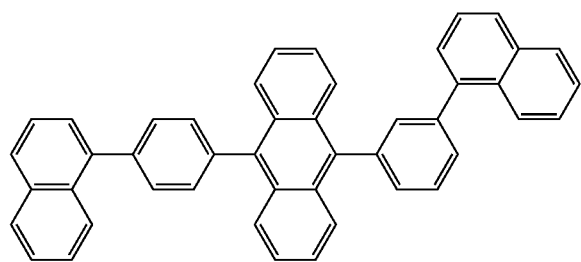
232
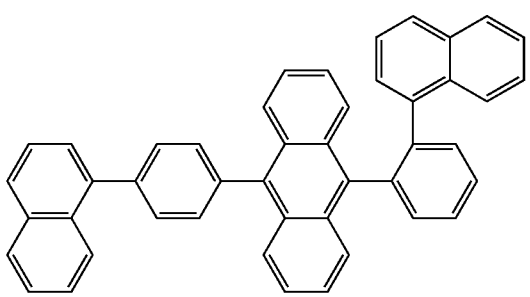
233
234
235
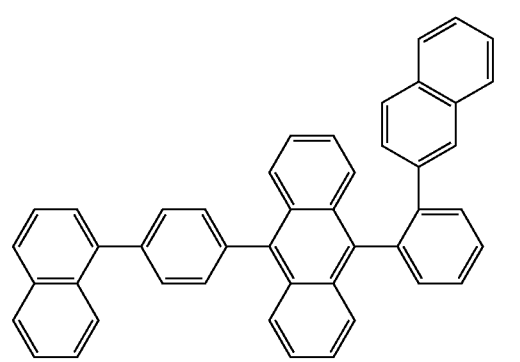
236
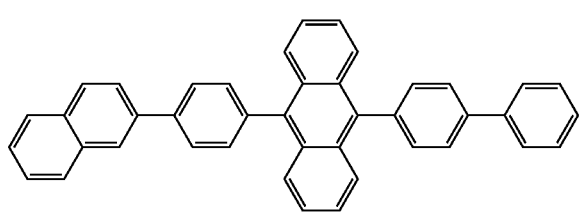

237
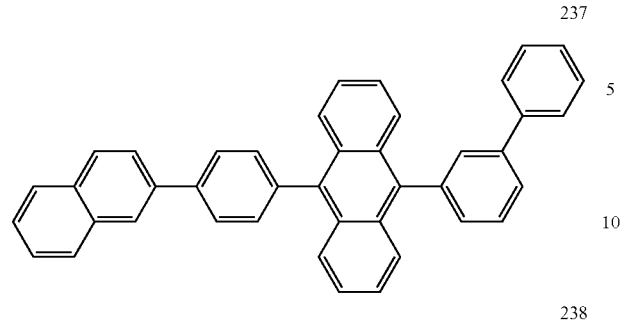
238
239
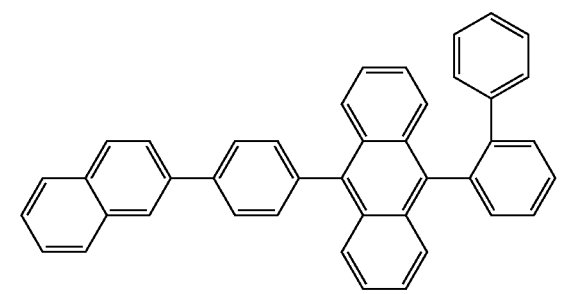
240
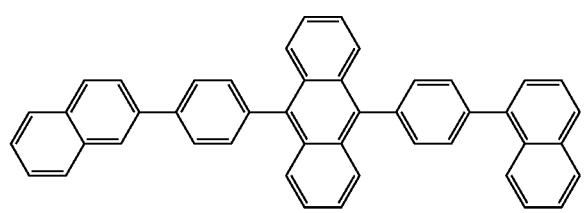
241
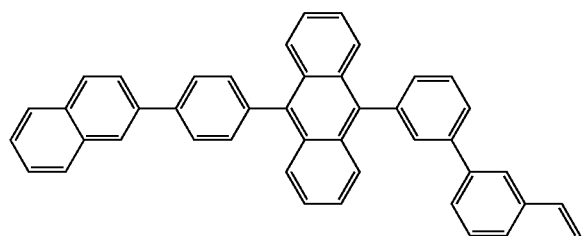
242
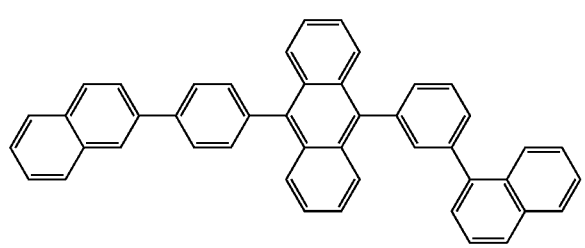
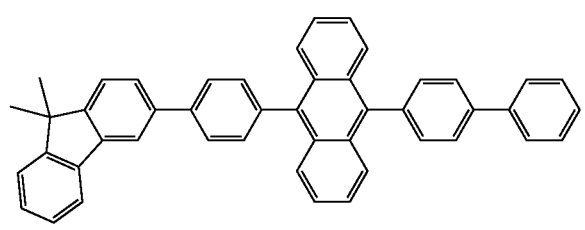
243
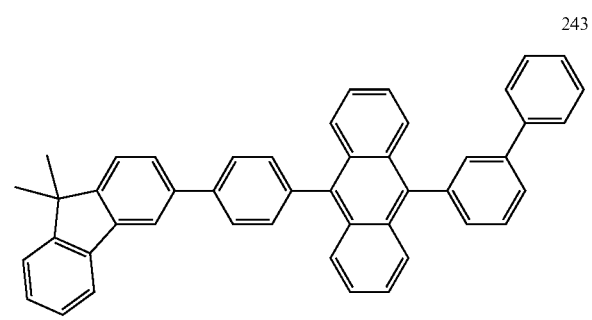
244
245
246
247

248
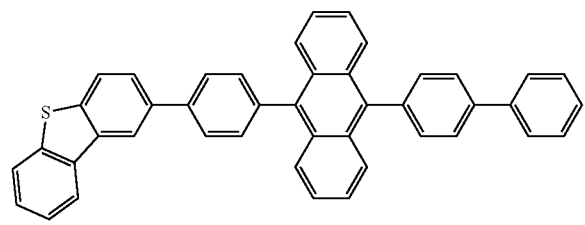
253
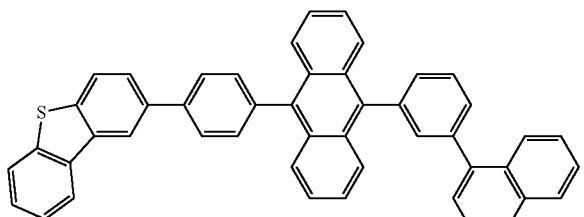
249
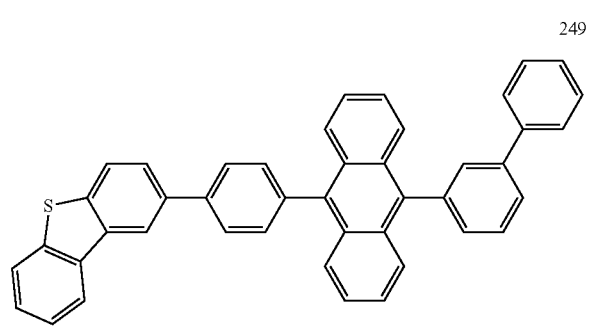
254
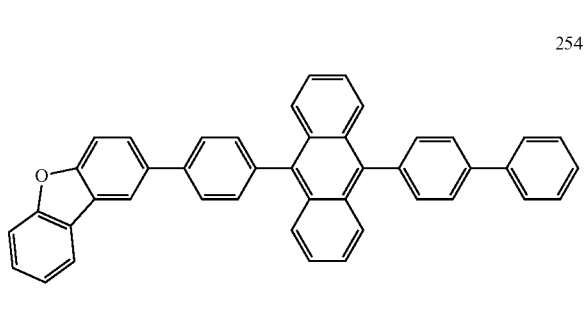
250
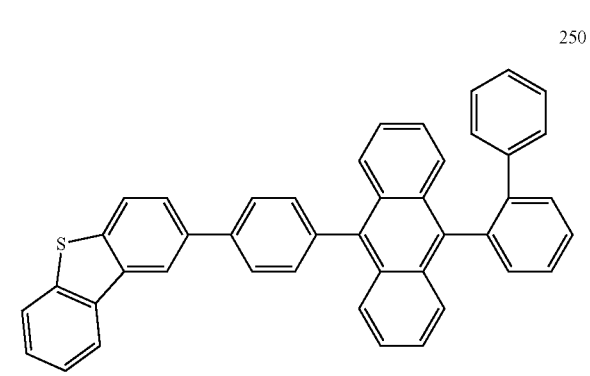
256
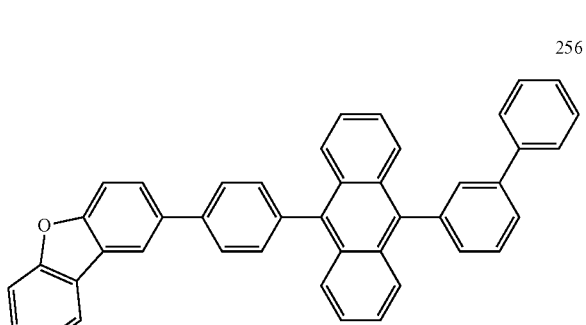
251
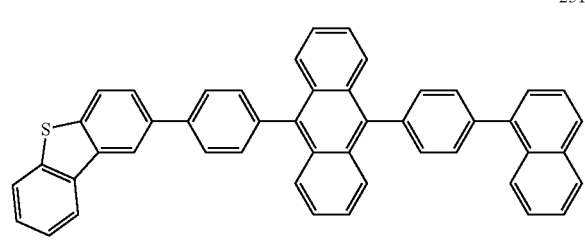
257
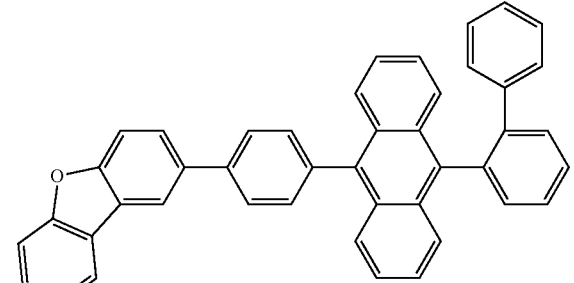
252
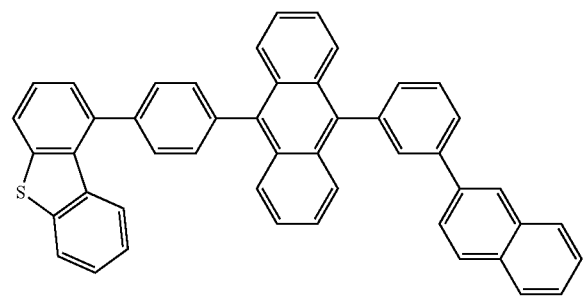
258
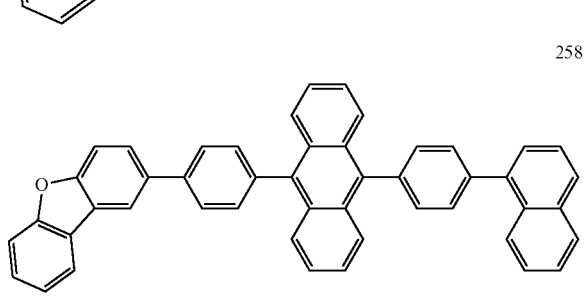

259
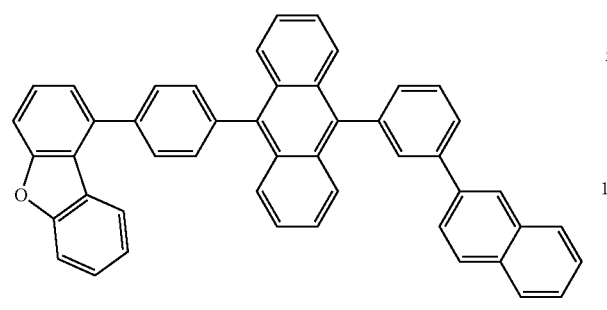
260
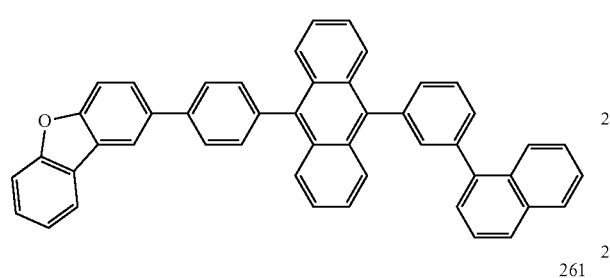
261
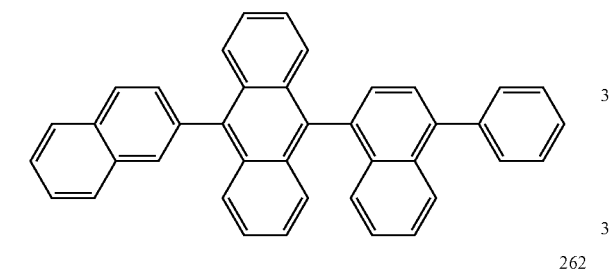
262
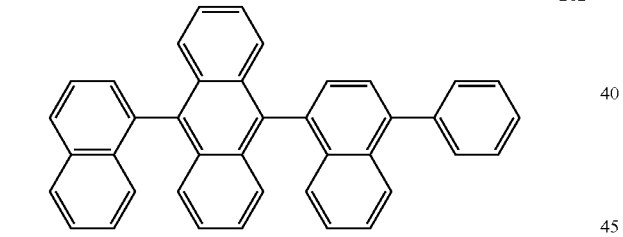
263
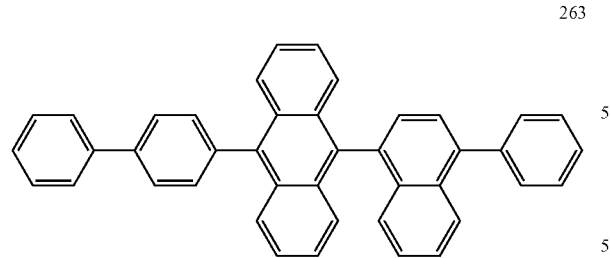
300
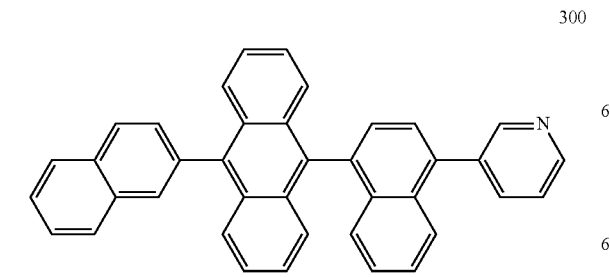
301
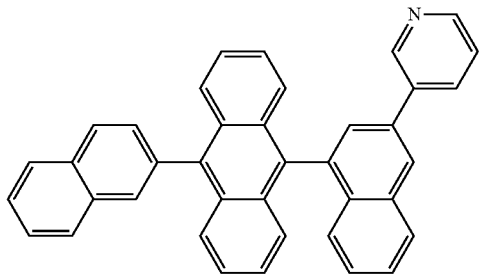
302
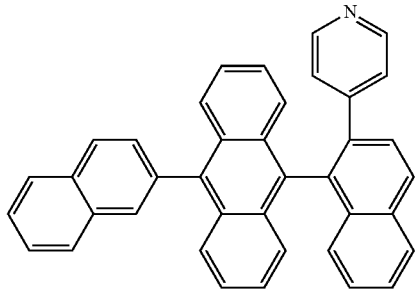
303
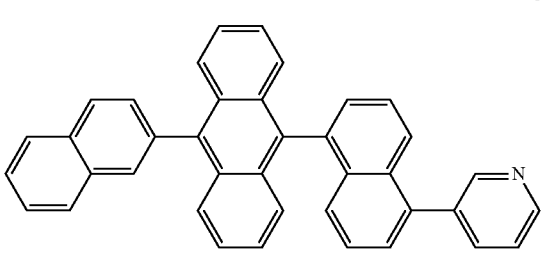
304
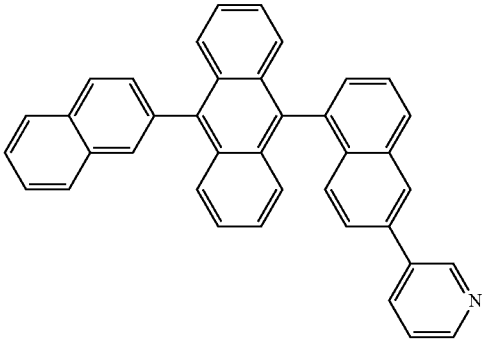
305
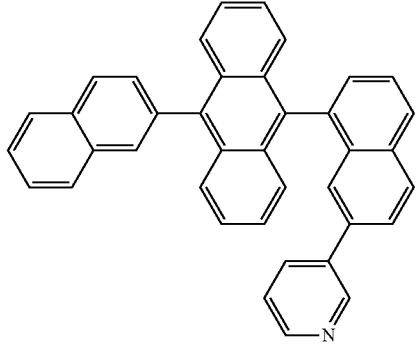

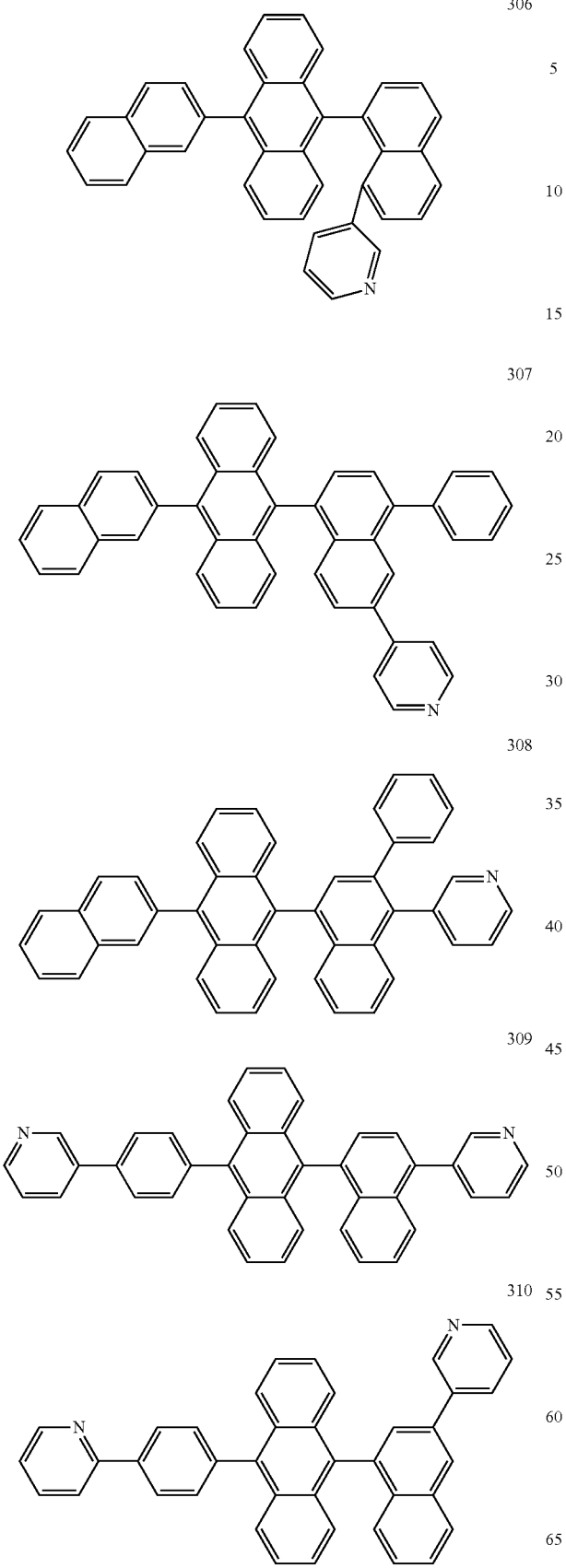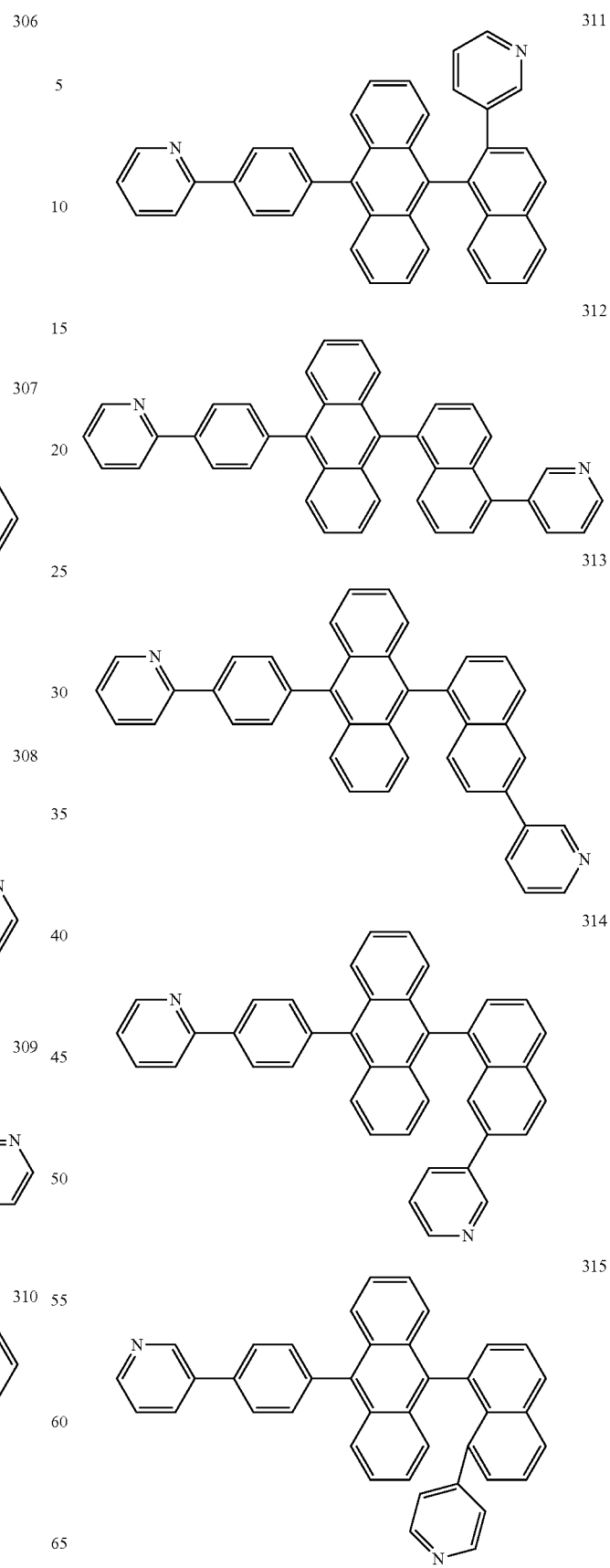

316
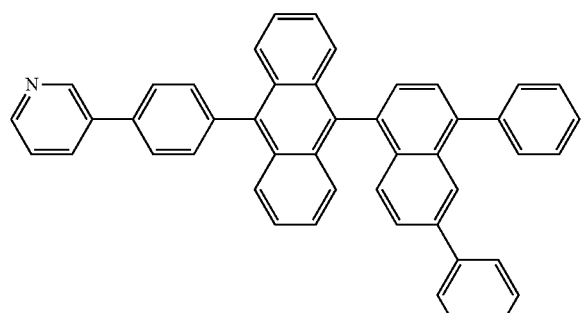
317
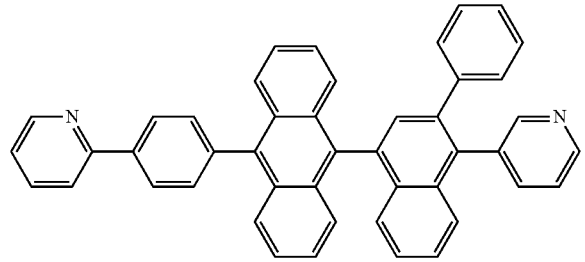
318
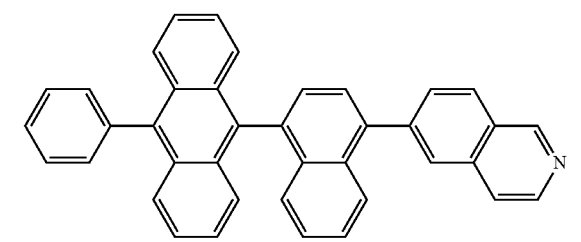
319
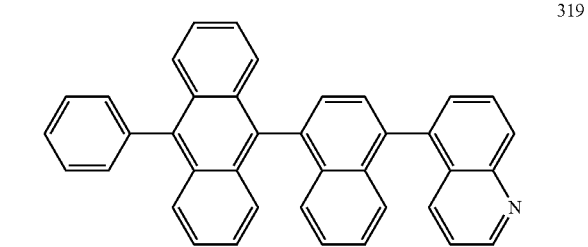
320
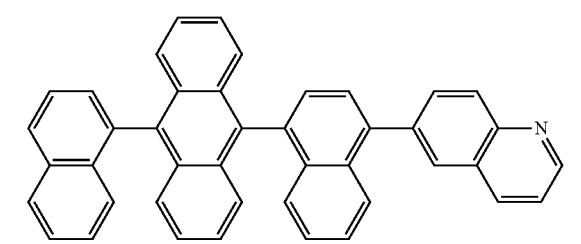
321
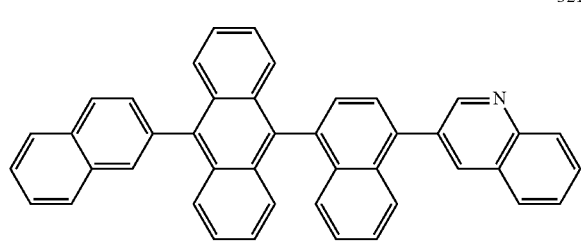
322
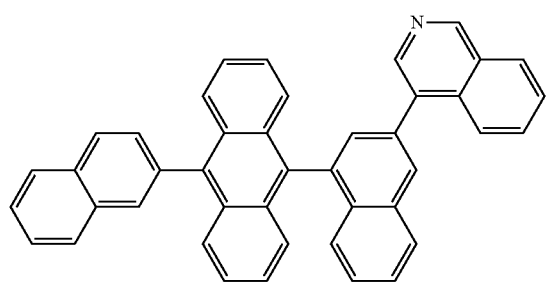
323
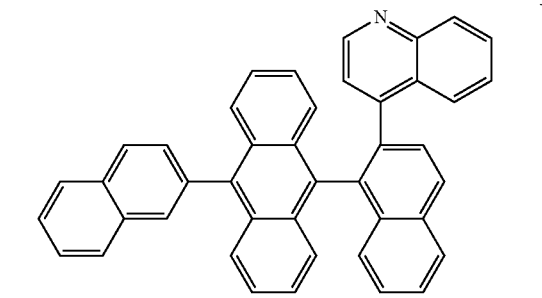
324
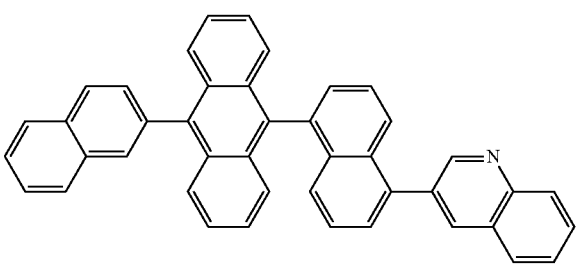
325
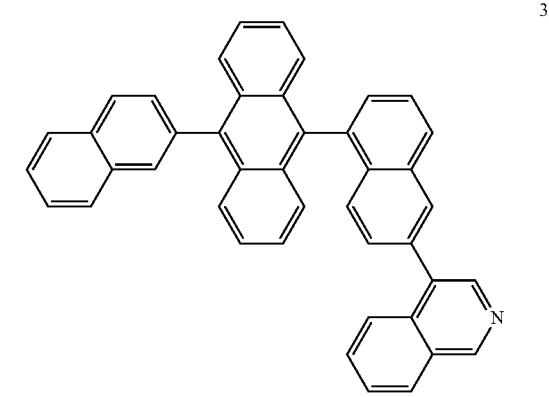
326
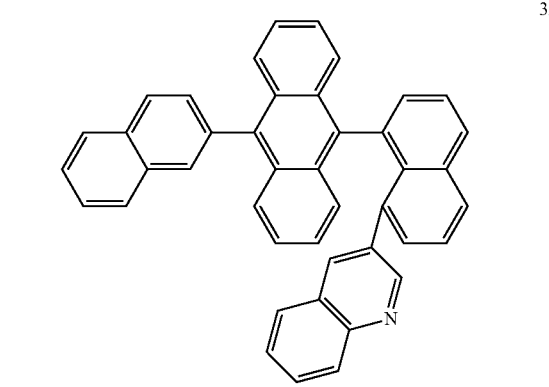

327
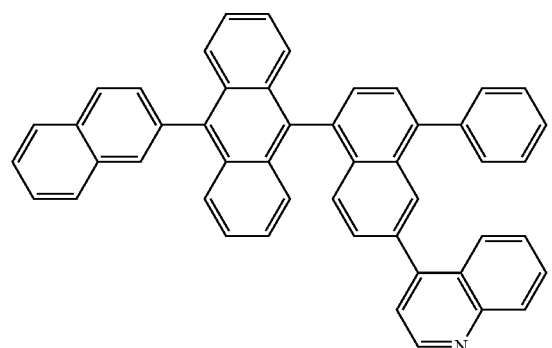
328
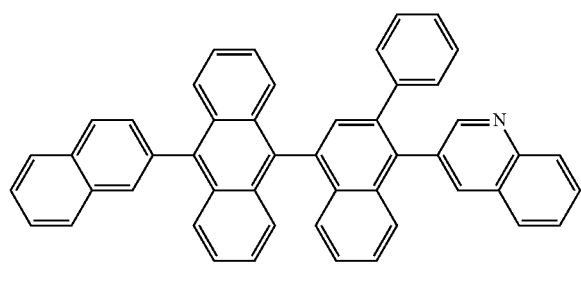
329
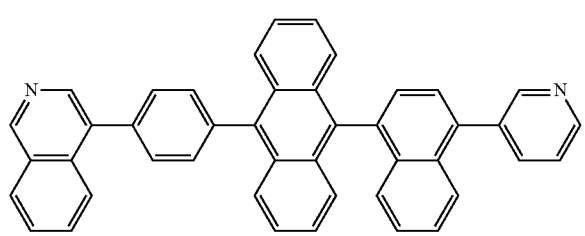
330
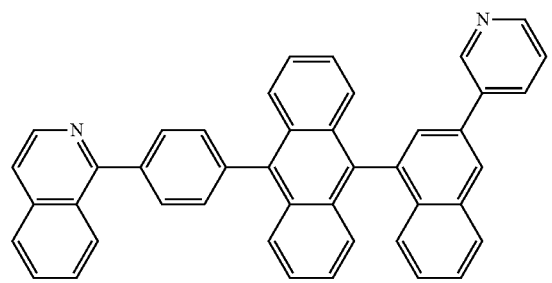
331
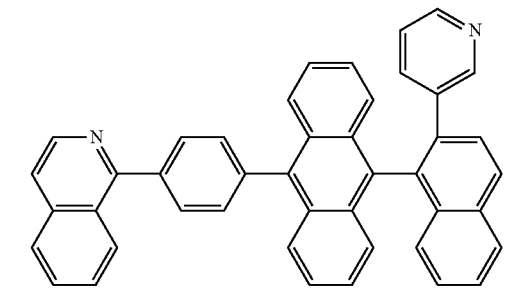
332
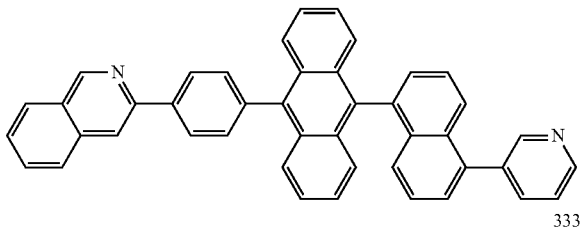
333
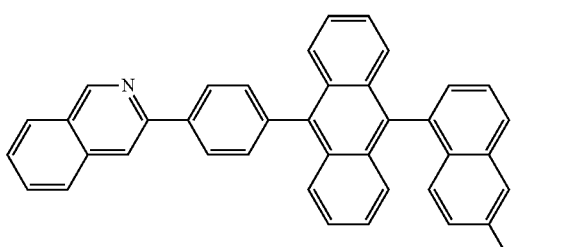
334
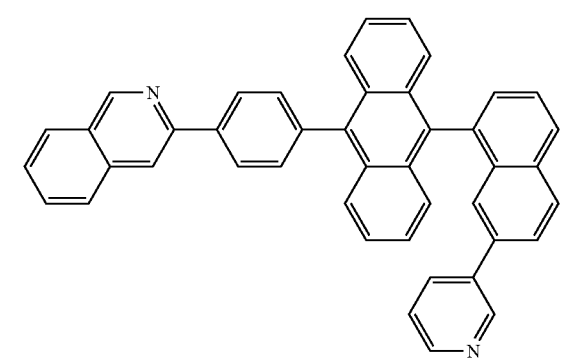
335
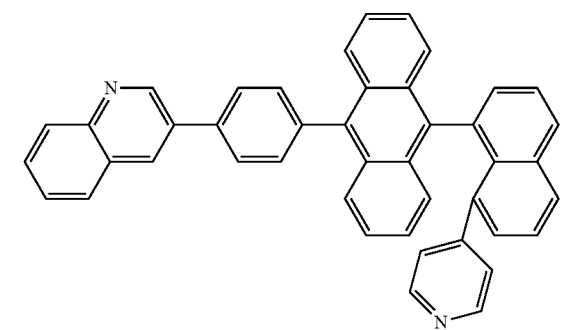
336

337
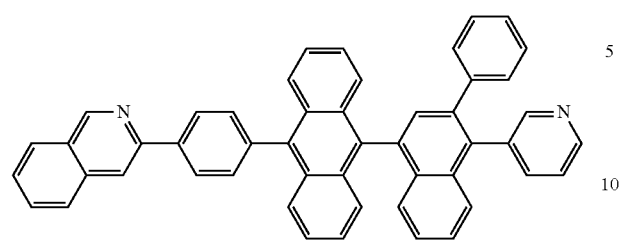
338
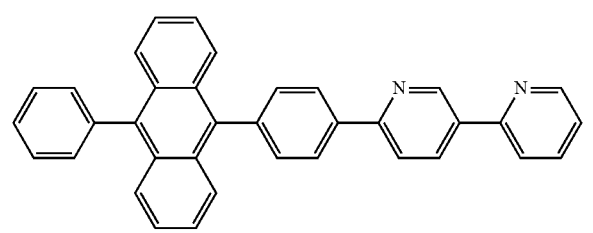
339
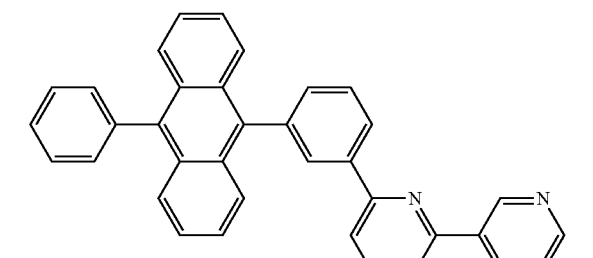
340
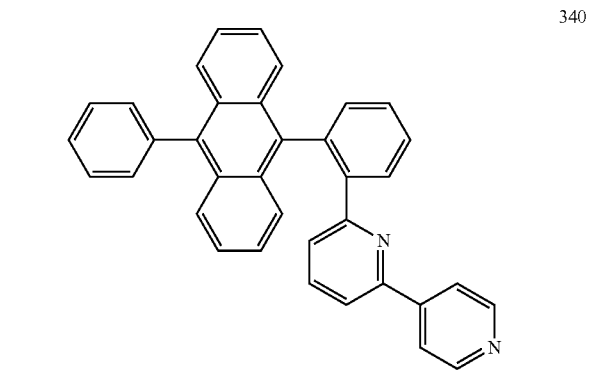
341
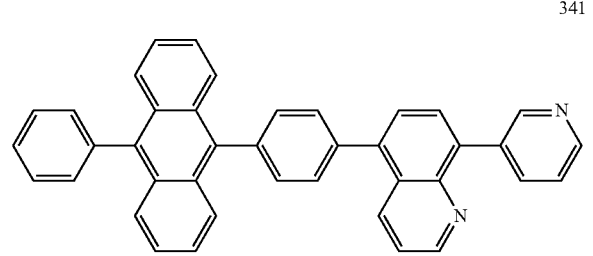
342
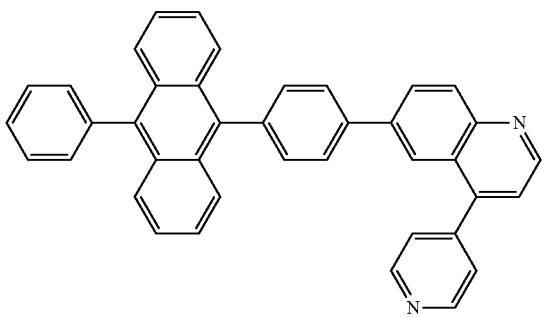
343
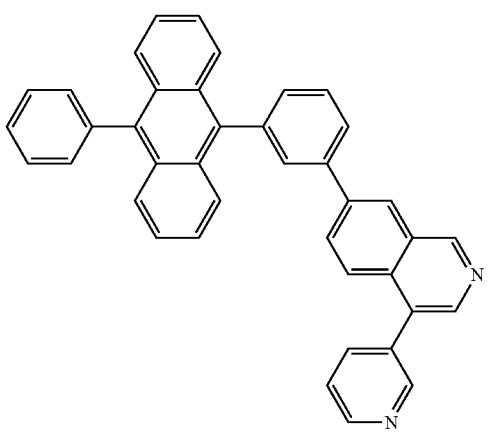
344
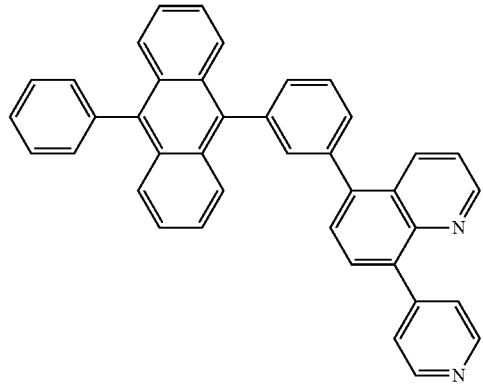
345
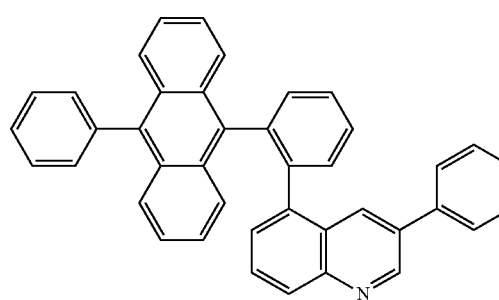

346
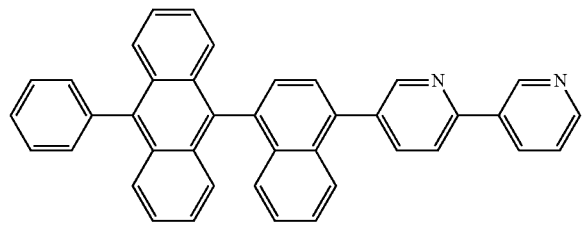
347
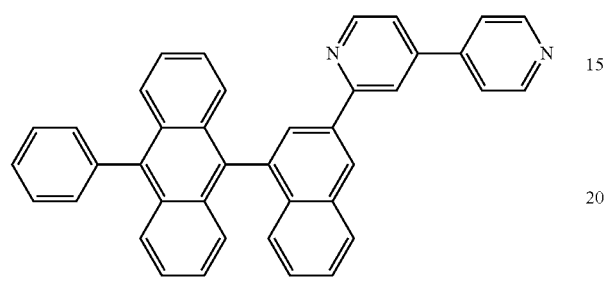
348
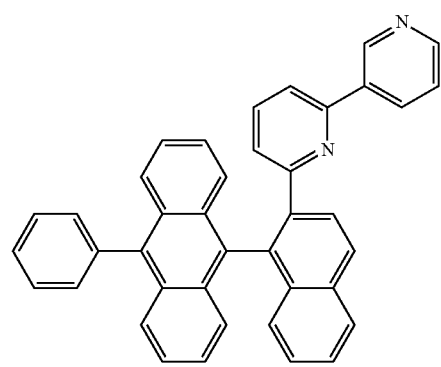
349
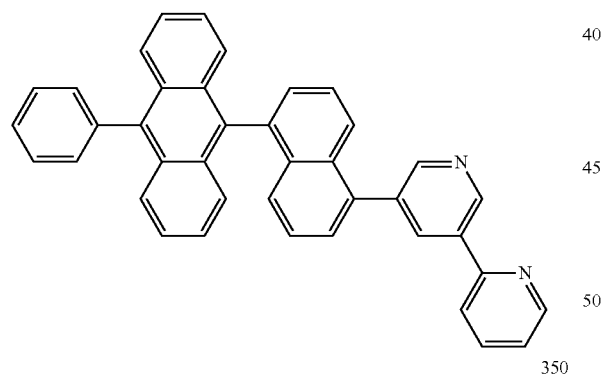
350
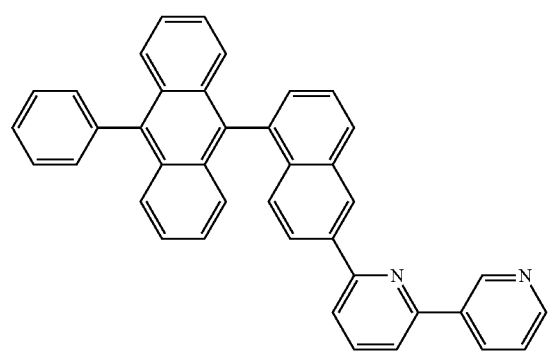
351
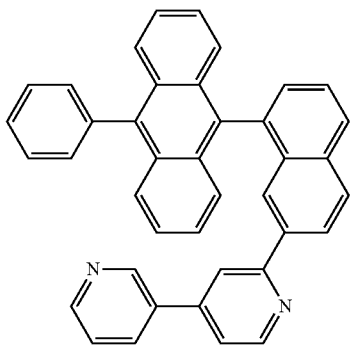
352
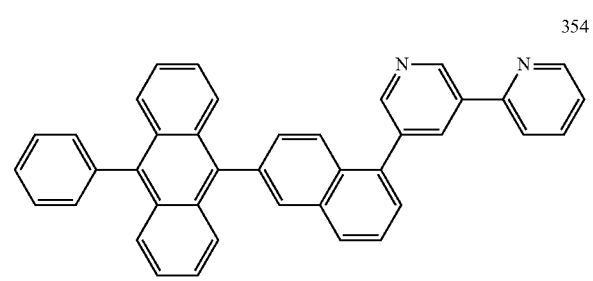
353
354

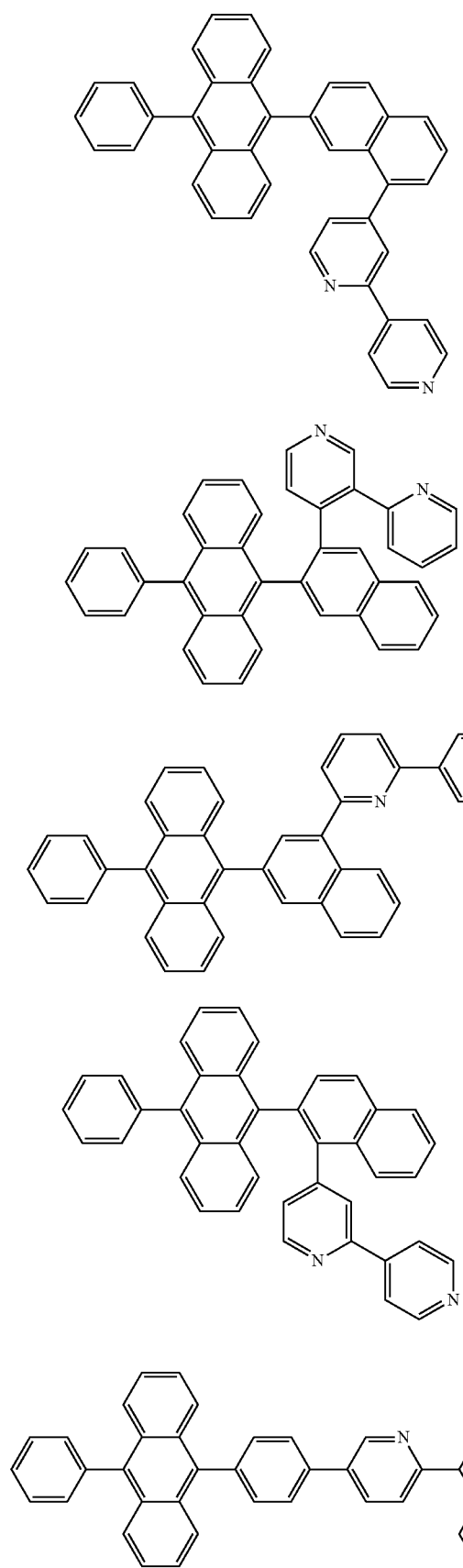
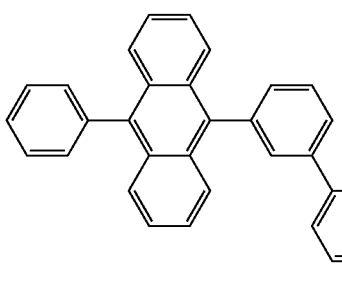
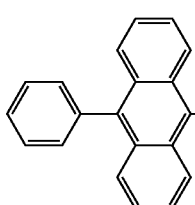
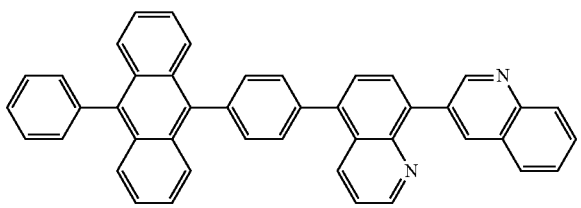
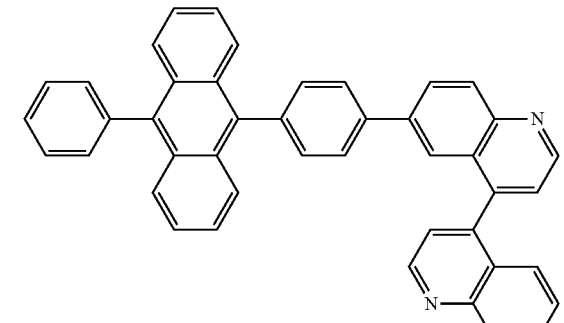
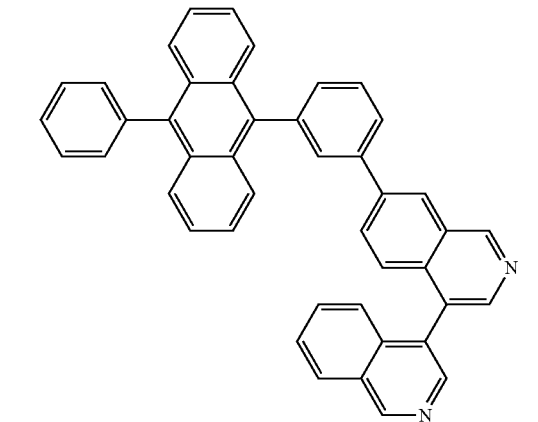

365
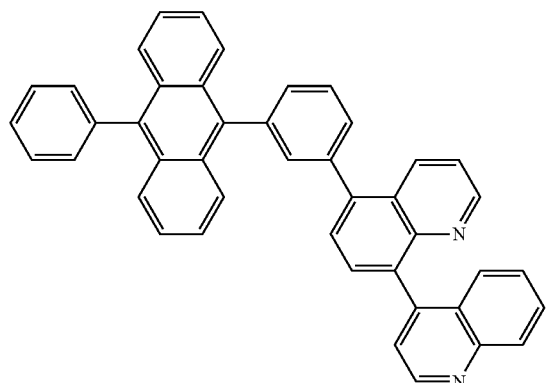
367
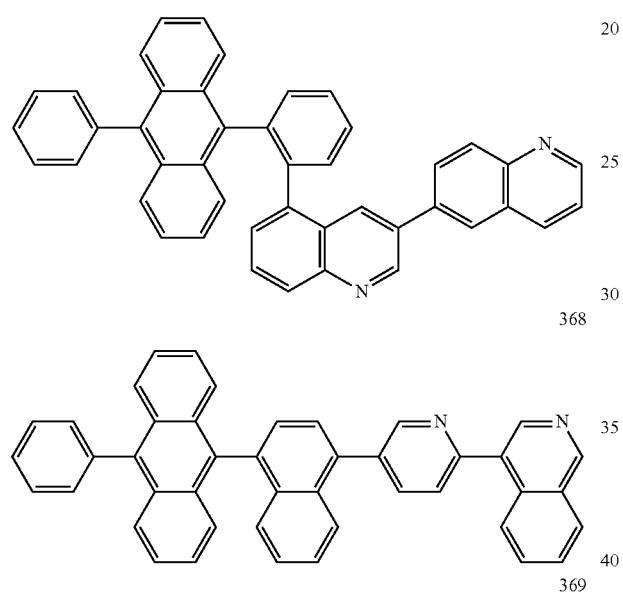
368
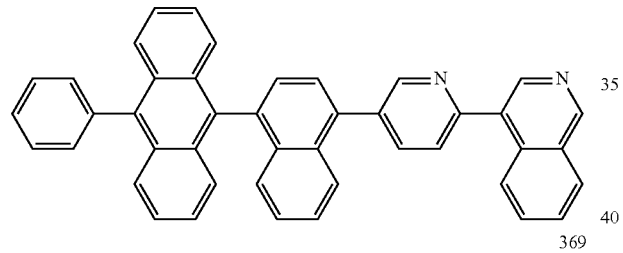
369
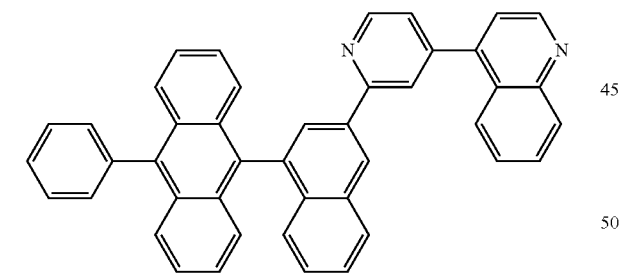
370
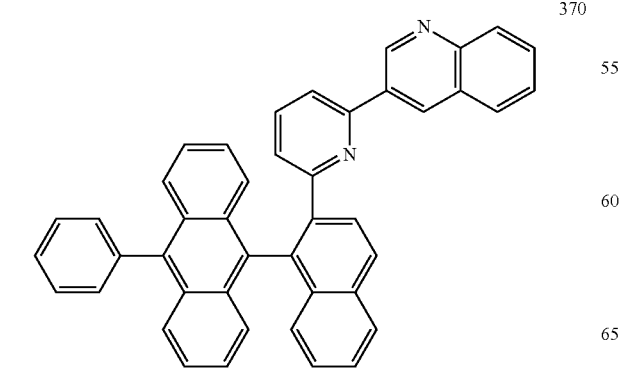
371
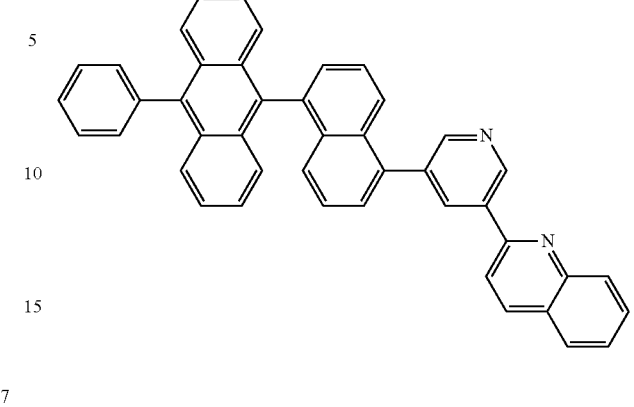
372
373
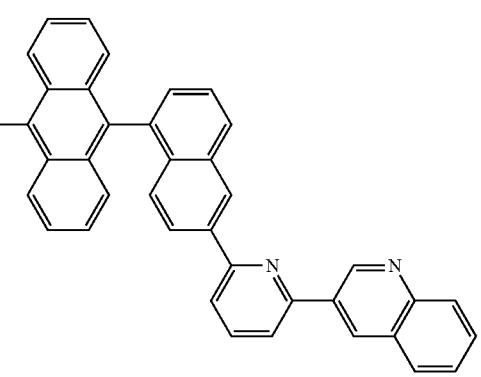
374

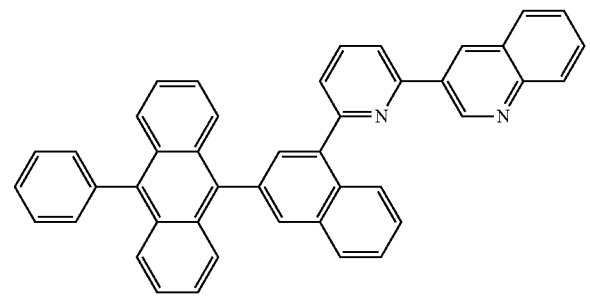
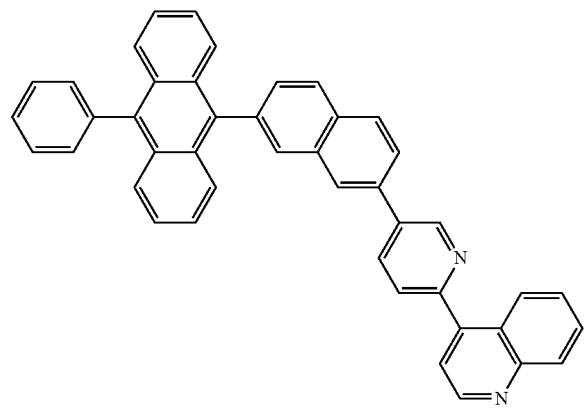
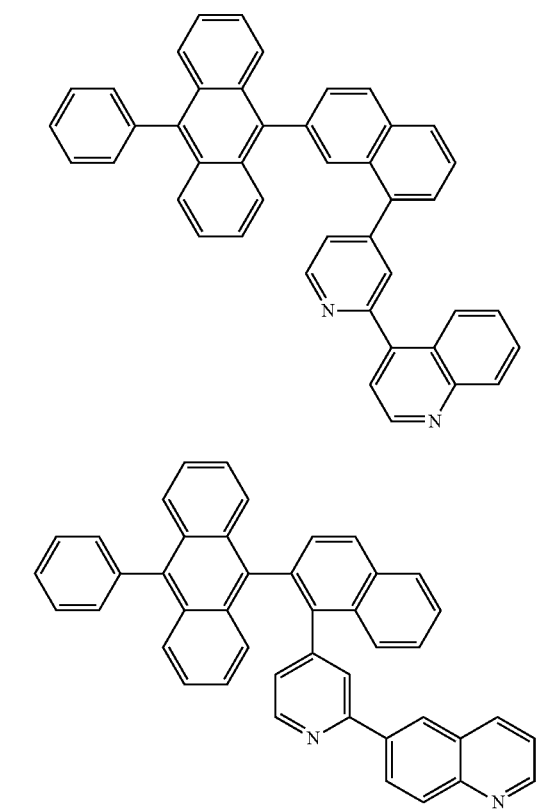

384
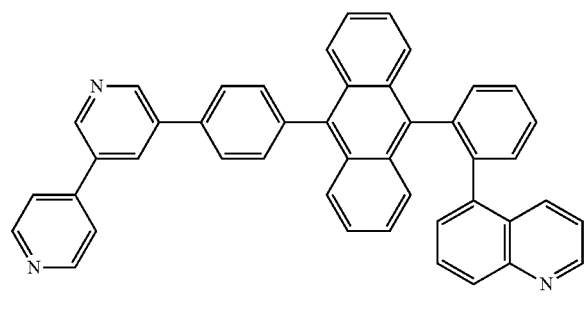
385
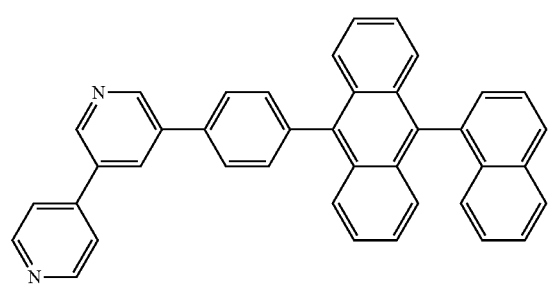
386
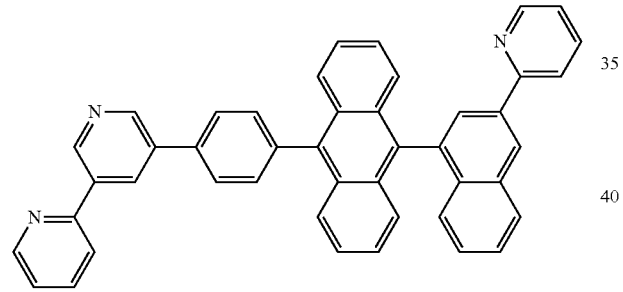
387
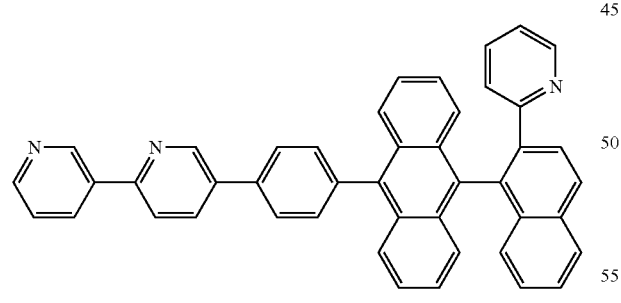
388
389
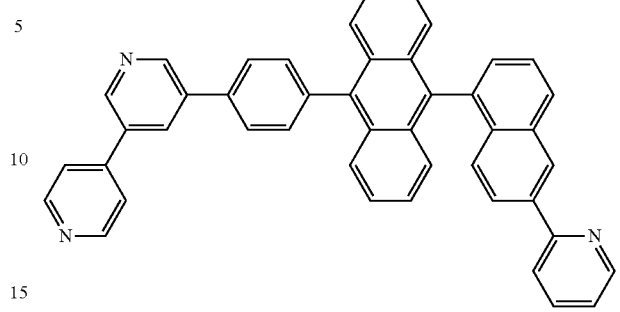
390
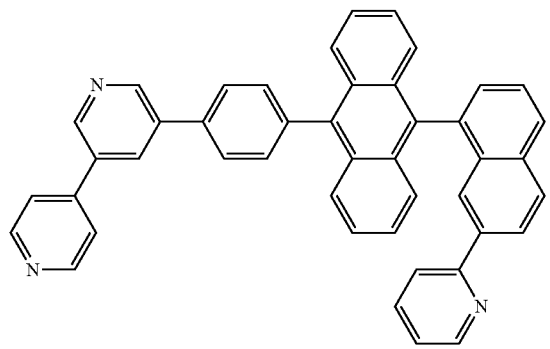
391
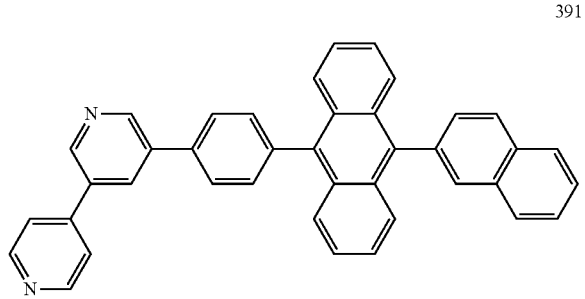
392
393
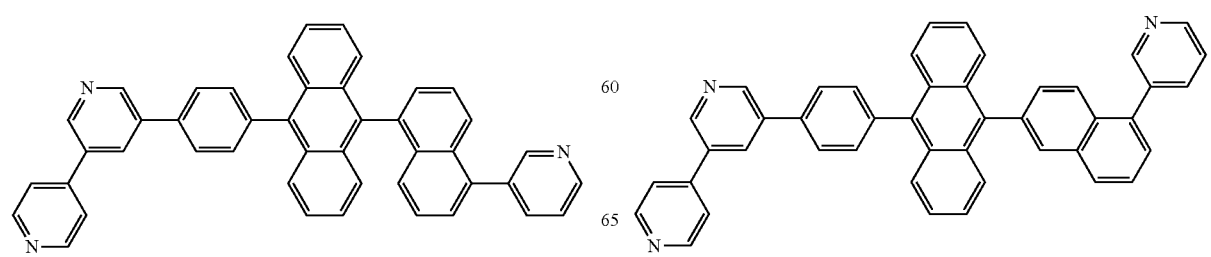

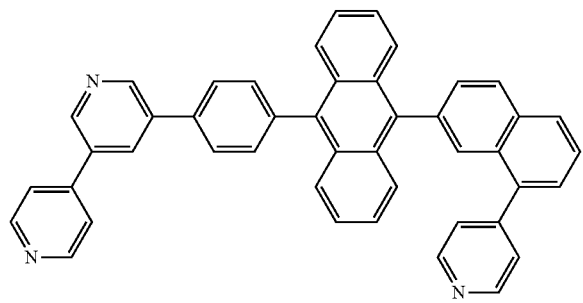

394

395

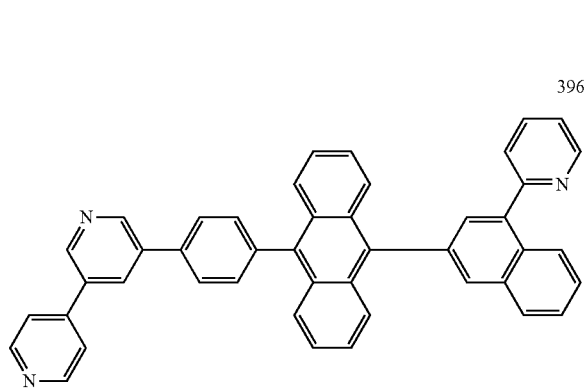

396

397

398

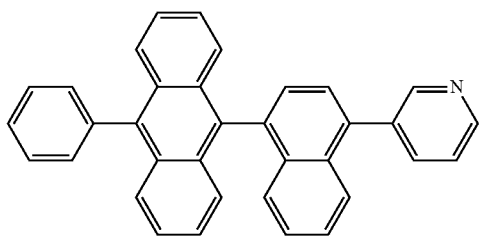

399

400

401

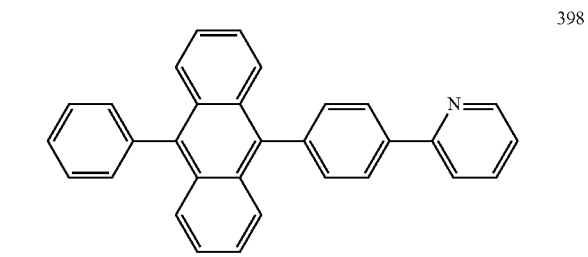

The second materials represented by Formula 2 may have high electron mobility. The first materials represented by Formula 1 may have higher efficiency in combination with an electron trapping dopant. Generally, in order to stably trap excitons in an emission layer, stability of an electron transporting material may be considered. The second materials represented by Formula 2 may have high stability, and a lifespan of an organic light-emitting device including the second materials may be improved.

Accordingly, an organic emitting device including the first materials represented by Formula 1 and the second materials represented by Formula 2 may have high efficiency and a long lifespan.

The organic layer 150 may further include a hole transport region 130 between the first electrode and the emission layer. The organic layer 150 may further include an electron transport region 180 between the emission layer and the second electrode.

The hole transport region 130 may include at least one selected from a hole injection layer (HIL), a hole transport layer (HTL), a buffer layer, and an electron blocking layer (EBL), and the electron transport region 180 may include at least one selected from a buffer layer, an electron transport layer (ETL), and an electron injection layer (EIL), but they are not limited thereto.

The hole transport region 130 may have a single-layered structure formed of a single material, a single-layered structure formed of a plurality of different materials, or a multilayered structure having a plurality of layers formed of a plurality of different materials.

For example, the hole transport region 130 may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein layers of each structure are sequentially stacked from the first electrode 110 in this stated order, but are not limited thereto.

When the hole transport region 130 includes a hole injection layer, the hole injection layer may be formed on the first electrode 110 by using various methods, such as vacuum deposition, spin coating casting, a Langmuir-Blodgett (LB) method, ink-jet printing, laser-printing, or laser-induced thermal imaging.

When a hole injection layer is formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, in consideration of a compound for a hole injection layer to be deposited, and the structure of a hole injection layer to be formed.

When a hole injection layer is formed by spin coating, the spin coating may be performed at a coating rate of about 2,000 rpm to about 5,000 rpm, and at a temperature of about 80° C. to 200° C., in consideration of a compound for a hole injection layer to be deposited, and the structure of a hole injection layer to be formed.

When the hole transport region 130 includes a hole transport layer, the hole transport layer may be formed on the first electrode 110 or the hole injection layer by using various methods, such as vacuum deposition, spin coating, casting, a LB method, ink-jet printing, laser-printing, or laser-induced thermal imaging. When the hole transport layer is formed by vacuum deposition or spin coating, deposition and coating conditions for the hole transport layer may be determined by referring to the deposition and coating conditions for the hole injection layer.

The hole transport region 130 may include at least one selected from m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201 below, and a compound represented by Formula 202 below.

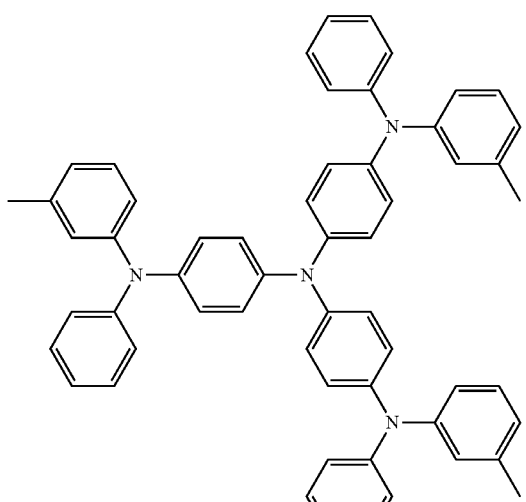

m-MTDATA

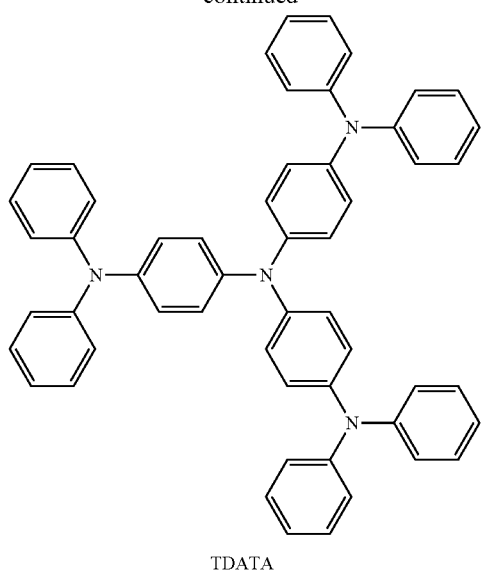

TDATA

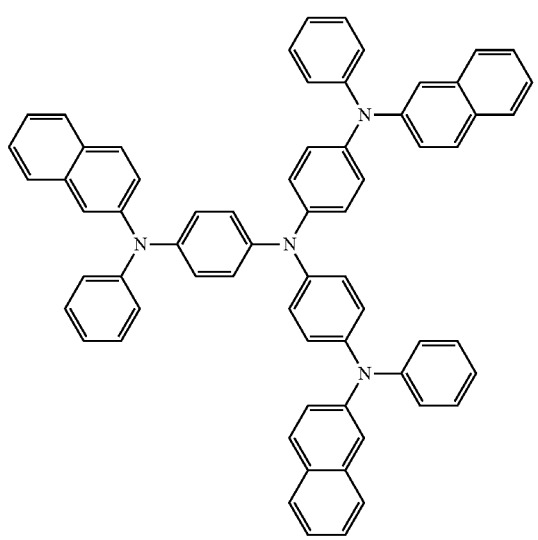

2-TNATA

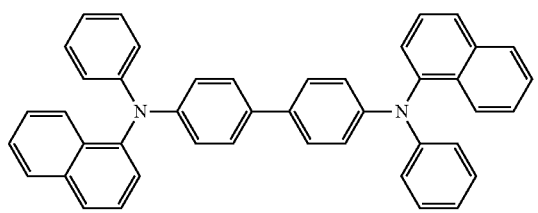

NPB

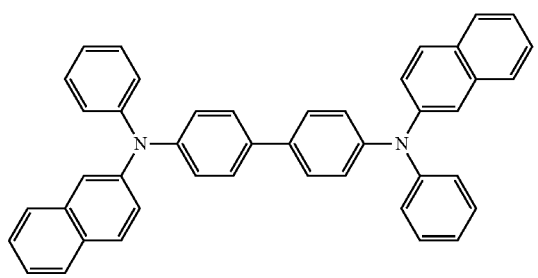

β-NPB

-continued

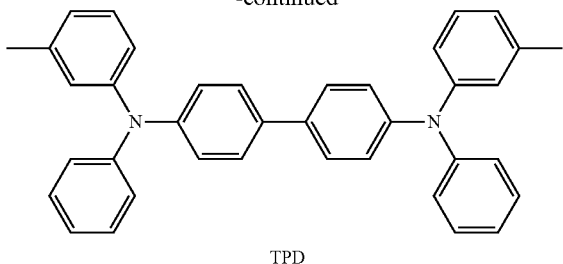

TPD

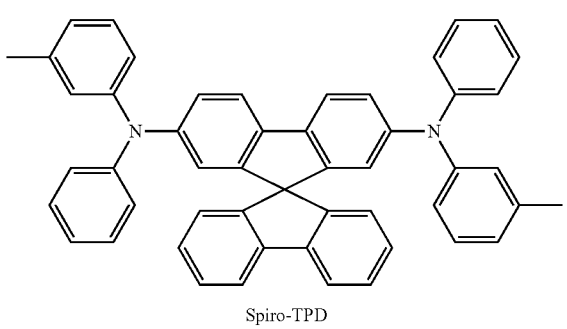

Spiro-TPD

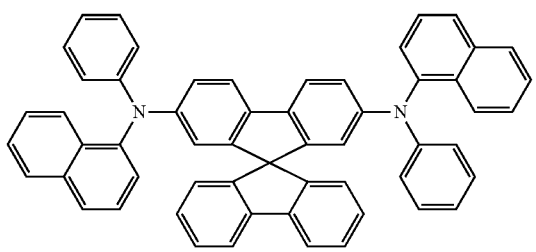

Spiro-NPB

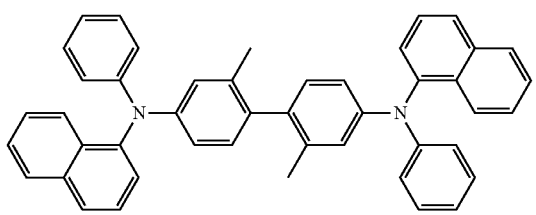

α-NPB

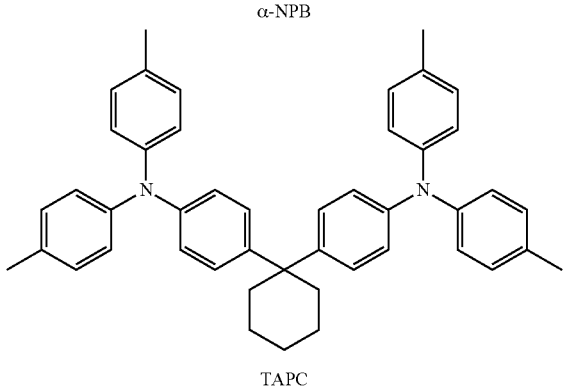

TAPC

-continued

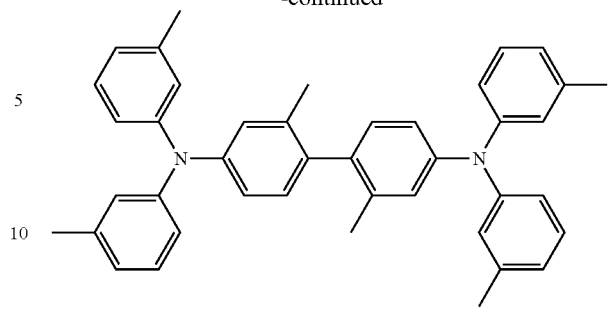

HMTPD

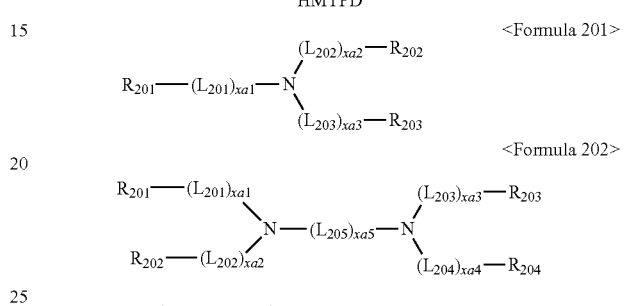

<Formula 201>

<Formula 202>

In Formulae 201 and 202, $L_{201}$ to $L_{205}$ may be each independently selected from a substituted or unsubstituted $C_3$-$C_{10}$ cycloalkylene, a substituted or unsubstituted $C_3$-$C_{10}$ heterocycloalkylene, a substituted or unsubstituted $C_3$-$C_{10}$ cycloalkenylene, a substituted or unsubstituted $C_3$-$C_{10}$ heterocycloalkenylene, a substituted or unsubstituted $C_6$-$C_{60}$ arylene, a substituted or unsubstituted $C_2$-$C_{60}$ heteroarylene, and a substituted or unsubstituted bivalent non-aromatic condensed polycyclic group, at least one of substituents of the substituted $C_3$-$C_{10}$ cycloalkylene, the substituted $C_3$-$C_{10}$ heterocycloalkylene, substituted $C_3$-$C_{10}$ cycloalkenylene, substituted $C_3$-$C_{10}$heterocycloalkenylene, substituted $C_6$-$C_{60}$ arylene, substituted $C_2$-$C_{60}$ heteroarylene, and a substituted bivalent non-aromatic condensed polycyclic group may be selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, and a $C_1$-$C_{60}$ alkoxy;

a $C_1$-$C_{60}$ alkyl, a $C_2$-$C_{60}$ alkenyl, a $C_2$-$C_{60}$ alkynyl, and a $C_1$-$C_{60}$ alkoxy, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a monovalent non-aromatic condensed polycyclic, a monovalent non-aromatic condensed heteropolycyclic, —N($Q_{201}$)($Q_{202}$), —Si($Q_{203}$)($Q_{204}$)($Q_{205}$), and —B($Q_{206}$)($Q_{207}$);

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group;

a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a monovalent non-aromatic condensed polycyclic group, and a monovalent non-aromatic condensed heteropolycyclic group, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a monovalent non-aromatic condensed polycyclic group, a monovalent non-aromatic condensed heteropolycyclic group, —N($Q_{211}$)($Q_{212}$), —Si($Q_{213}$)($Q_{214}$)($Q_{215}$), and —B($Q_{216}$)($Q_{217}$); and —N($Q_{221}$)($Q_{222}$), —Si($Q_{223}$)($Q_{224}$)($Q_{225}$), and —B($Q_{226}$)($Q_{227}$), xa1 to xa4 may be each independently selected from 0, 1, 2, and 3;

xa5 may be selected from 1, 2, 3, 4, and 5; and $R_{201}$ to $R_{204}$ may be each independently selected from a $C_1$-$C_{60}$ alkyl, a $C_2$-$C_{60}$ alkenyl, a $C_2$-$C_{60}$ alkynyl, and a $C_1$-$C_{60}$ alkoxy;

a $C_1$-$C_{60}$ alkyl, a $C_2$-$C_{60}$ alkenyl, a $C_2$-$C_{60}$ alkynyl, and a $C_1$-$C_{60}$ alkoxy, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a monovalent non-aromatic condensed polycyclic, —N($Q_{231}$)($Q_{232}$), —Si($Q_{233}$)($Q_{234}$)($Q_{235}$), and —B($Q_{236}$)($Q_{237}$);

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group; and a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a monovalent non-aromatic condensed polycyclic group, and a monovalent non-aromatic condensed heteropolycyclic group, each substituted with at least one selected from a deuterium, a halogen atom, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a monovalent non-aromatic condensed polycyclic group, a monovalent non-aromatic condensed heteropolycyclic group, —N($Q_{241}$)($Q_{242}$), —Si($Q_{243}$)($Q_{244}$)($Q_{245}$), and —B($Q_{246}$)($Q_{247}$), $Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ may be each independently selected from:

a hydrogen, a deuterium, a halogen atom, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_3$-$C_{10}$cycloalkyl group, a $C_3$-$C_{10}$ heterocycloalkyl group, a $C_3$-$C_{10}$ cycloalkenyl group, a $C_3$-$C_{10}$heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group;

a $C_3$-$C_{10}$cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group; and a $C_3$-$C_{10}$cycloalkyl group, a $C_3$-$C_{10}$heterocycloalkyl group, a $C_3$-$C_{10}$ cycloalkenyl group, a $C_3$-$C_{10}$ heterocycloalkenyl group, a $C_1$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group, each substituted with at least one selected from a deuterium, a halogen atom, a hydroxyl group, a cyano group, a nitro group, an amino group, an amidino group, a hydrazine group, a hydrazone group, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group.

wherein in Formulae 201 and 202, $L_{201}$ to $L_{205}$ may be each independently selected from:

a phenylene, a naphthylenylene, a fluorenylene, a spiro-fluorenylene, a benzofluorenylene, a dibenzofluorenylene, a phenanthrenylene, an anthracenylene, a pyrenylene, a chrysenylene, a pyridinylene, a pyrazinylene, a pyrimidinylene, a pyridazinylene, a quinolinylene, an isoquinolinylene, a quinoxalinylene, a quinazolinylene, a carbazolylene, and a triazinylene; and a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, a isoquinolinylene group, a quinoxalinylene group, a quinazolinylene group, a carbazolylene group, and a triazinylene group, each substituted with at least one selected from a deuterium, a halogen atom, a hydroxyl group, a cyano group, a nitro group, an amino group, an amidino group, a hydrazine group, a hydrazone group, a carboxyl group, and a salt thereof, a sulfonic acid, and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, pyrimidinyl group, a pyridazinyl group, a isoindolyl group, a quinolinyl group, a isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3;

$R_{201}$ to $R_{205}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but are not limited thereto.

The compound represented by Formula 201 may be represented by Formula 201A.

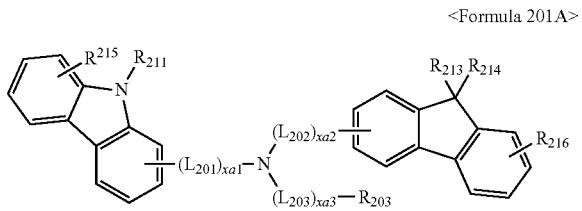

<Formula 201A>

For example, the compound represented by Formula 201 may be represented by Formula 201A-1 below, but is not limited thereto.

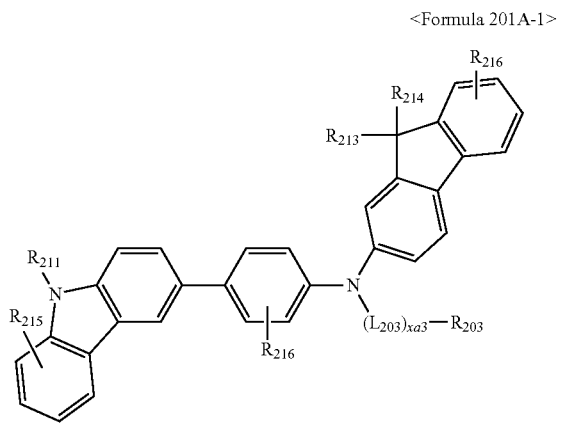

<Formula 201A-1>

For example, the compound represented by Formula 202 may be represented by Formula 202A below, but is not limited thereto.

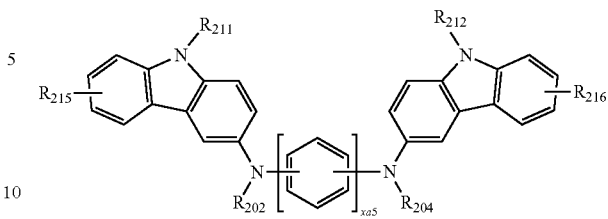

<Formula 202A>

In Formulae 201A, 201A-1, and 202A, $L_{201}$ to $L_{203}$, xa1 to xa3, xa5 and $R_{202}$ to $R_{204}$ have already been described above, $R_{211}$ and $R_{212}$ may be understood by referring to the description provided in connection with $R_{203}$, and $R_{213}$ to $R_{216}$ may be each independently selected from a hydrogen, a deuterium, a halogen atom, a hydroxyl group, cyano, nitro, amino, amidino, hydrazine, a hydrazine group, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, and a non-aromatic condensed polycyclic group.

For example, in Formulae 201A, 201A-1, and 202A, $L_{201}$ to $L_{203}$ may be each independently selected from a phenylene, a naphthylenylene, a fluorenylene, a spiro-fluorenylene, a benzofluorenylene, a dibenzofluorenylene, a phenanthrenylene, an anthracenylene, a pyrenylene, a chrysenylene, a pyridinylene, a pyrazinylene, a pyrimidinylene, a pyridazinylene, a quinolinylene, an isoquinolinylene, a quinoxalinylene, a quinazolinylene, a carbazolylene, and a triazinylene; and a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, a isoquinolinylene group, a quinoxalinylene group, a quinazolinylene group, a carbazolylene group, and a triazinylene group, each substituted with at least one selected from a deuterium, a halogen atom, a hydroxyl group, a cyano group, a nitro group, an amino group, an amidino group, a hydrazine group, a hydrazone group, a carboxyl group, and a salt thereof, a sulfonic acid, and a salt thereof, a phosphoric acid and a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, a isoquinolinyl group, a quinoxalinyl group, a quinazolinyl group, a carbazolyl group, and a triazinyl group;

xa1 to xa3 may be each independently 0 or 1;

$R_{203}$, $R_{211}$, and $R_{212}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from
a $C_1$-$C_{20}$ alkyl and a $C_1$-$C_{20}$ alkoxy;
a $C_1$-$C_{20}$ alkyl and a $C_1$-$C_{20}$ alkoxy, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl, each substituted with at least one selected from a deuterium, a halogen atom, a hydroxyl, a cyano, a nitro, an amino, an amidino, a hydrazine, a hydrazone, a carboxylic acid or a salt thereof, a sulfonic acid or a salt thereof, a phosphoric acid or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl;

$R_{215}$ and $R_{216}$ may be each independently selected from
a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof,
a $C_1$-$C_{20}$ alkyl and a $C_1$-$C_{20}$ alkoxy;

a $C_1$-$C_{20}$ alkyl and a $C_1$-$C_{20}$ alkoxy, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl, each substituted with at least one selected from a deuterium, a halogen atom, a hydroxyl, a cyano, a nitro, an amino, an amidino, a hydrazine, a hydrazone, a carboxylic acid or a salt thereof, a sulfonic acid or a salt thereof, a phosphoric acid or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl; and xa5 is 1 or 2.

$R_{213}$ and $R_{214}$ in Formulae 201A, and 201A-1 may bind to each other to form a saturated or unsaturated ring.

The compound represented by Formula 201, and the compound represented by Formula 202 may each include compounds HT1 to HT20 illustrated below, but are not limited thereto.

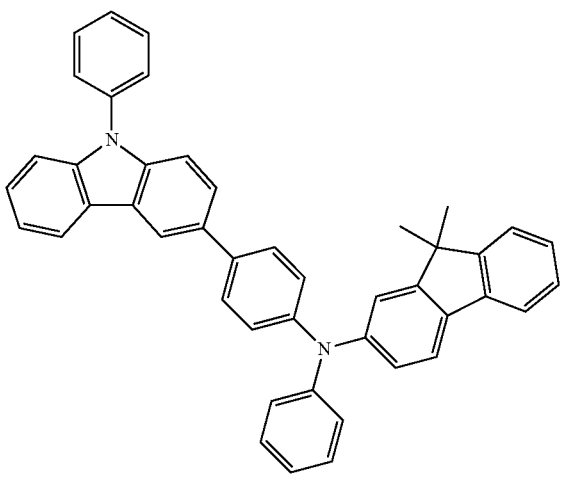

HT1

HT2
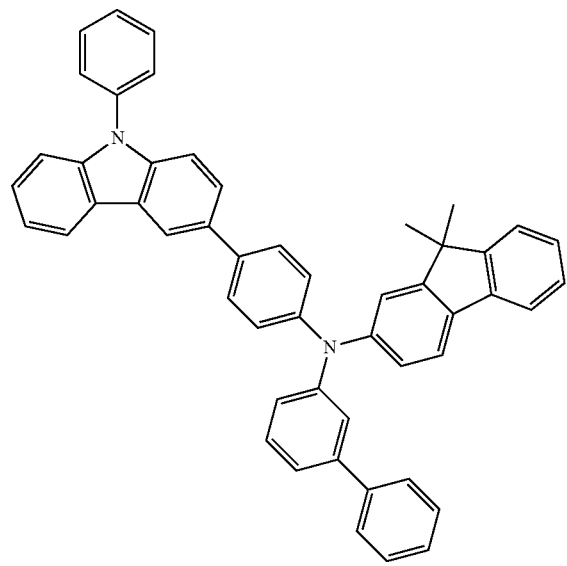
HT4
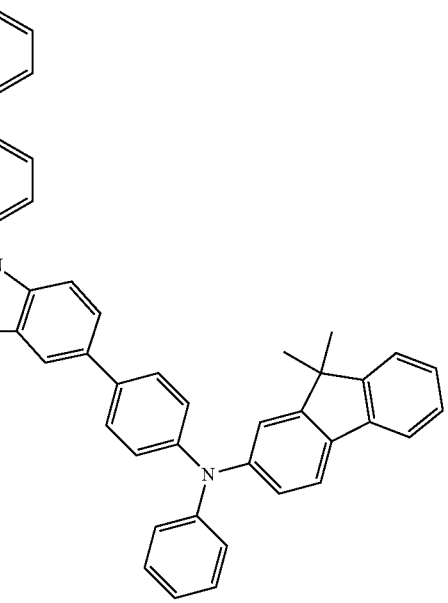
HT3
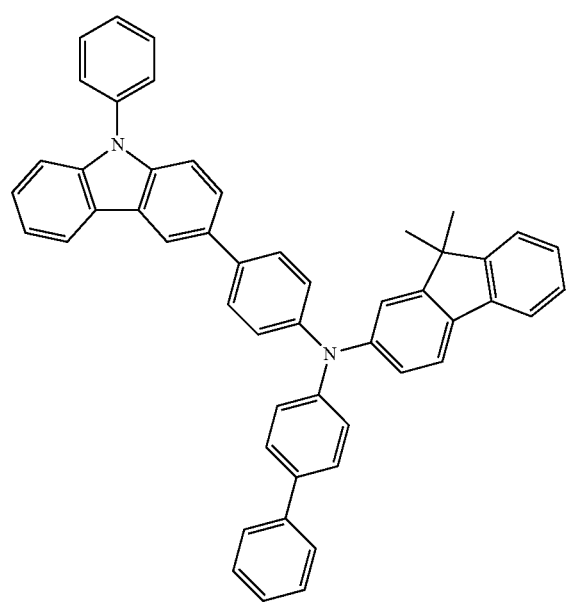
HT5
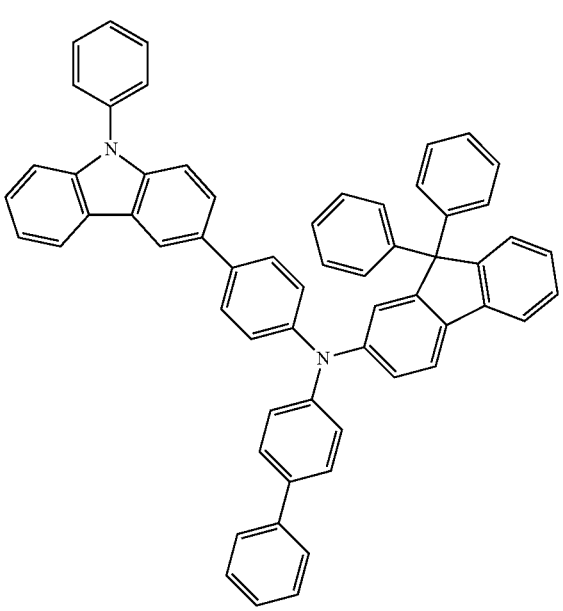

HT6
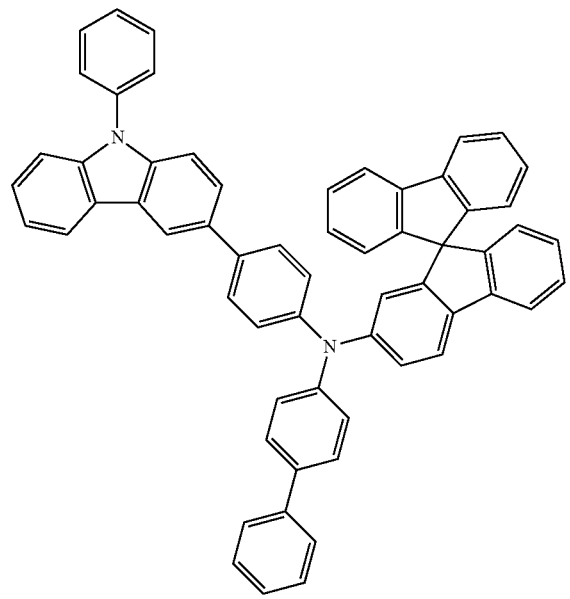
HT8
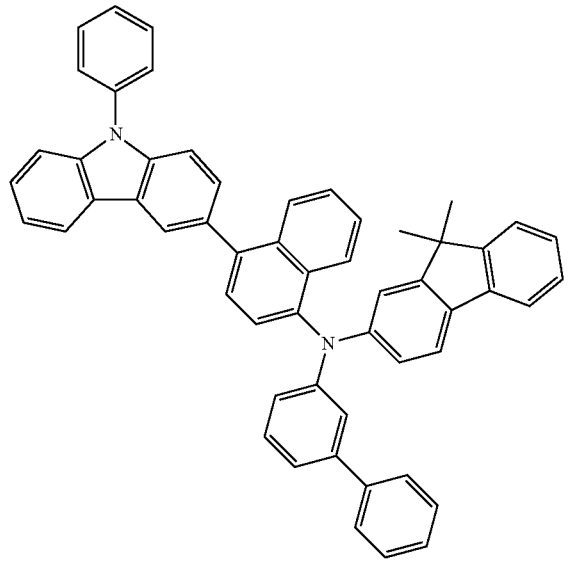
HT7
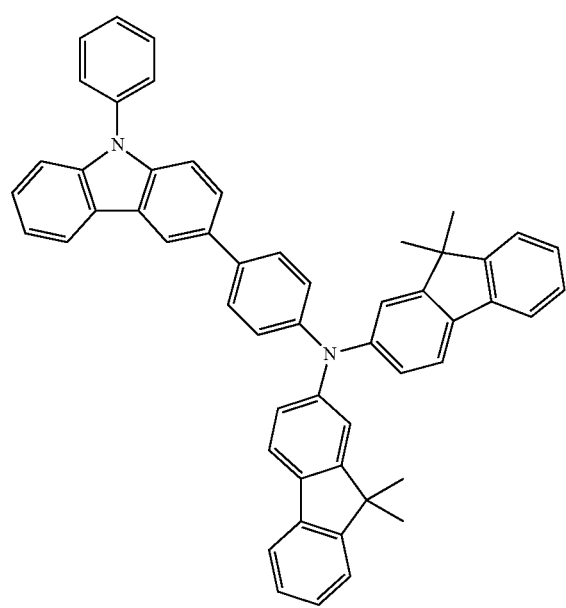
HT9
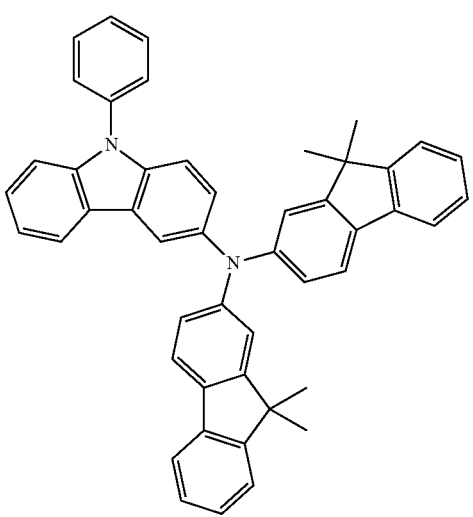

HT10
HT11
HT12
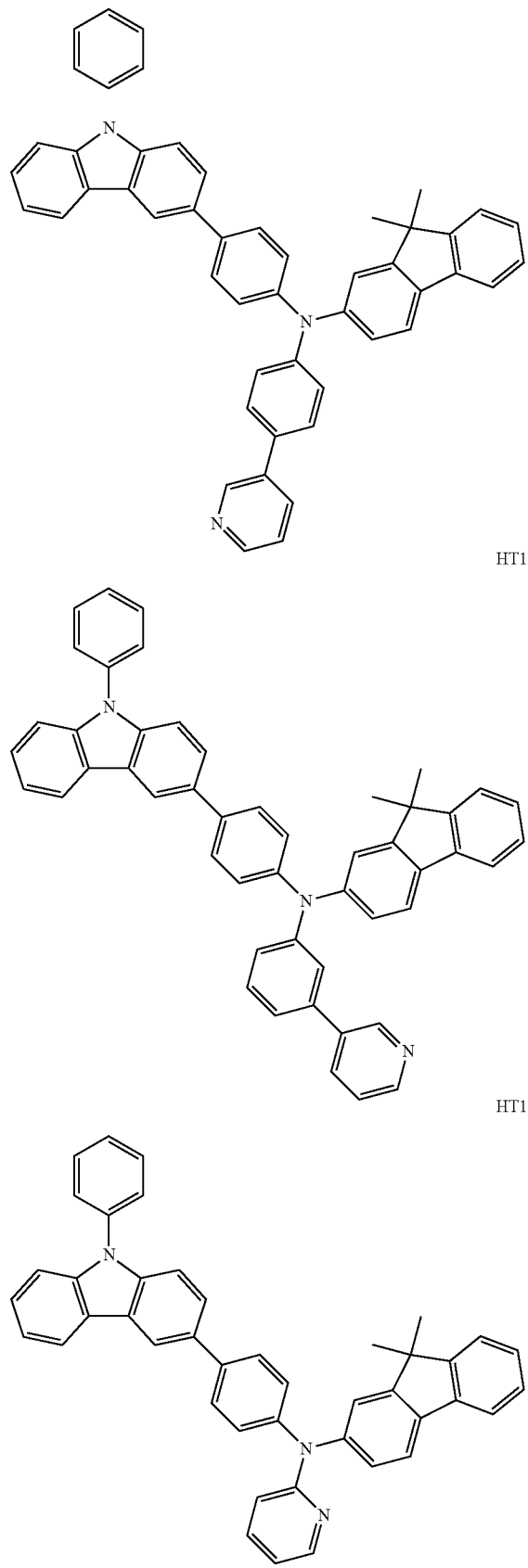
HT13
HT14
HT15
HT16
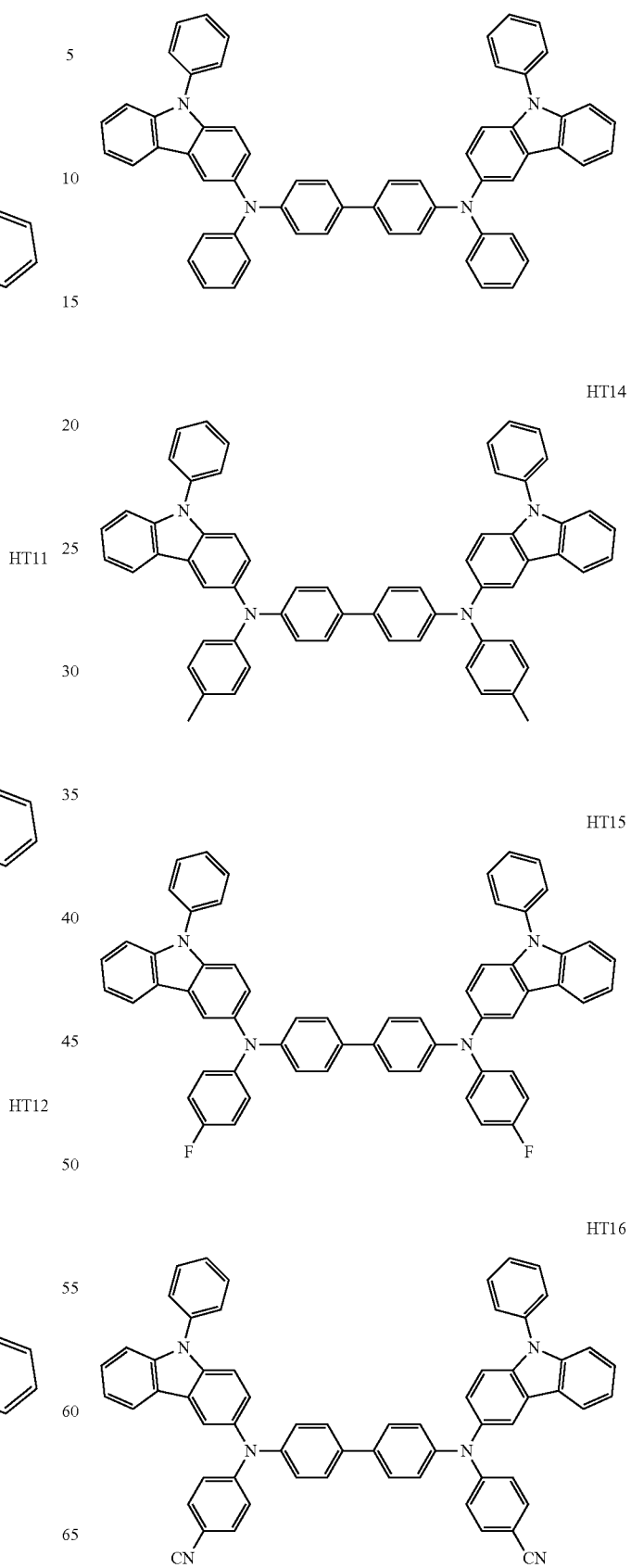

-continued

HT17

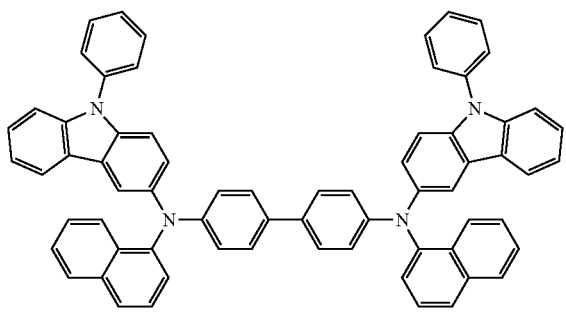

HT18

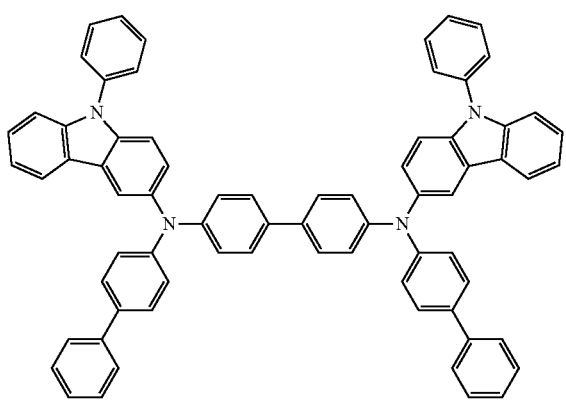

HT19

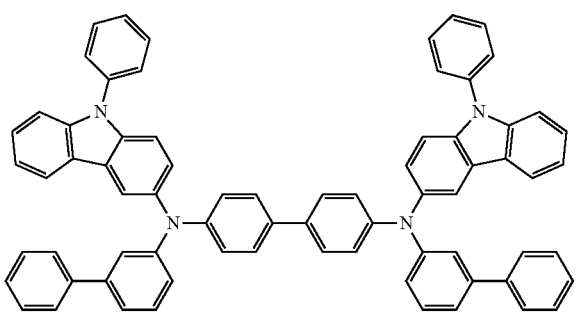

HT20

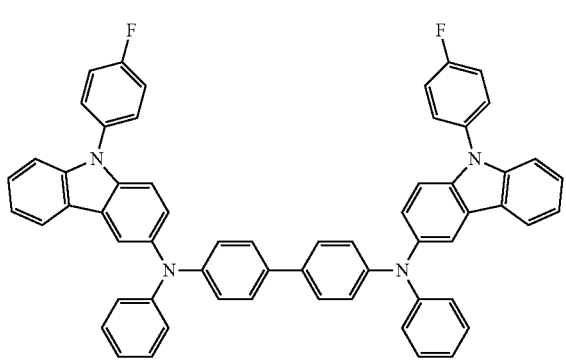

A thickness of the hole transport region 130 may be in a range of about 100 Å to about 10,000 Å, e.g., about 100 Å to about 1000 Å. When the hole transport region 130 includes both a hole injection layer and a hole transport layer, a thickness of the hole injection layer may be in a range of about 100 Å to about 10000 Å, e.g., about 100 Å to about 1000 Å, and a thickness of the hole transport layer may be in a range of about 50 Å to about 2000 Å, e.g., about 100 Å to about 1500 Å. When the thicknesses of the hole transport region 130, the hole injection layer, and the hole transport layer are within these ranges, satisfactory hole transporting characteristics may be obtained without a substantial increase in driving voltage.

The hole transport region 130 may further include, in addition to these materials, a charge-generation material for the improvement of conductive properties. The charge-generation material may be homogeneously or non-homogeneously dispersed in the hole transport region 130.

The charge-generation material may be, e.g., a p-dopant. The p-dopant may be one of a quinone derivative, a metal oxide, and a cyano group-containing compound, but is not limited thereto. For example, non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide, and Compound HT-D1 illustrated below, but are not limited thereto.

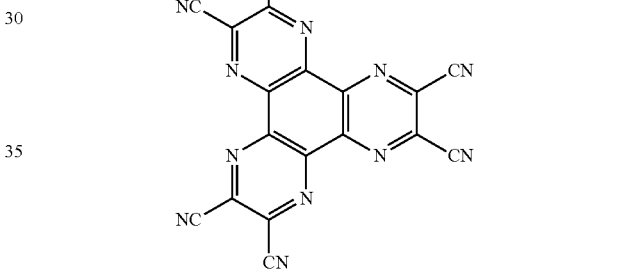

<Compound HT-D1>

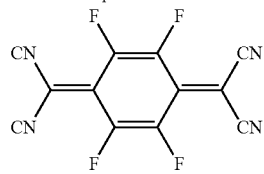

<F4-TCNQ>

The hole transport region 130 may further include, in addition to the hole injection layer and the hole transport layer, at least one of a buffer layer and an electron blocking layer. The buffer layer may compensate for an optical resonance distance according to a wavelength of light emitted from the emission layer, and light-emission efficiency of a formed organic light-emitting device may be improved. For use as a material included in the buffer layer, materials that are included in the hole transport region 130 may be used. The electron blocking layer may help prevent injection of electrons from the electron transport region 130.

An emission layer may be formed on the first electrode 110 or the hole transport region 130 by using various methods, such as vacuum deposition, spin coating, casting, a LB method, ink-jet printing, laser-printing, or laser-induced thermal imaging. When the emission layer is formed by vacuum deposition or spin coating, deposition and coating conditions for the emission layer may be determined by referring to the deposition and coating conditions for the hole injection layer.

When the organic light-emitting device 10 is a full color organic light-emitting device, the emission layer may be patterned into a red emission layer, a green emission layer, or a blue emission layer, according to a sub pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light. According to another embodiment, the emission layer may be a white emission layer, and may further include a color converting layer or a color filter to turn white light into light of a desired color.

The emission layer may include a host and a dopant.

The host may include at least one first material represented by Formula 1.

The dopant may be at least one selected from a fluorescent dopant and a phosphorescent dopant.

The fluorescent dopant may include a compound represented by Formula 501 below.

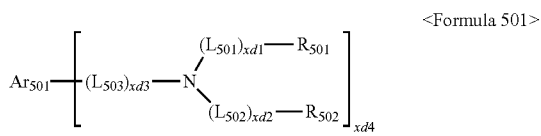

<Formula 501>

In Formula 501, $Ar_{501}$ may be selected from:

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a monovalent non-aromatic condensed polycyclic group, a monovalent non-aromatic condensed heteropolycyclic group, and —Si($Q_{501}$)($Q_{502}$)($Q_{503}$) ($Q_{501}$ to $Q_{503}$ may be each independently selected from a hydrogen, a $C_1$-$C_{60}$ alkyl, a $C_2$-$C_{60}$ alkenyl, a $C_6$-$C_{60}$ aryl, and a $C_2$-$C_{60}$ heteroaryl);

$L_{501}$ to $L_{503}$ may be understood by referring to the description provided herein in connection with $L_{201}$;

$R_{501}$ and $R_{502}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl, a naphthyl, a fluorenyl, a spiro-fluorenyl, a benzofluorenyl, a dibenzofluorenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl, each substituted with at least one selected from a deuterium, a halogen atom, a hydroxyl, a cyano, a nitro, an amino, an amidino, a hydrazine, a hydrazone, a carboxylic acid or a salt thereof, a sulfonic acid or a salt thereof, a phosphoric acid or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, a triazinyl, a dibenzofuranyl, and a dibenzothiophenyl; and xd1 to xd3 may be each independently selected from 0, 1, 2, and 3; and xd4 may be selected from 1, 2, 3, and 4.

The fluorescent dopant may include at least one of Compounds FD1 to FD8:

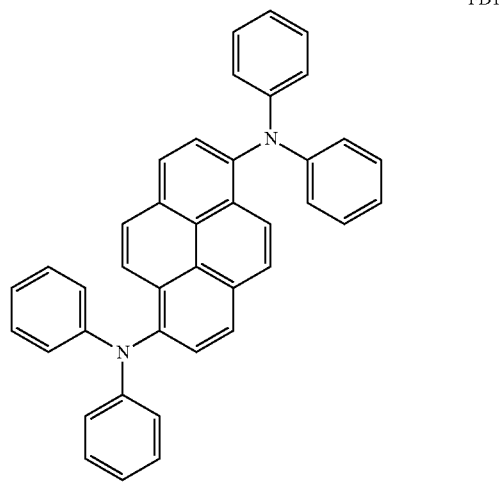

FD1

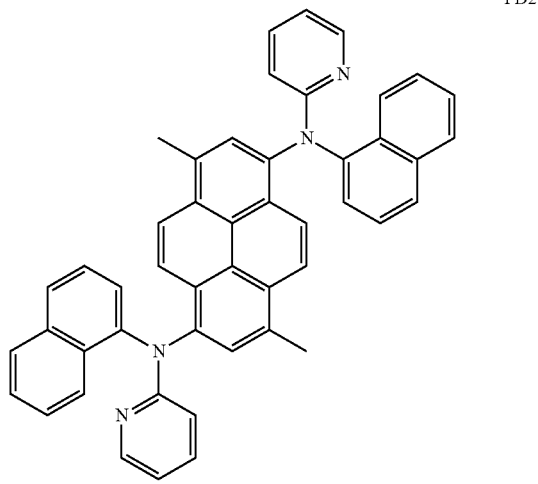

FD2

FD3
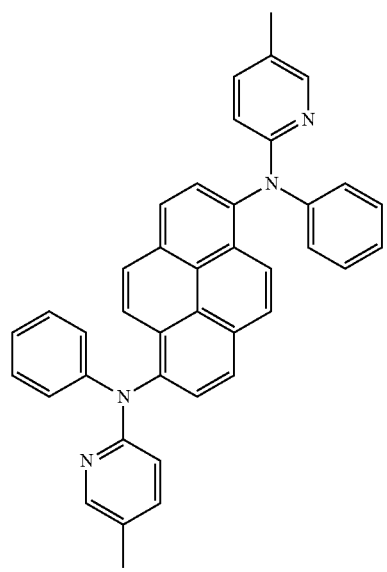
FD5
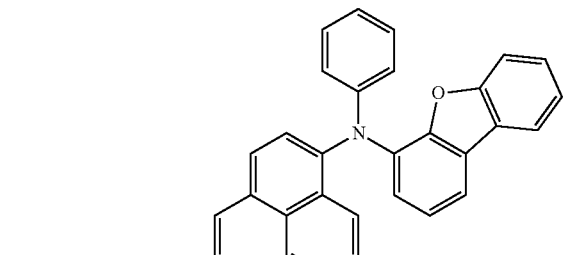
FD6
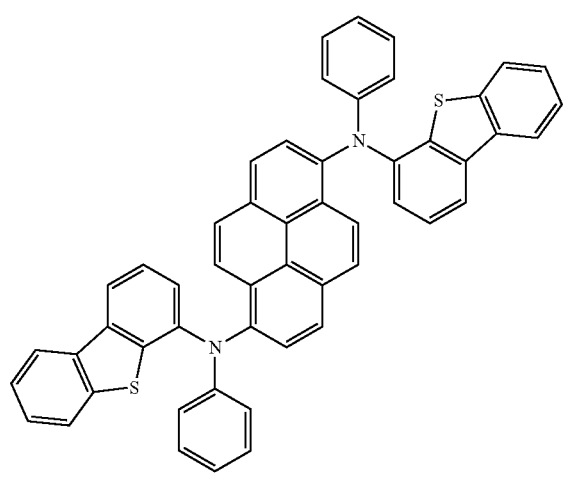
FD4
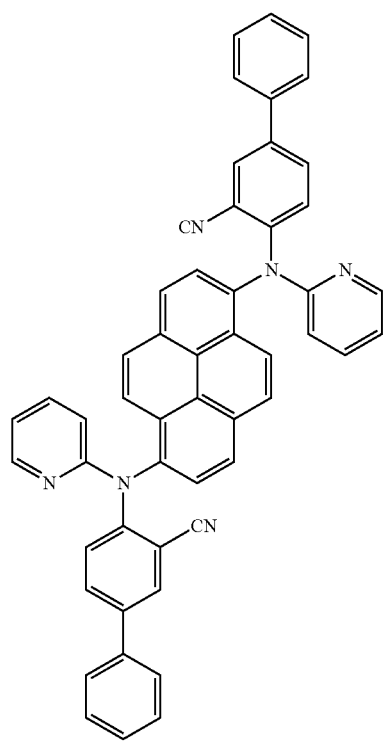
FD7
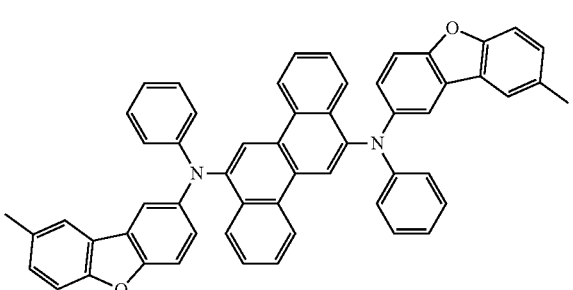
FD8
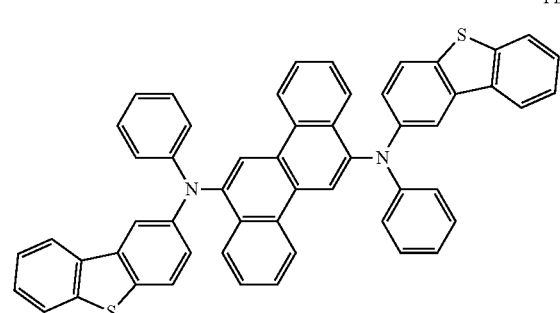

An amount of the dopant in the emission layer may be, e.g., in a range of about 0.01 to about 15 parts by weight based on 100 parts by weight of the host, but is not limited thereto.

A thickness of the emission layer may be in a range of about 100 Å to about 1,000 Å, e.g., about 200 Å to about 600 Å. When the thickness of the emission layer is within this range, excellent light-emission characteristics may be obtained without a substantial increase in driving voltage.

Then, the electron transport region 180 may be disposed on the emission layer.

The electron transport region 180 may include at least one selected from a buffer layer, an electron transport layer (ETL), and an electron injection layer, but is not limited thereto.

For example, the electron transport region 180 may have an electron transport layer alone, a structure of electron transport layer/electron injection layer, or a structure of buffer layer/electron transport layer/electron injection layer, wherein layers of each structure are sequentially stacked from the emission layer in this stated order, but is not limited thereto.

The electron transport region 180 may include a buffer layer. The buffer layer may be formed, when the emission layer includes a phosphorescent dopant, to help prevent diffusion of excitons or holes into an electron transport layer.

When the electron transport region 180 includes the buffer layer, the buffer layer may be formed on the emission layer by using various methods, such as vacuum deposition, spin coating casting, a Langmuir-Blodgett (LB) method, ink-jet printing, laser-printing, or laser-induced thermal imaging. When the buffer layer is formed by vacuum deposition or spin coating, deposition and coating conditions for the buffer layer may be determined by referring to the deposition and coating conditions for the hole injection layer.

In an implementation, the buffer layer may include, e.g., at least one second material represented by Formula 2.

A thickness of the buffer layer may be in a range of about 20 Å to about 1,000 Å, e.g., about 30 Å to about 300 Å. When the thickness of the hole blocking layer is within these ranges, the hole blocking layer may have excellent hole blocking characteristics without a substantial increase in driving voltage.

The electron transport region 180 may include an electron transport layer. The electron transport layer may be formed on the emission layer or the buffer layer by using various methods, e.g., vacuum deposition, spin coating casting, a LB method, ink-jet printing, laser-printing, or laser-induced thermal imaging. When an electron transport layer is formed by vacuum deposition or spin coating, deposition and coating conditions for the electron transport layer may be determined by referring to the deposition and coating conditions for the hole injection layer.

The electron transport layer may include at least one selected from a second material represented by Formula 2, BCP, Bphen, Alq$_3$, Balq, TAZ, NTAZ, and a compound represented by Formula 601 below.

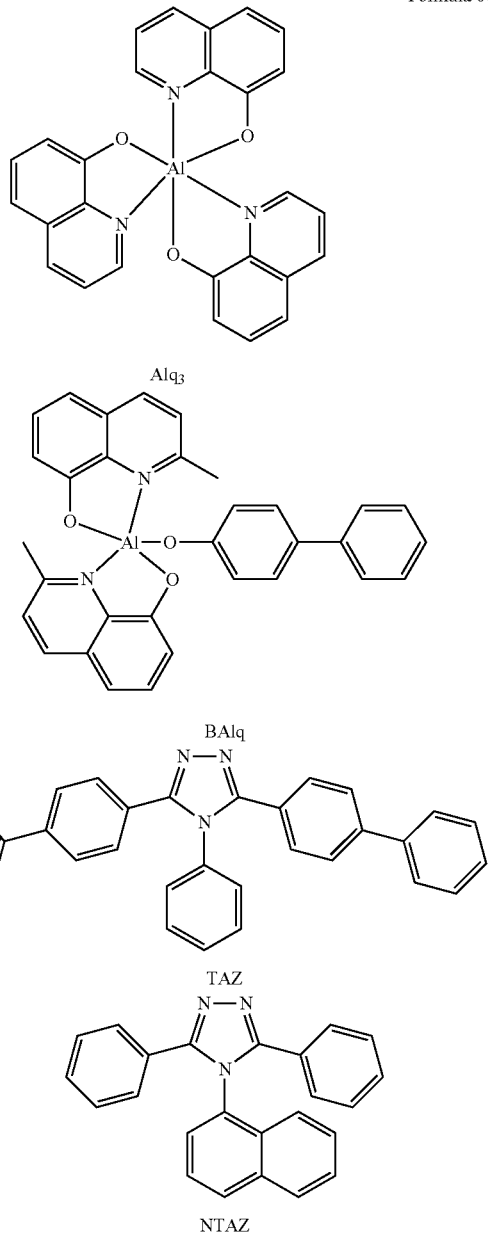

$Ar_{601}\text{-}[(L_{601})_{xe1}\text{-}E_{601}]_{xe2}$

In Formula 601, $Ar_{601}$ may be selected from a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, a halogen atom, a hydroxyl, a cyano group, a nitro group, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_3$-$C_{10}$ heterocycloalkyl, a $C_3$-$C_{10}$ cycloalkenyl, a $C_3$-$C_{10}$ heterocycloalkenyl, a $C_6$-$C_{60}$ aryl, a $C_6$-$C_{60}$ aryloxy, a $C_6$-$C_{60}$ arylthio, a $C_2$-$C_{60}$ heteroaryl, a non-aromatic condensed polycyclic group, and —Si($Q_{301}$)($Q_{302}$)($Q_{303}$) ($Q_{301}$ to $Q_{303}$ may be each independently selected from a hydrogen, a $C_1$-$C_{60}$ alkyl, a $C_2$-$C_{60}$ alkenyl, a $C_6$-$C_{60}$ aryl, and a $C_2$-$C_{60}$ heteroaryl);

$L_{601}$ may be understood by referring to the description provided in connection with $L_{201}$;

$E_{601}$ may be selected from a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, a imidazolyl group, a pyrazolyl group, a thiazolyl group, a isothiazolyl group, a oxazolyl group, a isoxazolyl group, a pyridinyl group, a pyrazinyl group, a pyrimidinyl group, a pyridazinyl group, a isoindolyl group, a indolyl group, a indazolyl group, a purinyl group, a quinolinyl group, a isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, a acridinyl group, a phenanthrolinyl group, a phenazinyl group, a benzimidazolyl group, a benzofuranyl group, a benzothiophenyl group, a isobenzothiazolyl group, a benzooxazolyl group, a isobenzooxazolyl group, a triazolyl group, a tetrazolyl group, a oxadiazolyl group, a triazinyl group, a dibenzofuranyl group, a dibenzothiophenyl group, a benzocarbazolyl group, and a dibenzocarbazolyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, a indenyl group, a naphthyl group, a azulenyl group, a heptalenyl group, a indacenyl group, a acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, a ovalenyl group, a pyrrolyl group, a thiophenyl group, a furanyl group, a imidazolyl group, a pyrazolyl group, a thiazolyl group, a isothiazolyl group, a oxazolyl group, a isoxazolyl group, a pyridinyl group, a pyrazinyl group, a pyrimidinyl group, a pyridazinyl group, a isoindolyl group, a indolyl group, a indazolyl group, a purinyl group, a quinolinyl group, a isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, a acridinyl group, a phenanthrolinyl group, a phenazinyl group, a benzimidazolyl group, a benzofuranyl group, a benzothiophenyl group, a isobenzothiazolyl group, a benzooxazolyl group, a isobenzooxazolyl group, a triazolyl group, a tetrazolyl group, a oxadiazolyl group, a triazinyl group, a dibenzofuranyl group, and a dibenzothiophenyl group; and xe1 may be selected from 0, 1, 2, and 3; and xe2 may be selected from 1, 2, 3, and 4.

In some embodiments, the electron transport layer may further include at least one of compounds represented by Formula 602 below.

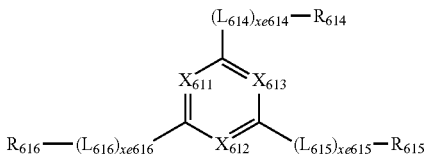

<Formula 602>

In Formula 602, $X_{611}$ may be N or C-($L_{611}$)$_{xe611}$-$R_{611}$, $X_{612}$ may be N or C-($L_{612}$)$_{xe612}$-$R_{612}$, $X_{613}$ may be N or C-($L_{613}$)$_{xe613}$-$R_{613}$, and at least one of $X_{611}$ to $X_{613}$ may be N;

$L_{611}$ to $L_{616}$ may be understood by referring to the description provided herein in connection with $L_{201}$;

$R_{611}$ and $R_{616}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, a isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, a isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 may include at least one of Compounds ET1 to ET15 illustrated below.
ET1
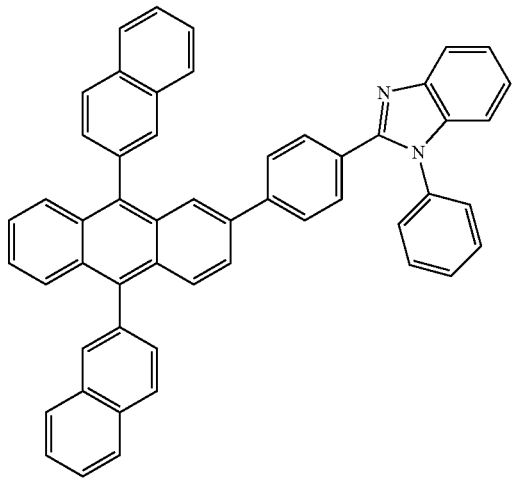
ET2
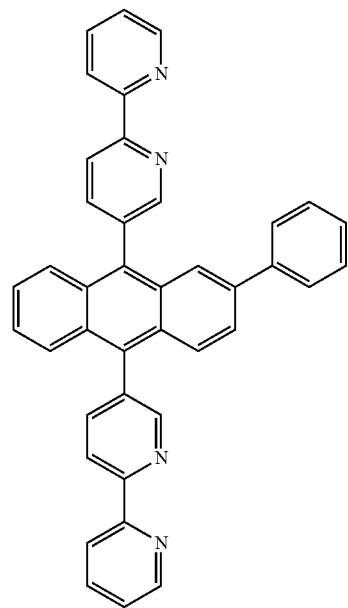
ET3
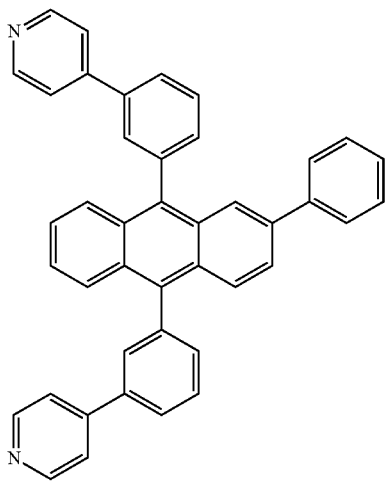
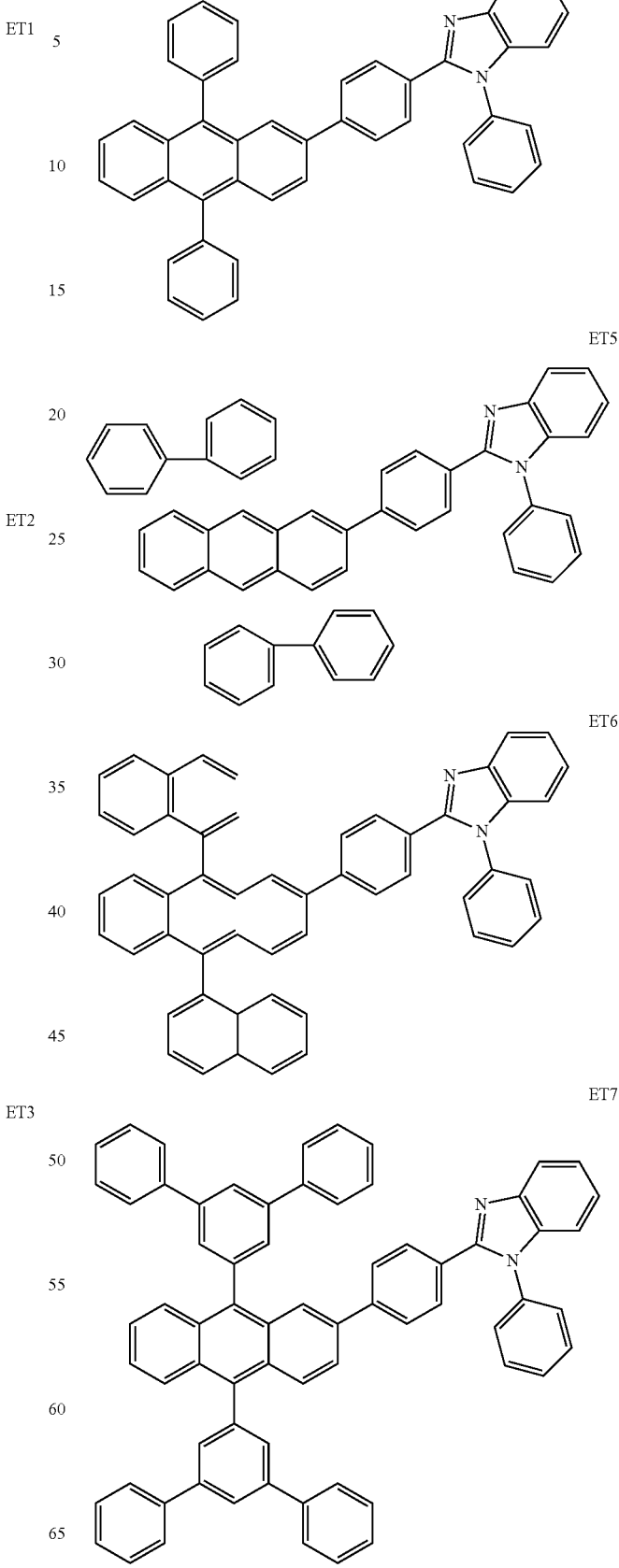

-continued
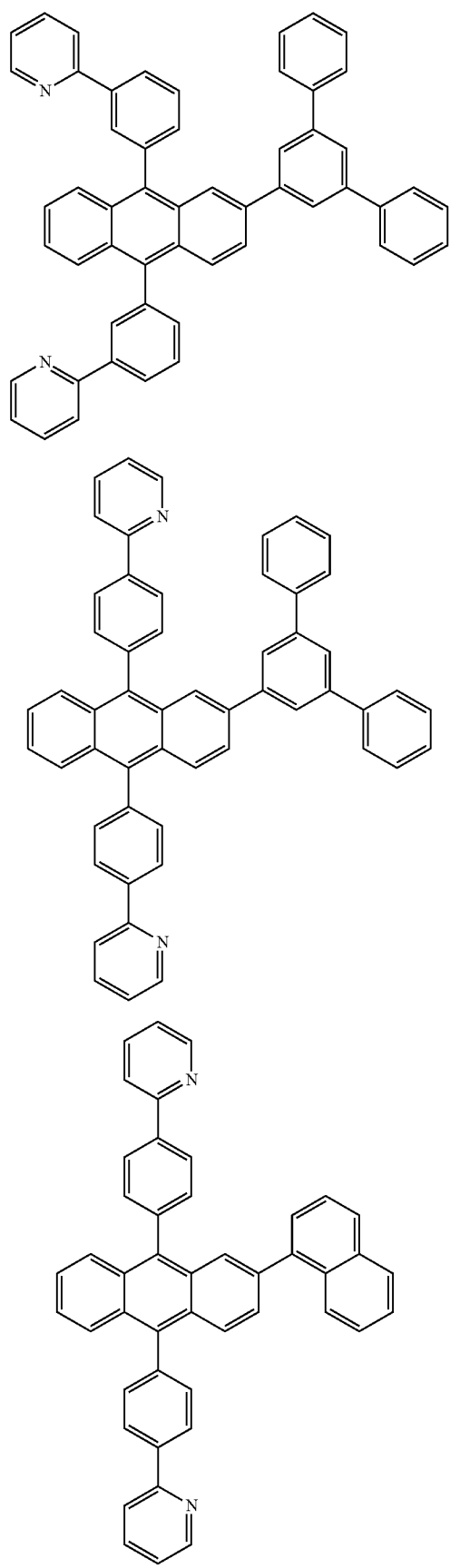
ET8
ET9
ET10
-continued
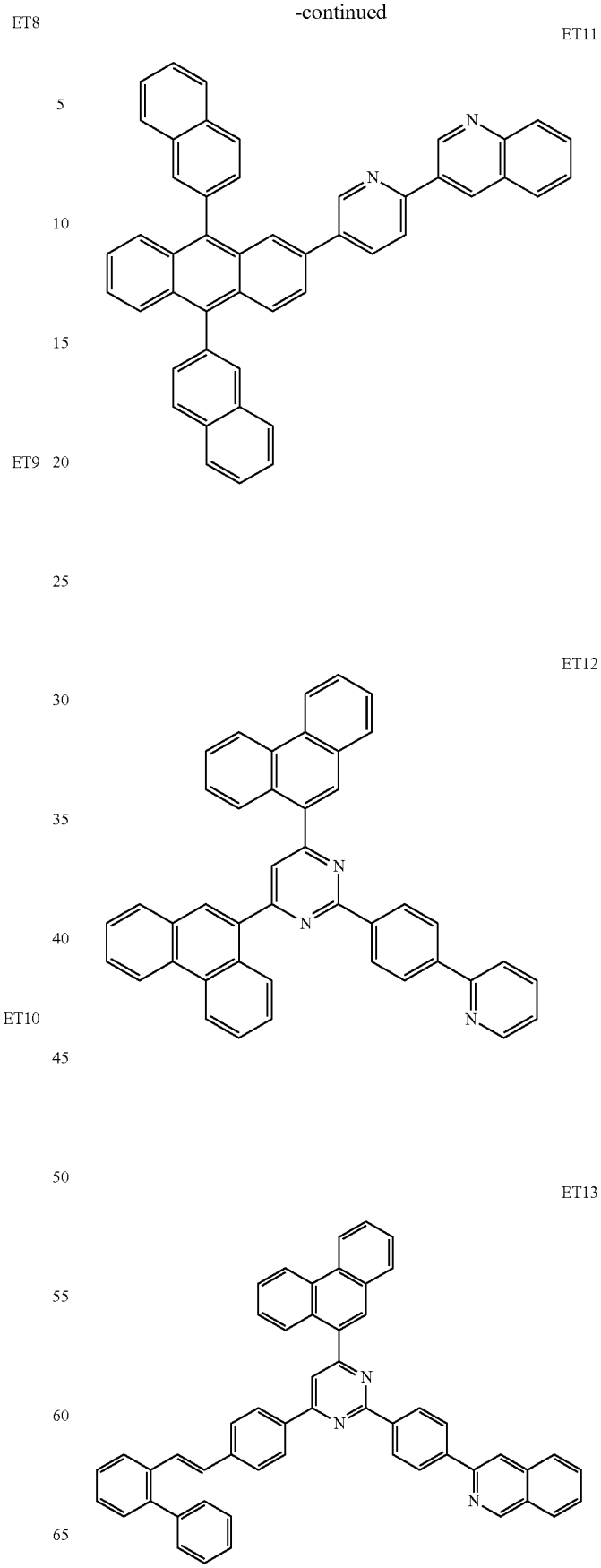
ET11
ET12
ET13

ET14

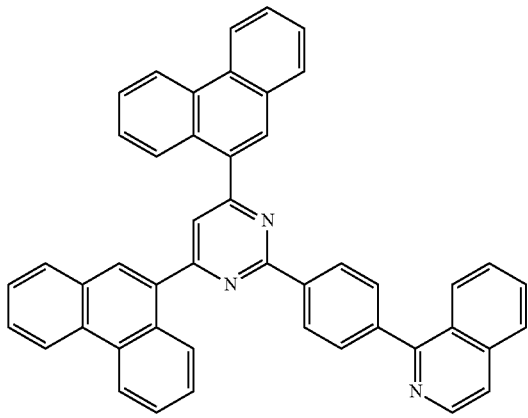

ET15

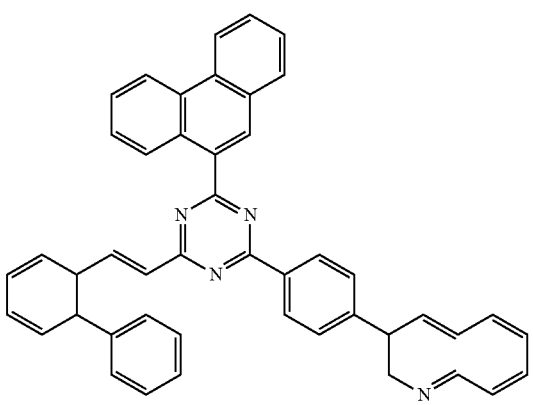

A thickness of the electron transport layer may be in a range of about 100 Å to about 1,000 Å, e.g., about 150 Å to about 500 Å. When the thickness of the electron transport layer is within the range described above, the electron transport layer may have satisfactory electron transport characteristics without a substantial increase in driving voltage.

In an implementation, the electron transport layer may further include, in addition to the materials described above, a metal-containing material.

The metal-containing material may include a Li complex. The Li complex may include, e.g., Compound ET-D1 (lithium quinolate, LiQ) or ET-D2.

ET-D1

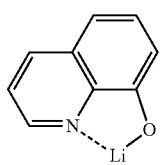

ET-D2

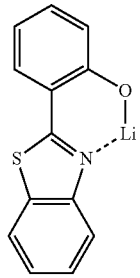

The electron transport region 180 may include an electron injection layer that allows electrons to be easily provided from the second electrode 190.

The electron injection layer may be formed on the electron transport layer by using various methods, such as vacuum deposition, spin coating casting, a LB method, ink-jet printing, laser-printing, or laser-induced thermal imaging. When an electron injection layer is formed by vacuum deposition or spin coating, deposition and coating conditions for the electron injection layer may be determined by referring to the deposition and coating conditions for the hole injection layer.

The electron injection layer may include at least one selected from, LiF, NaCl, CsF, $Li_2O$, BaO, and LiQ.

A thickness of the electron injection layer may be in a range of about 1 Å to about 100 Å, e.g., about 3 Å to about 90 Å. When the thickness of the electron injection layer is within the range described above, the electron injection layer may have satisfactory electron injection characteristics without a substantial increase in driving voltage.

The second electrode 190 may be disposed on the organic layer 150 having such a structure. The second electrode 190 may be a cathode, which is an electron injection electrode, and in this regard, a material for the second electrode 190 may include a metal, an alloy, an electrically conductive compound, and a mixture thereof, which have a relatively low work function. Detailed examples of the second electrode 190 may include lithium (Li), magnesium (Mg), aluminum (Al), aluminum-lithium (Al—Li), calcium (Ca), magnesium-indium (Mg—In), or magnesium-silver (Mg—Ag). According to another embodiment, the material for forming the second electrode 190 may include ITO or IZO. The second electrode 190 may be a reflective electrode, a semi-transmissive electrode, or a transmissive electrode.

Hereinbefore, the organic light-emitting device has been described with reference to FIG. 1, but is not limited thereto.

A $C_1$-$C_{60}$ alkyl group used herein refers to a linear or branched aliphatic hydrocarbon monovalent group having 1 to 60 carbon atoms, and detailed examples thereof are a methyl group, an ethyl group, a propyl group, an isobutyl group, a sec-butyl group, a ter-butyl group, a pentyl group, an iso-amyl group, and a hexyl group. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —$OA_{101}$ (wherein $A_{101}$ is the $C_1$-$C_{60}$ alkyl group), and detailed examples thereof are a methoxy group, an ethoxy group, and an isopropyloxy group.

A $C_2$-$C_{60}$ alkenyl group used herein refers to a hydrocarbon group formed by substituting at least one carbon double bond in the middle or terminal of the $C_2$-$C_{60}$ alkyl group, and detailed examples thereof are an ethenyl group, a prophenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group formed by substituting at least one carbon triple bond in the middle or terminal of the $C_2$-$C_{60}$ alkyl group, and detailed examples thereof are an ethynyl group, and a propynyl group. A $C_2$-$C_{60}$ alkynylene group used herein refers to a divalent group having the same structure as the $C_2$-$C_{60}$ alkynyl group.

A $C_3$-$C_{10}$ cycloalkyl group used herein refers to a monovalent hydrocarbon monocyclic group having 3 to 10 carbon atoms, and detailed examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_2$-$C_{10}$ heterocycloalkyl group used herein refers to a monovalent monocyclic group having at least one hetero atom selected from N, O, P, and S as a ring-forming atom and 2 to 10 carbon atoms, and detailed examples thereof are a tetrahydrofuranyl group, and a tetrahydrothiophenyl group. A $C_2$-$C_{10}$ heterocycloalkylene group used herein refers to a divalent group having the same structure as the $C_2$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromacity, and detailed examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_2$-$C_{10}$ heterocycloalkenyl group used herein refers to a monovalent monocyclic group that has at least one hetero atom selected from N, O, P, and S as a ring-forming atom, 2 to 10 carbon atoms, and at least one double bond in its ring. Detailed examples of the $C_2$-$C_{10}$ heterocycloalkenyl group are a 2,3-hydrofuranyl group and a 2,3-hydrothiophenyl group. A $C_2$-$C_{10}$ heterocycloalkenylene group used herein refers to a divalent group having the same structure as the $C_2$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_2$-$C_{60}$ heteroaryl group used herein refers to a monovalent group having a carboncyclic aromatic system that has at least one hetero atom selected from N, O, P, and S as a ring-forming atom, and 2 to 60 carbon atoms. A $C_2$-$C_{60}$ heteroarylene group used herein refers to a divalent group having a carbocyclic aromatic system that has at least one hetero atom selected from N, O, P, and S as a ring-forming atom, and 2 to 60 carbon atoms. Examples of the $C_2$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group each include two or more rings, the rings may be fused to each other.

A $C_6$-$C_{60}$ aryloxy group used herein indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

A monovalent non-aromatic condensed polycyclic group used herein refers to a monovalent group that has two or more rings condensed to each other, only carbon atoms (for example, the number of carbon atoms may be in a range of 8 to 60) as a ring forming atom, and non-aromacity in the entire molecular structure. An example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group that has two or more rings condensed to each other, has a heteroatom selected from N, O P, and S, other than carbon atoms (for example, the number of carbon atoms may be in a range of 2 to 60), as a ring forming atom, and has non-aromacity in the entire molecular structure. An example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

The term "Ph" used herein refers to phenyl group, the term "Me" used herein refers to methyl group, the term "Et" used herein refers to ethyl group, and the term "ter-Bu" or "But" used herein refers to tert-butyl.

Hereinafter, an organic light-emitting device according to an embodiment will be described in detail with reference to Synthesis Examples and Examples. The wording "B was used instead of A" used in describing Synthesis Examples means that a molar equivalent of A was identical to a molar equivalent of B.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

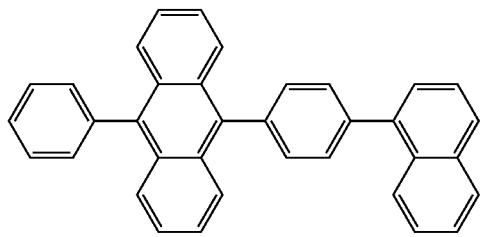

101 A
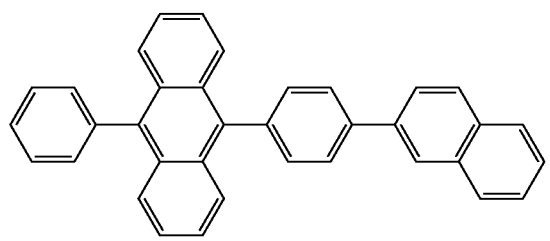
107 A
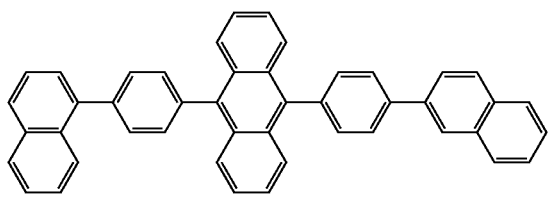
102 A
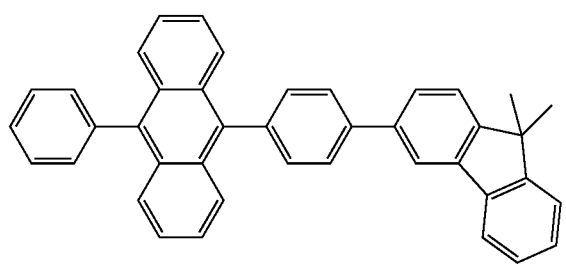
108 A
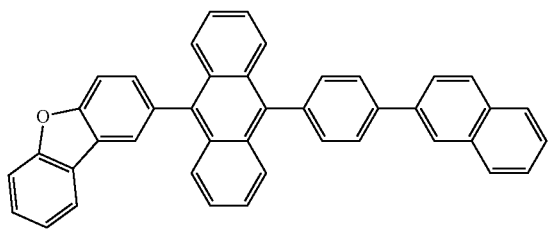
103 A
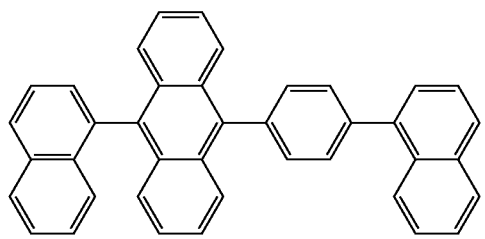
109 A
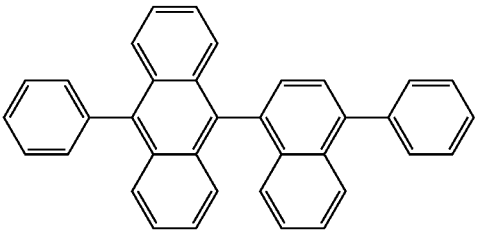
104 A
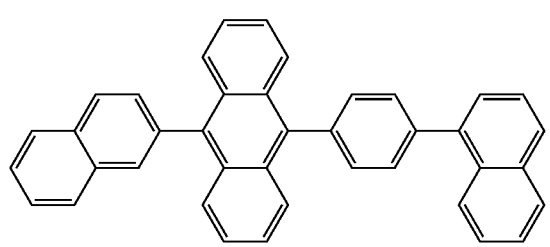
110 A
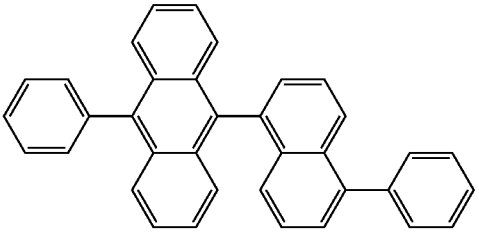
105 A
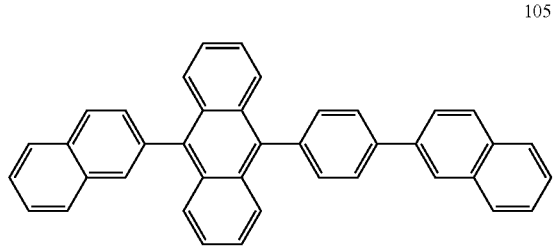
111 A
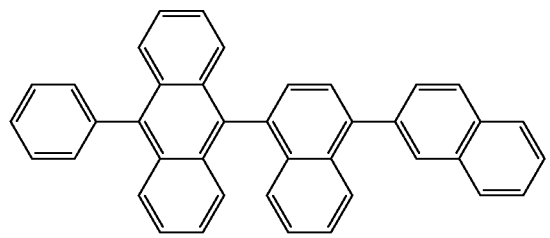
106 A
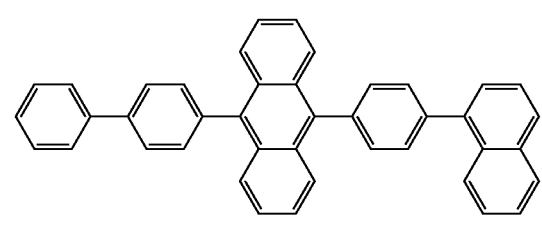
112 A
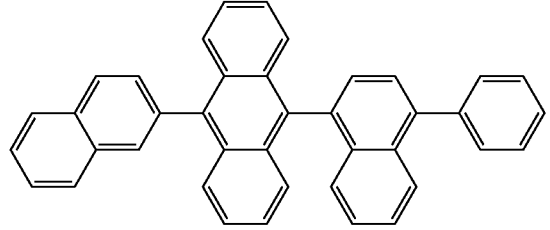

113 A

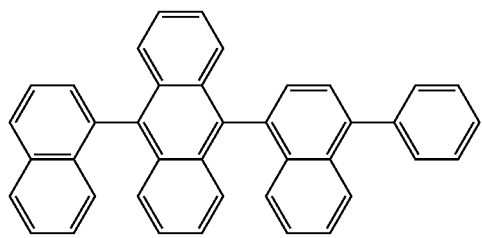

114 A

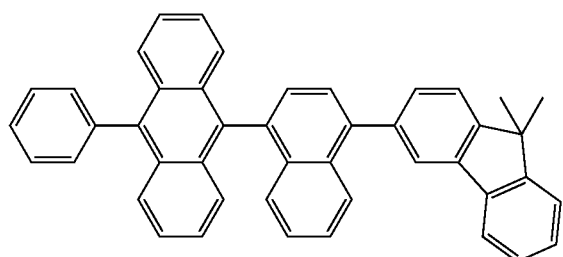

115 A

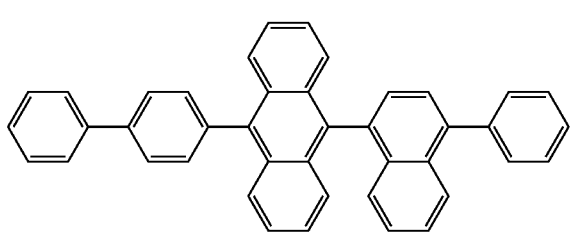

200 B

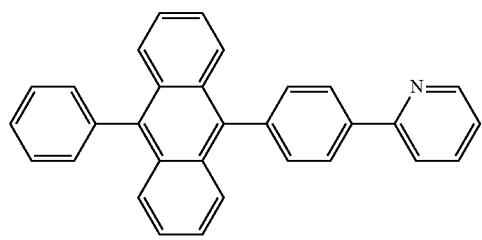

201 B

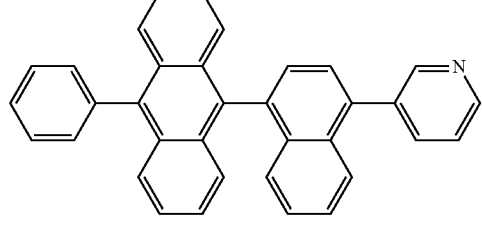

202 B

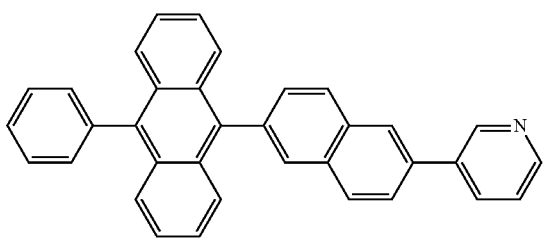

203 B

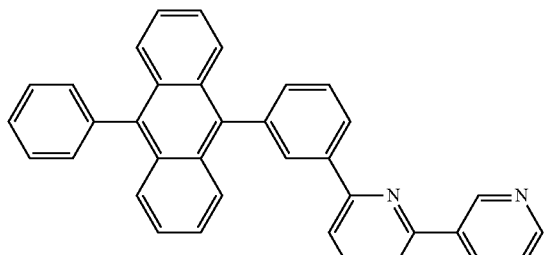

204 B

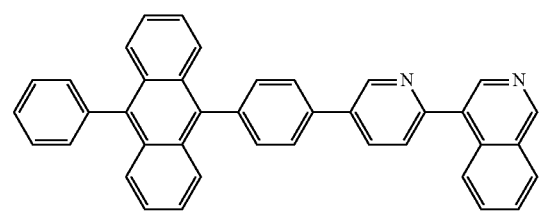

205 B

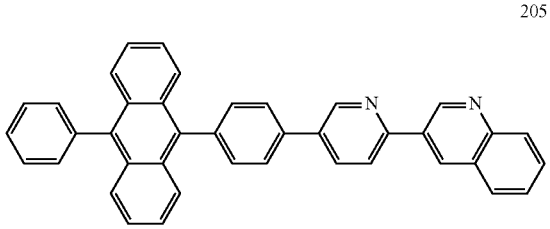

206 B

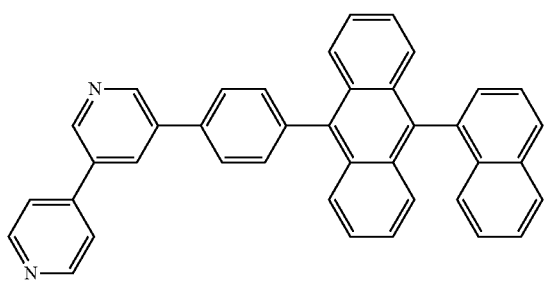

207 B

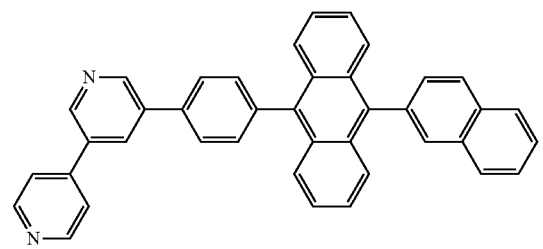

EXAMPLE 1

An anode was prepared by cutting a Corning 15 Ωcm² (1,200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes thereto and exposing to ozone to clean. Then, the anode was loaded into a vacuum deposition apparatus.

Compound HT13 was vacuum deposited on the substrate to form a hole injection layer having a thickness of 500 Å. Then, compound HT3, which is a hole transportable compound, was vacuum deposited thereon to form a hole transport layer having a thickness of 450 Å. Then, Compound 100A and FD1 were co-deposited at a ratio of 95:5 to form an emission layer having a thickness of 300 Å.

Then, Compound 200B was deposited on the emission layer to form an electron transport layer having a thickness of 250 Å. Then, LiF, which is a halogenated alkali metal, was deposited on the electron transport layer to form an electron injection layer having a thickness of 10 Å. Al was vacuum deposited thereon to a thickness of 1500 Å (cathode), thereby completing the manufacturing of an organic light-emitting device.

EXAMPLE 2

An organic light-emitting device was manufactured in the same manner as in Example 1, except that in forming an electron transport layer, Compound 201B was used instead of Compound 200B.

EXAMPLE 3

An organic light-emitting device was manufactured in the same manner as in Example 1, except that in forming an electron transport layer, Compound 202B was used instead of Compound 200B.

EXAMPLE 4

An organic light-emitting device was manufactured in the same manner as in Example 1, except that in forming an electron transport layer, Compound 203B was used instead of Compound 200B.

EXAMPLE 5

An organic light-emitting device was manufactured in the same manner as in Example 1, except that in forming an electron transport layer, Compound 204B was used instead of Compound 200B.

EXAMPLE 6

An organic light-emitting device was manufactured in the same manner as in Example 1, except that in forming an electron transport layer, Compound 205B was used instead of Compound 200B.

EXAMPLE 7

An organic light-emitting device was manufactured in the same manner as in Example 1, except that in forming an electron transport layer, Compound 206B was used instead of Compound 200B.

EXAMPLE 8

An organic light-emitting device was manufactured in the same manner as in Example 1, except that in forming an electron transport layer, Compound 207B was used instead of Compound 200B.

EXAMPLE 9

An organic light-emitting device was manufactured in the same manner as in Example 1, except that in forming an emission layer, Compound 101A was used instead of Compound 100A, and in forming an electron transport layer, Compound 201B was used instead of Compound 200B.

EXAMPLE 10

An organic light-emitting device was manufactured in the same manner as in Example 1, except that in forming an emission layer, Compound 102A was used instead of Compound 100A, and in forming an electron transport layer, Compound 201B was used instead of Compound 200B.

EXAMPLE 11

An organic light-emitting device was manufactured in the same manner as in Example 1, except that in forming an emission layer, Compound 103A was used instead of Compound 100A, and in forming an electron transport layer, Compound 201B was used instead of Compound 200B.

EXAMPLE 12

An organic light-emitting device was manufactured in the same manner as in Example 1, except that in forming an emission layer, Compound 104A was used instead of Compound 100A, and in forming an electron transport layer, Compound 201B was used instead of Compound 200B.

EXAMPLE 13

An organic light-emitting device was manufactured in the same manner as in Example 1, except that in forming an emission layer, Compound 105A was used instead of Compound 100A, and in forming an electron transport layer, Compound 201B was used instead of Compound 200B.

EXAMPLE 14

An organic light-emitting device was manufactured in the same manner as in Example 1, except that in forming an emission layer, Compound 106A was used instead of Compound 100A, and in forming an electron transport layer, Compound 201B was used instead of Compound 200B.

EXAMPLE 15

An organic light-emitting device was manufactured in the same manner as in Example 1, except that in forming an emission layer, Compound 107A was used instead of Compound 100A, and in forming an electron transport layer, Compound 201B was used instead of Compound 200B.

EXAMPLE 16

An organic light-emitting device was manufactured in the same manner as in Example 1, except that in forming an emission layer, Compound 108A was used instead of Compound 100A, and in forming an electron transport layer, Compound 201B was used instead of Compound 200B.

EXAMPLE 17

An organic light-emitting device was manufactured in the same manner as in Example 1, except that in forming an emission layer, Compound 109A was used instead of Compound 100A.

EXAMPLE 18

An organic light-emitting device was manufactured in the same manner as in Example 1, except that in forming an emission layer, Compound 109A was used instead of Compound 100A, and in forming an electron transport layer, Compound 201B was used instead of Compound 200B.

EXAMPLE 19

An organic light-emitting device was manufactured in the same manner as in Example 1, except that in forming an emission layer, Compound 109A was used instead of Compound 100A, and in forming an electron transport layer, Compound 202B was used instead of Compound 200B.

EXAMPLE 20

An organic light-emitting device was manufactured in the same manner as in Example 1, except that in forming an emission layer, Compound 109A was used instead of Compound 100A, and in forming an electron transport layer, Compound 203B was used instead of Compound 200B.

EXAMPLE 21

An organic light-emitting device was manufactured in the same manner as in Example 1, except that in forming an emission layer, Compound 109A was used instead of Compound 100A, and in forming an electron transport layer, Compound 204B was used instead of Compound 200B.

EXAMPLE 22

An organic light-emitting device was manufactured in the same manner as in Example 1, except that in forming an emission layer, Compound 109A was used instead of Compound 100A, and in forming an electron transport layer, Compound 205B was used instead of Compound 200B.

EXAMPLE 23

An organic light-emitting device was manufactured in the same manner as in Example 1, except that in forming an emission layer, Compound 109A was used instead of Compound 100A, and in forming an electron transport layer, Compound 206B was used instead of Compound 200B.

EXAMPLE 24

An organic light-emitting device was manufactured in the same manner as in Example 1, except that in forming an emission layer, Compound 109A was used instead of Compound 100A, and in forming an electron transport layer, Compound 207B was used instead of Compound 200B.

EXAMPLE 25

An organic light-emitting device was manufactured in the same manner as in Example 1, except that in forming an emission layer, Compound 110A was used instead of Compound 100A, and in forming an electron transport layer, Compound 201B was used instead of Compound 200B.

EXAMPLE 26

An organic light-emitting device was manufactured in the same manner as in Example 1, except that in forming an emission layer, Compound 111A was used instead of Compound 100A, and in forming an electron transport layer, Compound 201B was used instead of Compound 200B.

EXAMPLE 27

An organic light-emitting device was manufactured in the same manner as in Example 1, except that in forming an emission layer, Compound 112A was used instead of Compound 100A, and in forming an electron transport layer, Compound 201B was used instead of Compound 200B.

EXAMPLE 28

An organic light-emitting device was manufactured in the same manner as in Example 1, except that in forming an emission layer, Compound 113A was used instead of Compound 100A, and in forming an electron transport layer, Compound 201B was used instead of Compound 200B.

EXAMPLE 29

An organic light-emitting device was manufactured in the same manner as in Example 1, except that in forming an emission layer, Compound 114A was used instead of Compound 100A, and in forming an electron transport layer, Compound 201B was used instead of Compound 200B.

EXAMPLE 30

An organic light-emitting device was manufactured in the same manner as in Example 1, except that in forming an emission layer, Compound 115A was used instead of Compound 100A, and in forming an electron transport layer, Compound 201B was used instead of Compound 200B.

COMPARATIVE EXAMPLE 1

An organic light-emitting device was manufactured in the same manner as in Example 1, except that in forming an emission layer, Compound H1, below, was used instead of Compound 100A, and in forming an electron transport layer, Compound 201B was used instead of Compound 200B.

<Compound H1>

COMPARATIVE EXAMPLE 2

An organic light-emitting device was manufactured in the same manner as in Example 1, except that in forming an emission layer, Compound H2, below, was used instead of Compound 100A, and in forming an electron transport layer, Compound 201B was used instead of Compound 200B.

<Compound H2>

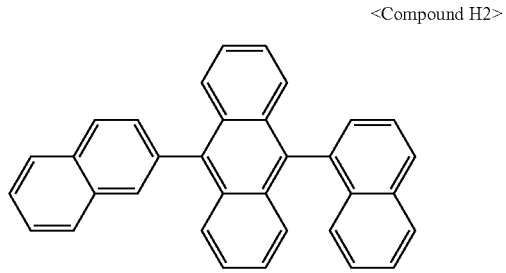 [SMILES: c1ccc2cc(-c3c4ccccc4c(-c4cccc5ccccc45)c4ccccc34)ccc2c1]

COMPARATIVE EXAMPLE 3

An organic light-emitting device was manufactured in the same manner as in Example 1, except that in forming an electron transport layer, Compound E1, below, was used instead of Compound 200B.

<Compound E1>

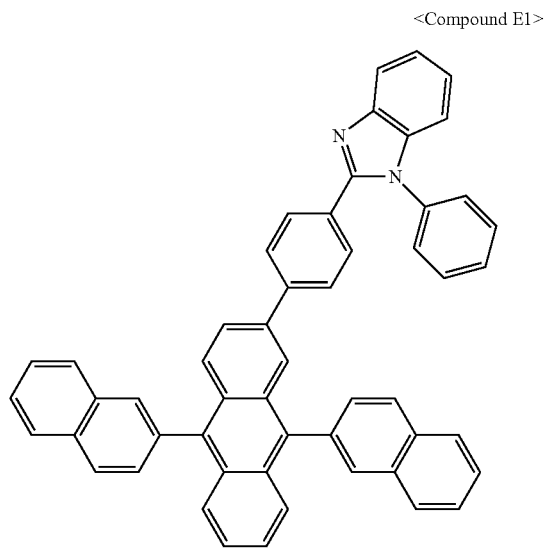 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

COMPARATIVE EXAMPLE 4

An organic light-emitting device was manufactured in the same manner as in Example 1, except that in forming an electron transport layer, Compound E2, below, was used instead of Compound 200B.

<Compound E2>

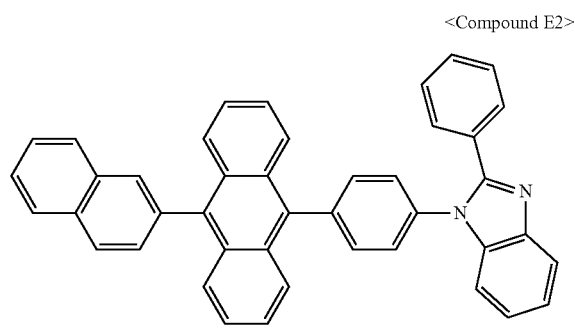 [SMILES: c1ccc(-c2nc3ccccc3n2-c2ccc(-c3c4ccccc4c(-c4ccc5ccccc5c4)c4ccccc34)cc2)cc1]

COMPARATIVE EXAMPLE 5

An organic light-emitting device was manufactured in the same manner as in Example 1, except that in forming an emission layer, Compound 109A, below, was used instead of Compound 100A, and in forming an electron transport layer, Compound E1 was used instead of Compound 200B.

COMPARATIVE EXAMPLE 6

An organic light-emitting device was manufactured in the same manner as in Example 1, except that in forming an emission layer, Compound 109A, below, was used instead of Compound 100A, and in forming an electron transport layer, Compound E2 was used instead of Compound 200B.

COMPARATIVE EXAMPLE 7

An organic light-emitting device was manufactured in the same manner as in Example 1, except that in forming an emission layer, Compound H3, below, was used instead of Compound 100A, and in forming an electron transport layer, Compound E3 was used instead of Compound 200B.

<Compound H3>

<Compound E3>

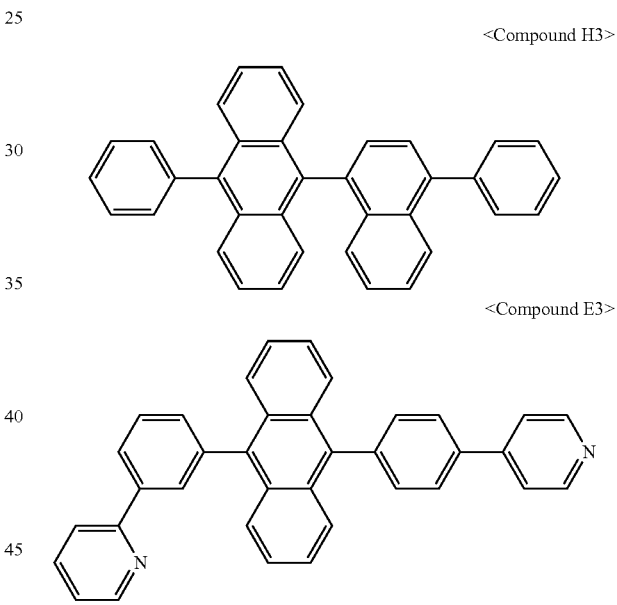

EXAMPLE 31

An anode was prepared by cutting a Corning 15 Ωcm² (1,200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes thereto and exposing to ozone to clean. Then, the anode was loaded into a vacuum deposition apparatus.

Compound HT13 was vacuum deposited on the substrate to form a hole injection layer having a thickness of 500 Å. Then, compound HT3, which is a hole transportable compound, was vacuum deposited thereon to form a hole transport layer having a thickness of 450 Å. Then, Compound 100A and FD1 were co-deposited at a ratio of 95:5 to form an emission layer having a thickness of 300 Å.

Then, Compound 200B and Liq were deposited at a weight ratio of 50:50 on the emission layer to form an electron transport layer having a thickness of 250 Å, and then, LiF, which is a halogenated alkali metal, was deposited on the electron transport layer to form an electron injection layer having a thickness of 10 Å, and Al was vacuum deposited thereon to a thickness of 1,500 Å (cathode), thereby completing the manufacturing of an organic light-emitting device.

EXAMPLE 32

An organic light-emitting device was manufactured in the same manner as in Example 31, except that in forming an electron transport layer, Compound 201B was used instead of Compound 200B.

EXAMPLE 33

An organic light-emitting device was manufactured in the same manner as in Example 31, except that in forming an electron transport layer, Compound 202B was used instead of Compound 200B.

EXAMPLE 34

An organic light-emitting device was manufactured in the same manner as in Example 31, except that in forming an electron transport layer, Compound 203B was used instead of Compound 200B.

EXAMPLE 35

An organic light-emitting device was manufactured in the same manner as in Example 31, except that in forming an electron transport layer, Compound 204B was used instead of Compound 200B.

EXAMPLE 36

An organic light-emitting device was manufactured in the same manner as in Example 31, except that in forming an electron transport layer, Compound 205B was used instead of Compound 200B.

EXAMPLE 37

An organic light-emitting device was manufactured in the same manner as in Example 31, except that in forming an electron transport layer, Compound 206B was used instead of Compound 200B.

EXAMPLE 38

An organic light-emitting device was manufactured in the same manner as in Example 31, except that in forming an electron transport layer, Compound 207B was used instead of Compound 200B.

EXAMPLE 39

An organic light-emitting device was manufactured in the same manner as in Example 31, except that in forming an emission layer, Compound 109A was used instead of Compound 100A.

EXAMPLE 40

An organic light-emitting device was manufactured in the same manner as in Example 31, except that in forming an emission layer, Compound 109A was used instead of Compound 100A, and in forming an electron transport layer, Compound 201B was used instead of Compound 200B.

EXAMPLE 41

An organic light-emitting device was manufactured in the same manner as in Example 31, except that in forming an emission layer, Compound 109A was used instead of Compound 100A, and in forming an electron transport layer, Compound 202B was used instead of Compound 200B.

EXAMPLE 42

An organic light-emitting device was manufactured in the same manner as in Example 31, except that in forming an emission layer, Compound 109A was used instead of Compound 100A, and in forming an electron transport layer, Compound 203B was used instead of Compound 200B.

EXAMPLE 43

An organic light-emitting device was manufactured in the same manner as in Example 31, except that in forming an emission layer, Compound 109A was used instead of Compound 100A, and in forming an electron transport layer, Compound 204B was used instead of Compound 200B.

EXAMPLE 44

An organic light-emitting device was manufactured in the same manner as in Example 31, except that in forming an emission layer, Compound 109A was used instead of Compound 100A, and in forming an electron transport layer, Compound 205B was used instead of Compound 200B.

EXAMPLE 45

An organic light-emitting device was manufactured in the same manner as in Example 31, except that in forming an emission layer, Compound 109A was used instead of Compound 100A, and in forming an electron transport layer, Compound 206B was used instead of Compound 200B.

EXAMPLE 46

An organic light-emitting device was manufactured in the same manner as in Example 31, except that in forming an emission layer, Compound 109A was used instead of Compound 100A, and in forming an electron transport layer, Compound 207B was used instead of Compound 200B.

COMPARATIVE EXAMPLE 8

An organic light-emitting device was manufactured in the same manner as in Example 31, except that in forming an emission layer, Compound H1, below, was used instead of Compound 100A, and in forming an electron transport layer, Compound 201B was used instead of Compound 200B.

<Compound H1>

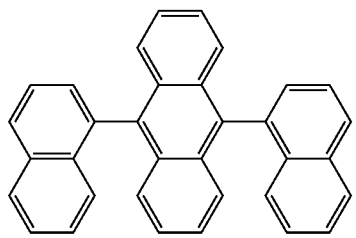

COMPARATIVE EXAMPLE 9

An organic light-emitting device was manufactured in the same manner as in Example 31, except that in forming an emission layer, Compound H2, below, was used instead of Compound 100A, and in forming an electron transport layer, Compound 201B was used instead of Compound 200B.

<Compound H2>

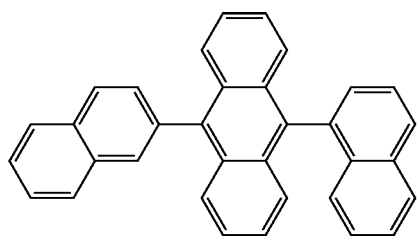

COMPARATIVE EXAMPLE 10

An organic light-emitting device was manufactured in the same manner as in Example 31, except that in forming an electron transport layer, Compound E1, below, was used instead of Compound 200B.

<Compound E1>

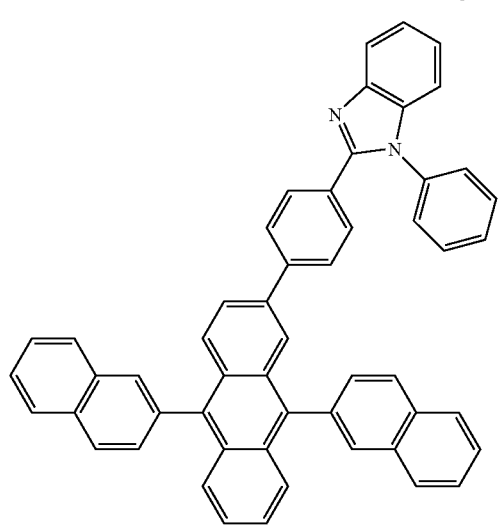

COMPARATIVE EXAMPLE 11

An organic light-emitting device was manufactured in the same manner as in Example 31, except that in forming an electron transport layer, Compound E2, below, was used instead of Compound 200B.

<Compound E2>

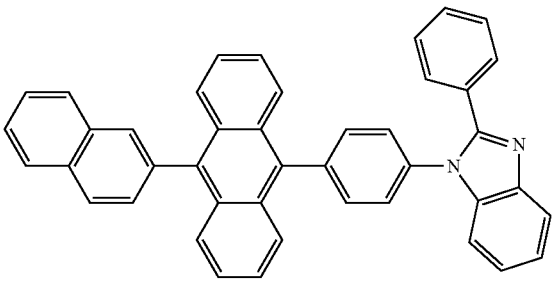

COMPARATIVE EXAMPLE 12

An organic light-emitting device was manufactured in the same manner as in Example 31, except that in forming an emission layer, Compound 109A was used instead of Compound 100A, and in forming an electron transport layer, Compound E1 was used instead of Compound 200B.

COMPARATIVE EXAMPLE 13

An organic light-emitting device was manufactured in the same manner as in Example 31, except that in forming an emission layer, Compound 109A was used instead of Compound 100A, and in forming an electron transport layer, Compound E2 was used instead of Compound 200B.

COMPARATIVE EXAMPLE 14

An organic light-emitting device was manufactured in the same manner as in Example 31, except that in forming an emission layer, Compound H3, below, was used instead of Compound 100A, and in forming an electron transport layer, Compound E3 was used instead of Compound 200B.

<Compound H3>

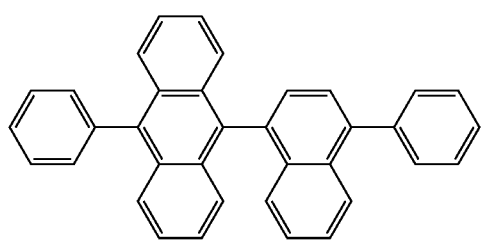

<Compound E3>

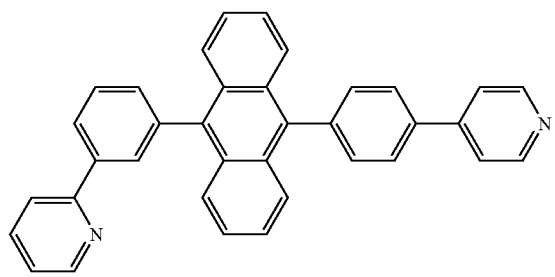

EXAMPLE 47

An anode was prepared by cutting a Corning 15 Ωcm² (1,200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes thereto and exposing to ozone to clean. Then, the anode was loaded into a vacuum deposition apparatus.

Compound HT13 was vacuum deposited on the substrate to form a hole injection layer having a thickness of 500 Å. Then, compound HT3, which is a hole transportable compound, was vacuum deposited thereon to form a hole transport layer having a thickness of 450 Å. Then, Compound 100A and FD1 were co-deposited at a ratio of 95:5 to form an emission layer having a thickness of 300 Å.

Then, Compound 200B was deposited on the emission layer to form a buffer layer having a thickness of 100 Å. Then, BPhen and Liq were deposited at a weight ratio of 50:50 on the buffer layer to form an electron transport layer having a thickness of 150 Å. Then, LiF, which is a halogenated alkali metal, was deposited on the electron transport layer to form an electron injection layer having a thickness of 10 Å. Al was vacuum deposited thereon to a thickness of 1500 Å (cathode), thereby completing the manufacturing of an organic light-emitting device.

EXAMPLE 48

An organic light-emitting device was manufactured in the same manner as in Example 47, except that in forming an electron transport layer, Compound 201B was used instead of Compound 200B.

EXAMPLE 49

An organic light-emitting device was manufactured in the same manner as in Example 47, except that in forming an electron transport layer, Compound 202B was used instead of Compound 200B.

EXAMPLE 50

An organic light-emitting device was manufactured in the same manner as in Example 47, except that in forming an electron transport layer, Compound 203B was used instead of Compound 200B.

EXAMPLE 51

An organic light-emitting device was manufactured in the same manner as in Example 47, except that in forming an electron transport layer, Compound 204B was used instead of Compound 200B.

EXAMPLE 52

An organic light-emitting device was manufactured in the same manner as in Example 47, except that in forming an electron transport layer, Compound 205B was used instead of Compound 200B.

EXAMPLE 53

An organic light-emitting device was manufactured in the same manner as in Example 47, except that in forming an electron transport layer, Compound 206B was used instead of Compound 200B.

EXAMPLE 54

An organic light-emitting device was manufactured in the same manner as in Example 47, except that in forming an electron transport layer, Compound 207B was used instead of Compound 200B.

EXAMPLE 55

An organic light-emitting device was manufactured in the same manner as in Example 47, except that in forming an emission layer, Compound 101A was used instead of Compound 100A, and in forming an electron transport layer, Compound 201B was used instead of Compound 200B.

EXAMPLE 56

An organic light-emitting device was manufactured in the same manner as in Example 47, except that in forming an emission layer, Compound 102A was used instead of Compound 100A, and in forming an electron transport layer, Compound 201B was used instead of Compound 200B.

EXAMPLE 57

An organic light-emitting device was manufactured in the same manner as in Example 47, except that in forming an emission layer, Compound 103A was used instead of Compound 100A, and in forming an electron transport layer, Compound 201B was used instead of Compound 200B.

EXAMPLE 58

An organic light-emitting device was manufactured in the same manner as in Example 47, except that in forming an emission layer, Compound 104A was used instead of Compound 100A, and in forming an electron transport layer, Compound 201B was used instead of Compound 200B.

EXAMPLE 59

An organic light-emitting device was manufactured in the same manner as in Example 47, except that in forming an emission layer, Compound 105A was used instead of Compound 100A, and in forming an electron transport layer, Compound 201B was used instead of Compound 200B.

EXAMPLE 60

An organic light-emitting device was manufactured in the same manner as in Example 47, except that in forming an emission layer, Compound 106A was used instead of Compound 100A, and in forming an electron transport layer, Compound 201B was used instead of Compound 200B.

EXAMPLE 61

An organic light-emitting device was manufactured in the same manner as in Example 47, except that in forming an emission layer, Compound 107A was used instead of Compound 100A, and in forming an electron transport layer, Compound 201B was used instead of Compound 200B.

EXAMPLE 62

An organic light-emitting device was manufactured in the same manner as in Example 47, except that in forming an emission layer, Compound 108A was used instead of Compound 100A, and in forming an electron transport layer, Compound 201B was used instead of Compound 200B.

EXAMPLE 63

An organic light-emitting device was manufactured in the same manner as in Example 47, except that in forming an emission layer, Compound 109A was used instead of Compound 100A.

EXAMPLE 64

An organic light-emitting device was manufactured in the same manner as in Example 47, except that in forming an emission layer, Compound 109A was used instead of Compound 100A, and in forming an electron transport layer, Compound 201B was used instead of Compound 200B.

EXAMPLE 65

An organic light-emitting device was manufactured in the same manner as in Example 47, except that in forming an emission layer, Compound 109A was used instead of Compound 100A, and in forming an electron transport layer, Compound 202B was used instead of Compound 200B.

EXAMPLE 66

An organic light-emitting device was manufactured in the same manner as in Example 47, except that in forming an emission layer, Compound 109A was used instead of Compound 100A, and in forming an electron transport layer, Compound 203B was used instead of Compound 200B.

EXAMPLE 67

An organic light-emitting device was manufactured in the same manner as in Example 47, except that in forming an emission layer, Compound 109A was used instead of Compound 100A, and in forming an electron transport layer, Compound 204B was used instead of Compound 200B.

EXAMPLE 68

An organic light-emitting device was manufactured in the same manner as in Example 47, except that in forming an emission layer, Compound 109A was used instead of Compound 100A, and in forming an electron transport layer, Compound 205B was used instead of Compound 200B.

EXAMPLE 69

An organic light-emitting device was manufactured in the same manner as in Example 47, except that in forming an emission layer, Compound 109A was used instead of Compound 100A, and in forming an electron transport layer, Compound 206B was used instead of Compound 200B.

EXAMPLE 70

An organic light-emitting device was manufactured in the same manner as in Example 47, except that in forming an emission layer, Compound 109A was used instead of Compound 100A, and in forming an electron transport layer, Compound 207B was used instead of Compound 200B.

EXAMPLE 71

An organic light-emitting device was manufactured in the same manner as in Example 47, except that in forming an emission layer, Compound 110A was used instead of Compound 100A, and in forming an electron transport layer, Compound 201B was used instead of Compound 200B.

EXAMPLE 72

An organic light-emitting device was manufactured in the same manner as in Example 47, except that in forming an emission layer, Compound 111A was used instead of Compound 100A, and in forming an electron transport layer, Compound 201B was used instead of Compound 200B.

EXAMPLE 73

An organic light-emitting device was manufactured in the same manner as in Example 47, except that in forming an emission layer, Compound 112A was used instead of Compound 100A, and in forming an electron transport layer, Compound 201B was used instead of Compound 200B.

EXAMPLE 74

An organic light-emitting device was manufactured in the same manner as in Example 47, except that in forming an emission layer, Compound 113A was used instead of Compound 100A, and in forming an electron transport layer, Compound 201B was used instead of Compound 200B.

EXAMPLE 75

An organic light-emitting device was manufactured in the same manner as in Example 47, except that in forming an emission layer, Compound 114A was used instead of Compound 100A, and in forming an electron transport layer, Compound 201B was used instead of Compound 200B.

EXAMPLE 76

An organic light-emitting device was manufactured in the same manner as in Example 47, except that in forming an emission layer, Compound 115A was used instead of Compound 100A, and in forming an electron transport layer, Compound 201B was used instead of Compound 200B.

COMPARATIVE EXAMPLE 15

An organic light-emitting device was manufactured in the same manner as in Example 47, except that in forming an emission layer, Compound H1, below, was used instead of Compound 100A, and in forming an electron transport layer, Compound 201B was used instead of Compound 200B.

<Compound H1>

COMPARATIVE EXAMPLE 16

An organic light-emitting device was manufactured in the same manner as in Example 47, except that in forming an emission layer, Compound H2, below, was used instead of Compound 100A, and in forming an electron transport layer, Compound 201B was used instead of Compound 200B.

<Compound H2>

COMPARATIVE EXAMPLE 17

An organic light-emitting device was manufactured in the same manner as in Example 47, except that in forming an electron transport layer, Compound E1, below, was used instead of Compound 200B.

<Compound E1>

COMPARATIVE EXAMPLE 18

An organic light-emitting device was manufactured in the same manner as in Example 47, except that in forming an electron transport layer, Compound E2, below, was used instead of Compound 200B.

<Compound E2>

COMPARATIVE EXAMPLE 19

An organic light-emitting device was manufactured in the same manner as in Example 47, except that in forming an emission layer, Compound 109A was used instead of Compound 100A, and in forming an electron transport layer, Compound E1 was used instead of Compound 200B.

COMPARATIVE EXAMPLE 20

An organic light-emitting device was manufactured in the same manner as in Example 47, except that in forming an emission layer, Compound 109A was used instead of Compound 100A, and in forming an electron transport layer, Compound E2 was used instead of Compound 200B.

COMPARATIVE EXAMPLE 21

An organic light-emitting device was manufactured in the same manner as in Example 47, except that in forming an emission layer, Compound H3, below, was used instead of Compound 100A, and in forming an electron transport layer, Compound E3 was used instead of Compound 200B.

<Compound H3>

<Compound E3>

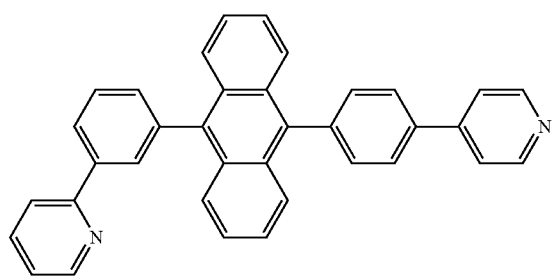

EVALUATION EXAMPLE

Efficiency (at a current density of 10 mA/cm$^2$) and a lifespan T80 (at a current density of 50 mA/cm$^2$) of the organic light-emitting devices of Examples 1 to 76 and Comparative Examples 1 to 21 were evaluated by using PR650 Spectroscan Source Measurement Unit. (product of PhotoResearch Co., Ltd). T80 indicates a time period taken until brightness reduces to 80% of the initial brightness. Results thereof are shown in Tables 1 to 3, below.

TABLE 1

| Example | Emission layer | Electron transport layer | Efficiency (cd/A) | T80 (hours) |
|---|---|---|---|---|
| Example 1 | 100A | 200B | 5.4 | 130 |
| Example 2 | 100A | 201B | 5.4 | 140 |
| Example 3 | 100A | 202B | 5.7 | 100 |
| Example 4 | 100A | 203B | 5.4 | 120 |
| Example 5 | 100A | 204B | 5.8 | 110 |
| Example 6 | 100A | 205B | 5.5 | 110 |
| Example 7 | 100A | 206B | 5.6 | 120 |
| Example 8 | 100A | 207B | 5.7 | 110 |
| Example 9 | 101A | 201B | 5.5 | 130 |
| Example 10 | 102A | 201B | 5.8 | 100 |
| Example 11 | 103A | 201B | 5.6 | 110 |
| Example 12 | 104A | 201B | 5.5 | 120 |
| Example 13 | 105A | 201B | 5.7 | 100 |
| Example 14 | 106A | 201B | 5.2 | 140 |
| Example 15 | 107A | 201B | 5.3 | 130 |
| Example 16 | 108A | 201B | 5.5 | 100 |
| Example 17 | 109A | 200B | 5.5 | 140 |
| Example 18 | 109A | 201B | 5.6 | 110 |
| Example 19 | 109A | 202B | 5.6 | 100 |
| Example 20 | 109A | 203B | 5.5 | 130 |
| Example 21 | 109A | 204B | 5.9 | 100 |
| Example 22 | 109A | 205B | 5.6 | 110 |
| Example 23 | 109A | 206B | 5.9 | 100 |
| Example 24 | 109A | 207B | 5.8 | 110 |
| Example 25 | 110A | 201B | 5.6 | 120 |
| Example 26 | 111A | 201B | 5.9 | 110 |
| Example 27 | 112A | 201B | 5.4 | 110 |
| Example 28 | 113A | 201B | 5.4 | 120 |
| Example 29 | 114A | 201B | 5.8 | 100 |
| Example 30 | 115A | 201B | 5.3 | 110 |
| Comparative Example 1 | H1 | 201B | 5.0 | 60 |
| Comparative Example 2 | H2 | 201B | 4.8 | 70 |
| Comparative Example 3 | 100A | E1 | 5.2 | 90 |
| Comparative Example 4 | 100A | E2 | 5.3 | 100 |
| Comparative Example 5 | 109A | E1 | 5.2 | 90 |
| Comparative Example 6 | 109A | E2 | 5.3 | 100 |
| Comparative Example 7 | H3 | E3 | 5.4 | 90 |

TABLE 2

| Example | Emission layer | Electron transport layer | Efficiency (cd/A) | Life span (hours) |
|---|---|---|---|---|
| Example 31 | 100A | 200B:Liq | 5.3 | 170 |
| Example 32 | 100A | 201B:Liq | 5.4 | 130 |
| Example 33 | 100A | 202B:Liq | 5.6 | 110 |
| Example 34 | 100A | 203B:Liq | 5.5 | 140 |
| Example 35 | 100A | 204B:Liq | 5.5 | 120 |
| Example 36 | 100A | 205B:Liq | 5.6 | 110 |
| Example 37 | 100A | 206B:Liq | 5.3 | 120 |
| Example 38 | 100A | 207B:Liq | 5.4 | 120 |
| Example 39 | 109A | 200B:Liq | 5.4 | 160 |
| Example 40 | 109A | 201B:Liq | 5.5 | 120 |
| Example 41 | 109A | 202B:Liq | 5.6 | 120 |
| Example 42 | 109A | 203B:Liq | 5.4 | 140 |
| Example 43 | 109A | 204B:Liq | 5.6 | 110 |
| Example 44 | 109A | 205B:Liq | 5.4 | 120 |
| Example 45 | 109A | 206B:Liq | 5.8 | 110 |
| Example 46 | 109A | 207B:Liq | 5.7 | 120 |
| Comparative Example 8 | 109A | 201B:Liq | 4.9 | 60 |
| Comparative Example 9 | 109A | 201B:Liq | 4.6 | 70 |
| Comparative Example 10 | 100A | E1:Liq | 5.0 | 90 |
| Comparative Example 11 | 100A | E2:Liq | 5.1 | 100 |
| Comparative Example 12 | 109A | E1:Liq | 5.0 | 90 |
| Comparative Example 13 | 109A | E2:Liq | 5.1 | 100 |
| Comparative Example 14 | H3 | E3:Liq | 5.2 | 100 |

TABLE 3

| Example | Emission layer | Buffer layer | Electron transport layer | Efficiency (cd/A) | Life span (hours) |
|---|---|---|---|---|---|
| Example 47 | 100A | 200B | BPhen:Liq | 5.4 | 150 |
| Example 48 | 100A | 201B | BPhen:Liq | 5.3 | 160 |
| Example 49 | 100A | 202B | BPhen:Liq | 5.5 | 110 |
| Example 50 | 100A | 203B | BPhen:Liq | 5.3 | 130 |
| Example 51 | 100A | 204B | BPhen:Liq | 5.6 | 110 |
| Example 52 | 100A | 205B | BPhen:Liq | 5.4 | 120 |
| Example 53 | 100A | 206B | BPhen:Liq | 5.6 | 130 |
| Example 54 | 100A | 207B | BPhen:Liq | 5.6 | 130 |
| Example 55 | 101A | 201B | BPhen:Liq | 5.6 | 140 |
| Example 56 | 102A | 201B | BPhen:Liq | 5.9 | 120 |
| Example 57 | 103A | 201B | BPhen:Liq | 5.6 | 120 |
| Example 58 | 104A | 201B | BPhen:Liq | 5.7 | 140 |
| Example 59 | 105A | 201B | BPhen:Liq | 5.5 | 110 |
| Example 60 | 106A | 201B | BPhen:Liq | 5.3 | 160 |
| Example 61 | 107A | 201B | BPhen:Liq | 5.4 | 140 |
| Example 62 | 108A | 201B | BPhen:Liq | 5.6 | 130 |
| Example 63 | 109A | 200B | BPhen;Liq | 5.6 | 160 |
| Example 64 | 109A | 201B | BPhen:Liq | 5.5 | 120 |
| Example 65 | 109A | 202B | BPhen:Liq | 5.7 | 110 |
| Example 66 | 109A | 203B | BPhen:Liq | 5.6 | 150 |
| Example 67 | 109A | 204B | BPhen:Liq | 6.0 | 110 |
| Example 68 | 109A | 205B | BPhen:Liq | 5.6 | 110 |
| Example 69 | 109A | 206B | BPhen:Liq | 5.9 | 100 |
| Example 70 | 109A | 207B | BPhen:Liq | 5.9 | 120 |
| Example 71 | 110A | 201B | BPhen:Liq | 5.5 | 130 |
| Example 72 | 111A | 201B | BPhen:Liq | 5.9 | 120 |
| Example 73 | 112A | 201B | BPhen:Liq | 5.5 | 110 |
| Example 74 | 113A | 201B | BPhen:Liq | 5.6 | 130 |
| Example 75 | 114A | 201B | BPhen:Liq | 5.9 | 110 |
| Example 76 | 115A | 201B | BPhen:Liq | 5.4 | 120 |
| Comparative Example 15 | 109A | 200B | BPhen:Liq | 4.9 | 70 |
| Comparative Example 16 | 109A | 201B | BPhen:Liq | 5.0 | 80 |
| Comparative Example 17 | 100A | E1 | BPhen:Liq | 5.4 | 100 |

TABLE 3-continued

| Example | Emission layer | Buffer layer | Electron transport layer | Efficiency (cd/A) | Life span (hours) |
|---|---|---|---|---|---|
| Comparative Example 18 | 100A | E2 | BPhen:Liq | 5.4 | 110 |
| Comparative Example 19 | 109A | E1 | BPhen:Liq | 5.4 | 100 |
| Comparative Example 20 | 109A | E2 | BPhen:Liq | 5.4 | 110 |
| Comparative Example 21 | H3 | E3 | BPhen:Liq | 5.4 | 100 |

As may be seen in Table 1 to 3, the organic light-emitting devices of Examples 1 to 76 exhibited higher efficiency and longer lifespan than the organic light-emitting devices of Comparative Examples 1 to 21.

Organic light-emitting devices according to the embodiments may have high efficiency and long lifespan characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the tiling of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
a first electrode;
a second electrode facing the first electrode; and
an organic layer between the first electrode and the second electrode, wherein the organic layer includes:
a first material represented by any one of Formulae 1A and 1B below,
a second material represented by any one of Formulae 2A to 2C below,

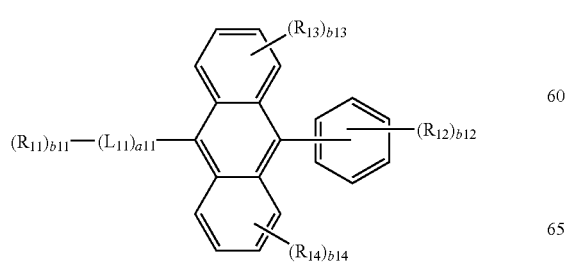

<Formuoa 1A>

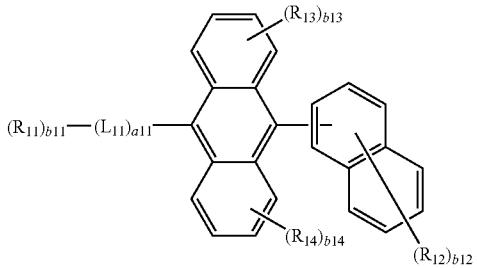

<Formula 1B>

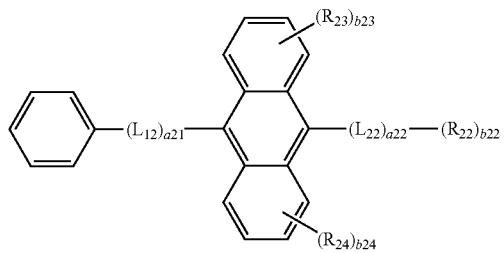

<Formula 2A>

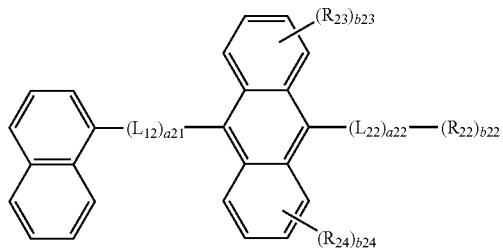

<Formula 2B>

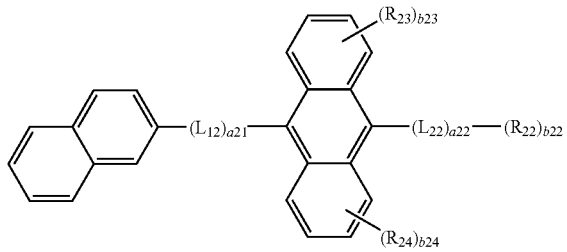

<Formula 2C> wherein in Formulae 1A 1B, and 2A to 2C, $L_{11}$, $L_{21}$, and $L_{22}$ are each independently selected from a group represented by any one of Formulae 3-1 to 3-6 below:

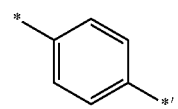

3-1

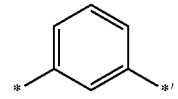

3-2

3-3

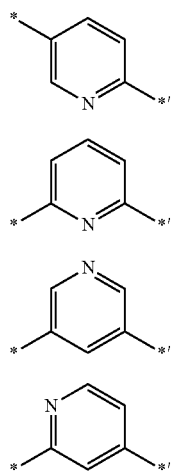

3-4

3-5

3-6 wherein, in Formulae 3-1 to 3-6, * and *' indicate binding sites to a neighboring atom;

a11 is 0 or 1;

a21 and a22 are each independently selected from 0, 1, and 2;

$R_{11}$ and $R_{12}$ are each independently selected from a group represented by any one of Formulae 4-1 to 4-9 below:

4-1

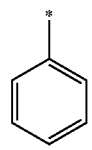

4-2

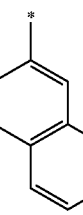

4-3

4-4

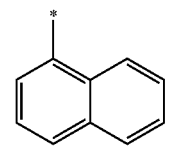

4-5

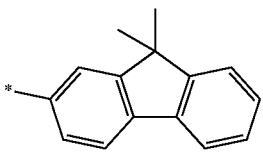

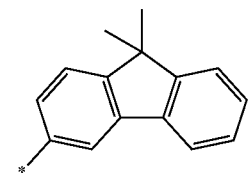

4-6

4-7

4-8

4-9

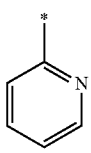

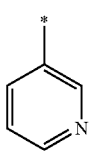

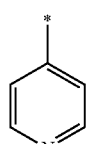

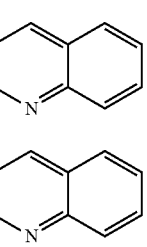

wherein, in Formulae 4-1 to 4-9, * indicates a binding site to a neighboring atom;

$R_{22}$ is selected from a pyridyl group, a quinolinyl group, and an isoquinolinyl group;

b11, b12, b21, and b22 are 1;

$R_{13}$, $R_{14}$, $R_{23}$, and $R_{24}$ are a hydrogen; and b13, b14, b23, and b24 are 4.

2. The organic light-emitting device as claimed in claim 1, wherein $R_{22}$ is a group represented by any one of Formulae 5-1 to 5-17 below:

5-1

5-2

5-3

5-4

5-5

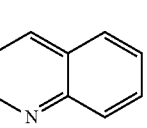

5-6
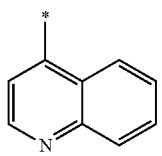

5-7
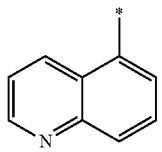

5-8
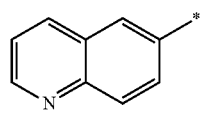

5-9
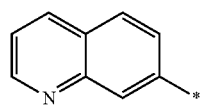

5-10
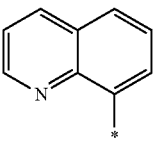

5-11
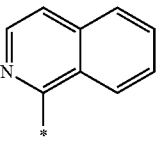

5-12
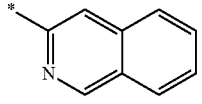

5-13
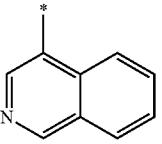

5-14
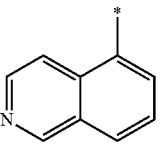

5-15
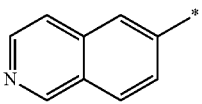

5-16
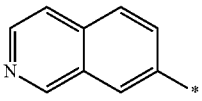

5-17
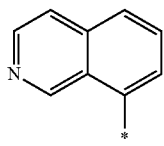

wherein in Formulae 5-1 to 5-17, * indicates a binding site to a neighboring atom.

3. The organic light-emitting device as claimed in claim 1, wherein $R_{22}$ is a group represented by any one of Formulae 5-1, 5-2, 5-5, and 5-13 below:

5-1
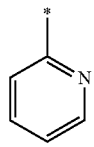

5-2
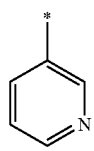

5-5
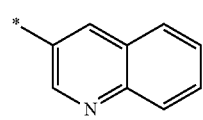

5-13
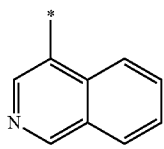

in Formulae 5-1, 5-2, 5-5, and 5-13, * indicates a binding site to a neighboring atom.

4. The organic light-emitting device as claimed in claim 1, wherein:

the first material is represented by any one of Formulae 1A-1 and 1B-1 below, the second material is represented by any one of Formulae 2A to 2C below, <Formuoa 1A-1>
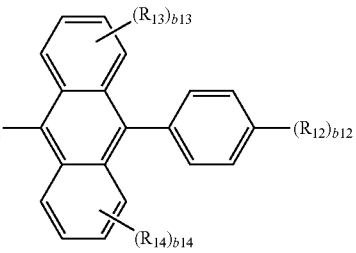

<Formula 1B-1>

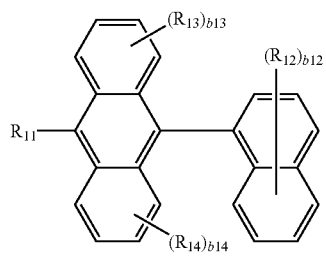

<Formula 2A>

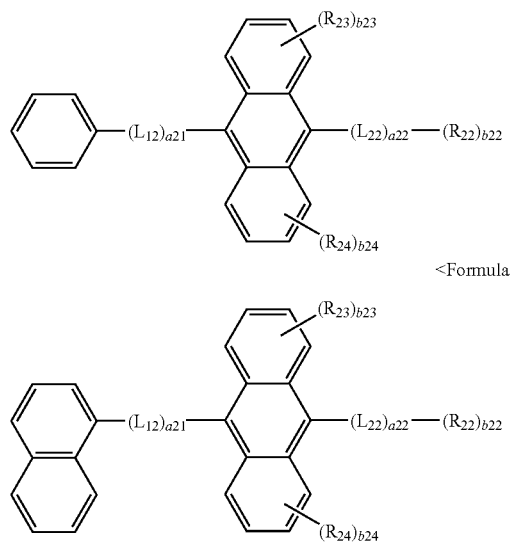

<Formula 2B>

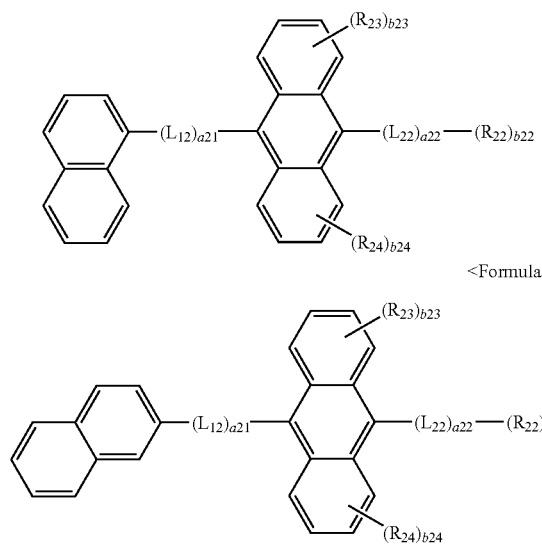

<Formula 2C>

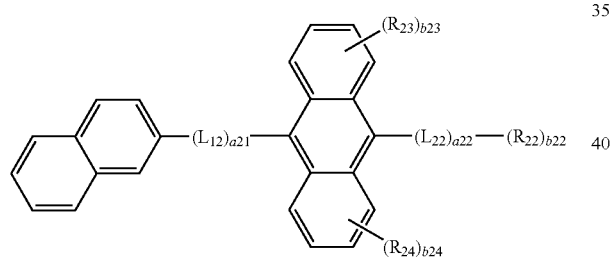

wherein in Formulae 1A-1, 1B-1, and 2A to 2C, $L_{11}$, a11, $R_{11}$ to $R_{14}$, b11 to b14, $L_{21}$, $L_{22}$, a21, a22, $R_{22}$ to $R_{24}$, and b22 to b24 are the same as defined with respect to Formulae 1A and 1B and 2A to 2C.

5. The organic light-emitting device as claimed in claim 1, wherein:
the first material is selected from Compounds 100 to 263 below, and
the second material is selected from Compounds 300 to 401, below,

100

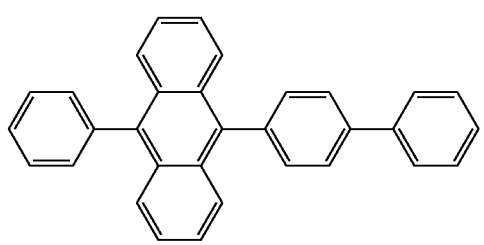

101

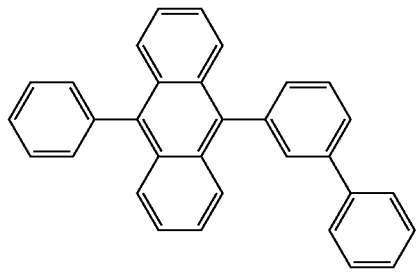

102

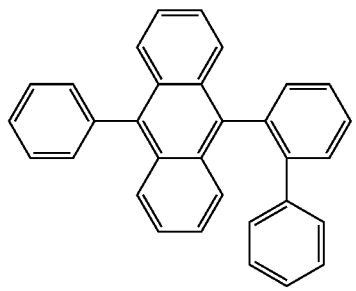

103

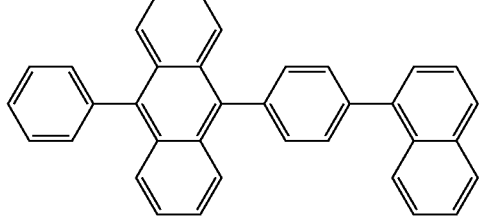

104

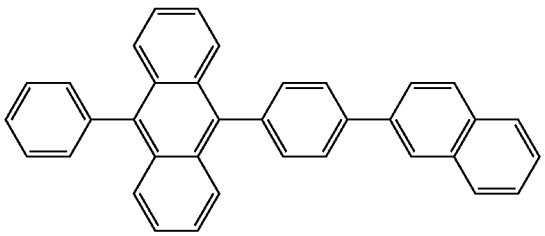

105

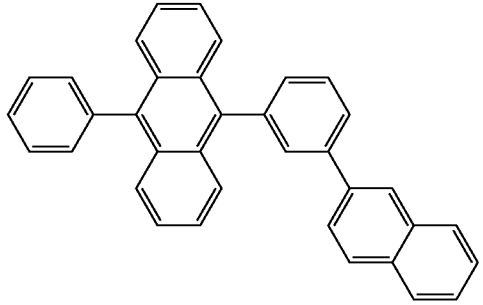

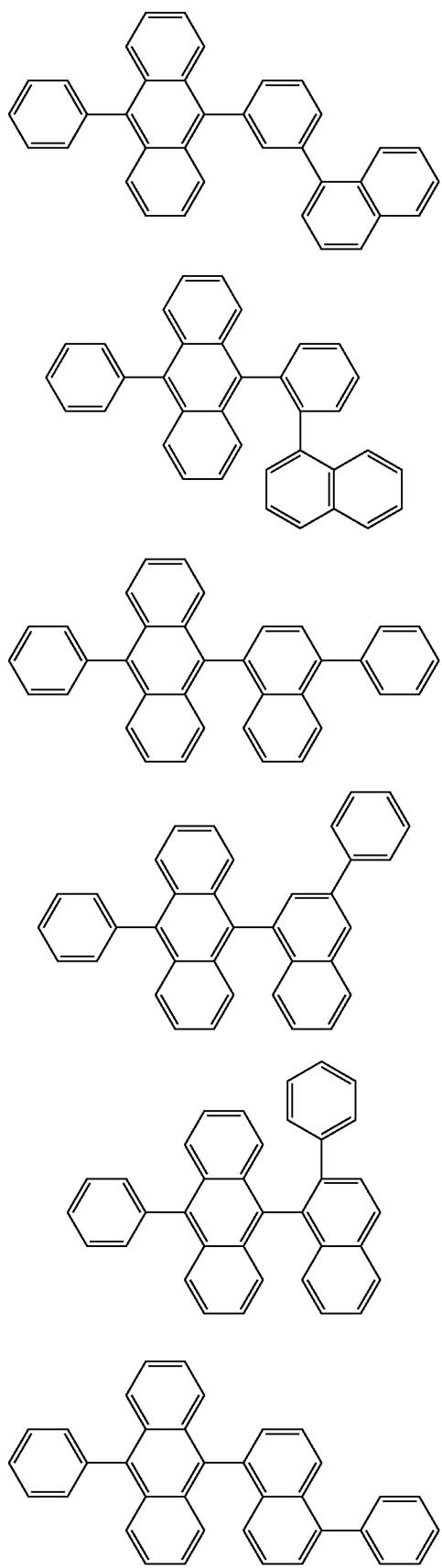
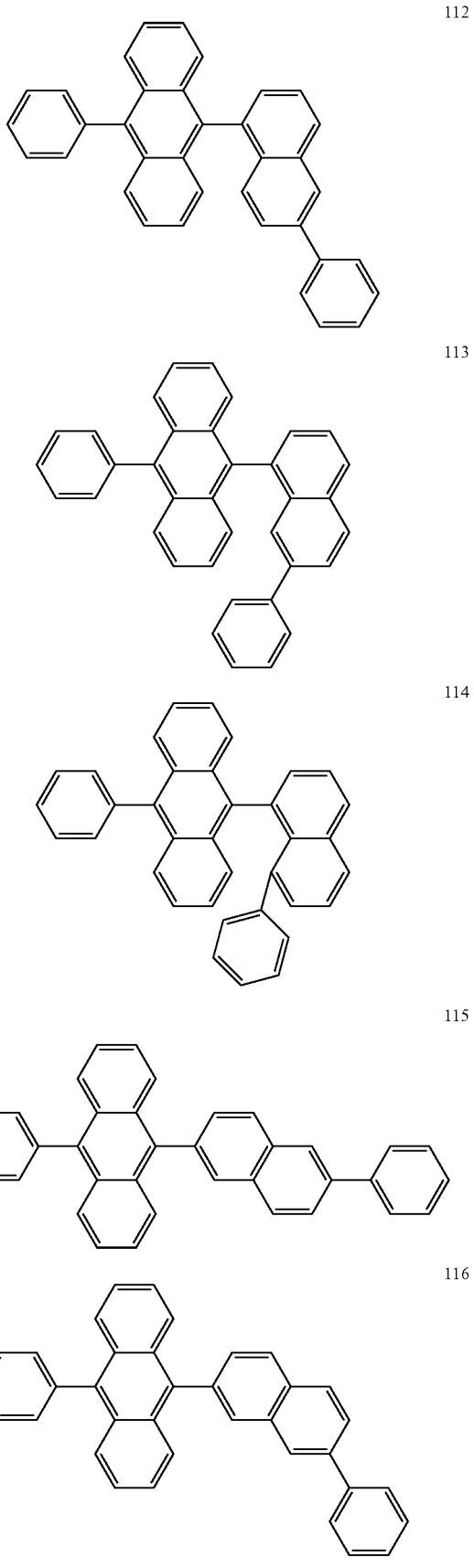

117
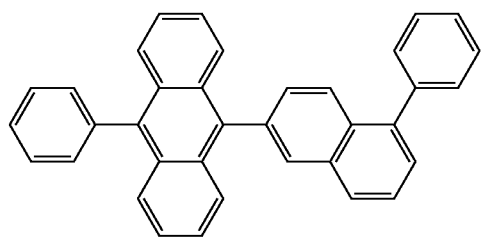
118
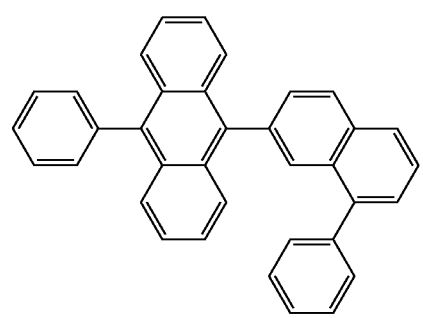
119
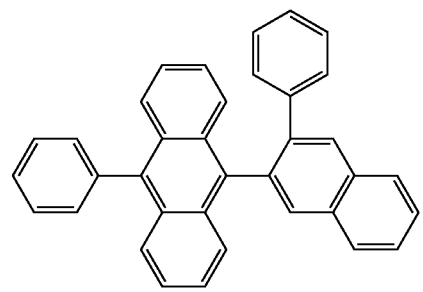
120
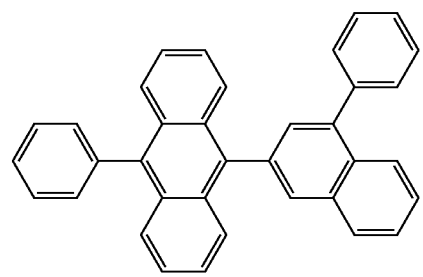
121
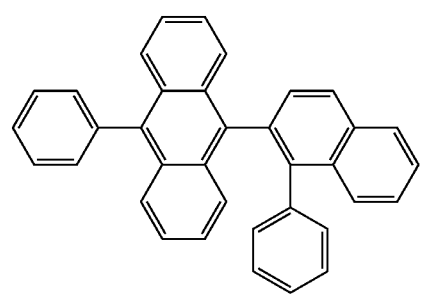
122
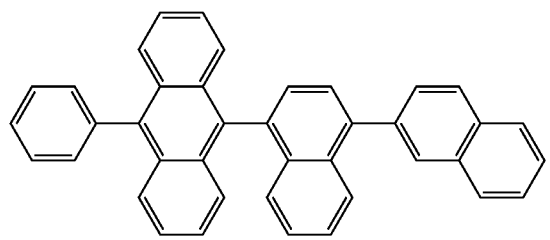
123
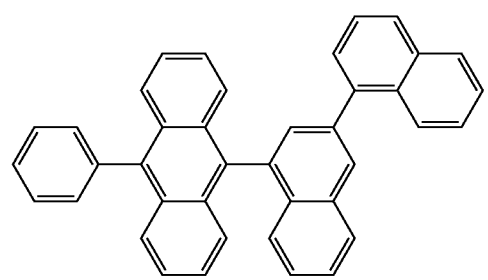
124
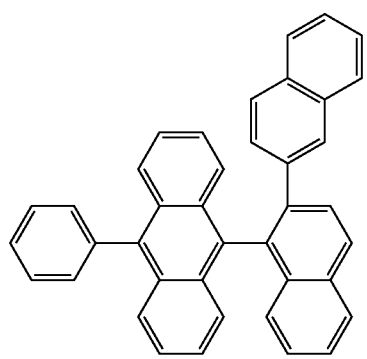
125
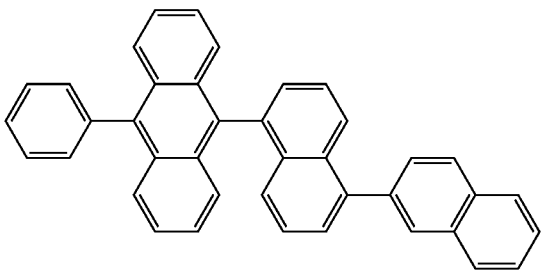
126
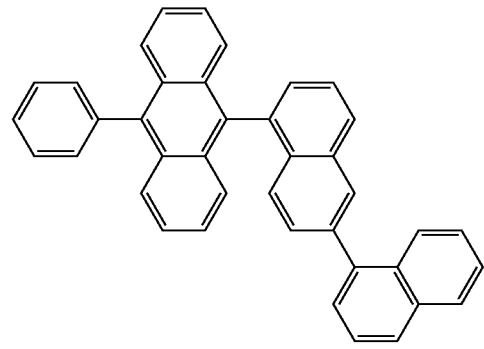

141
-continued
127
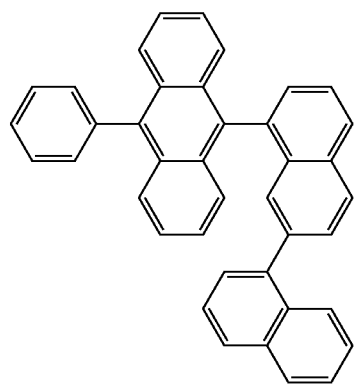
128
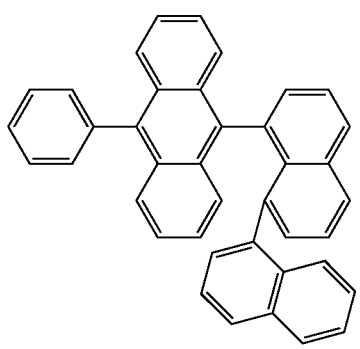
129
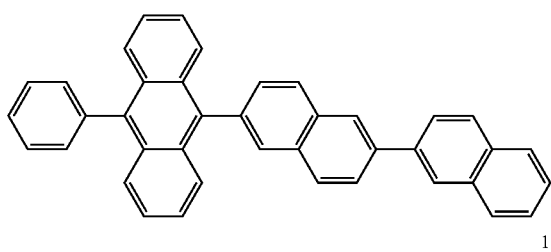
130
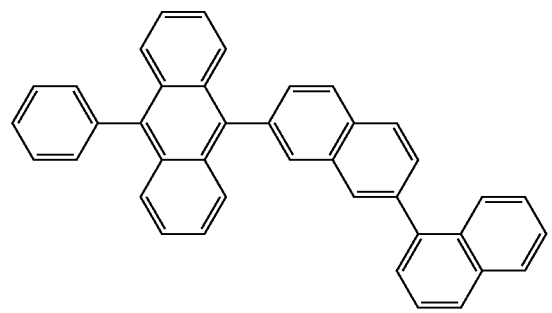
131
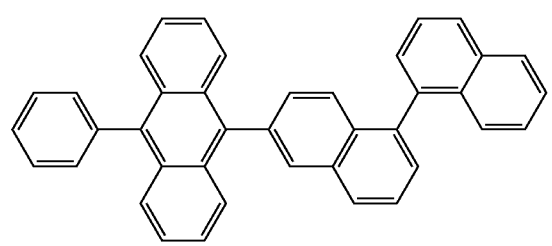
142
-continued
132
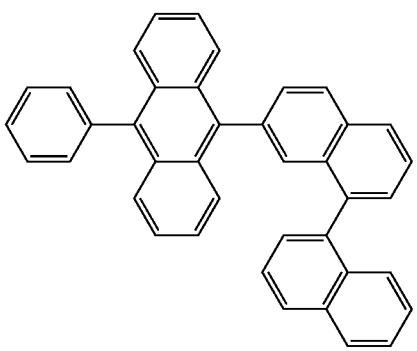
133
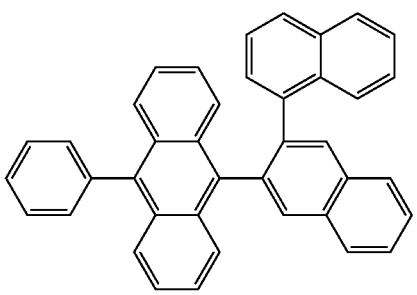
134
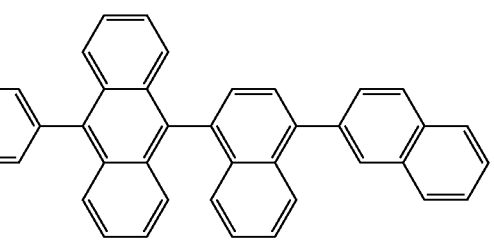
135
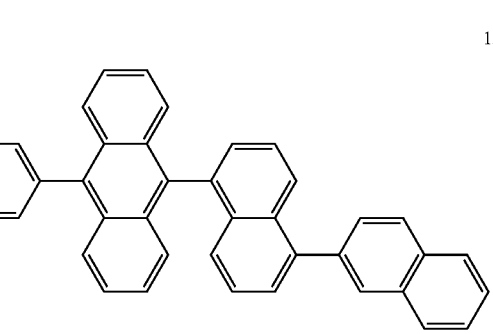
136
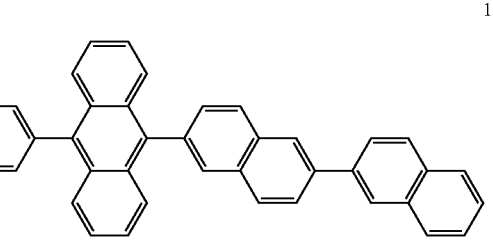

-continued
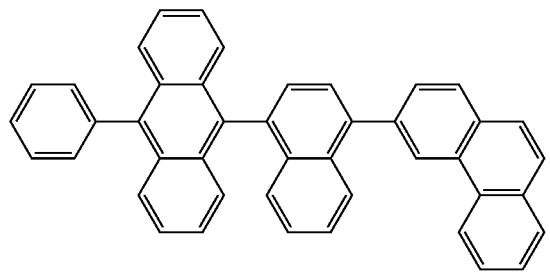
137
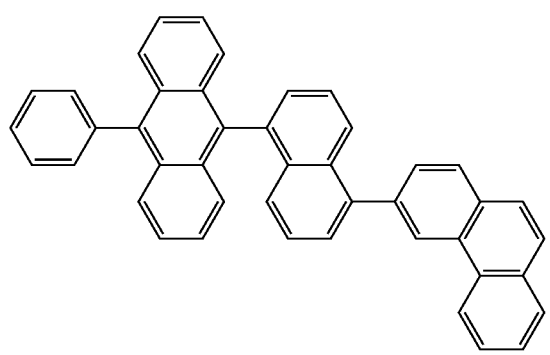
138
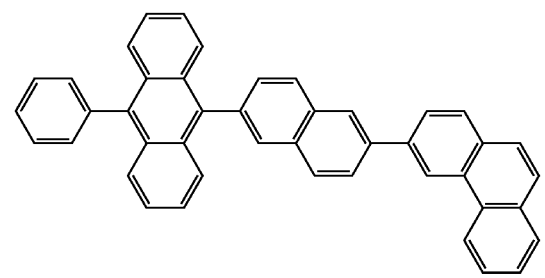
139
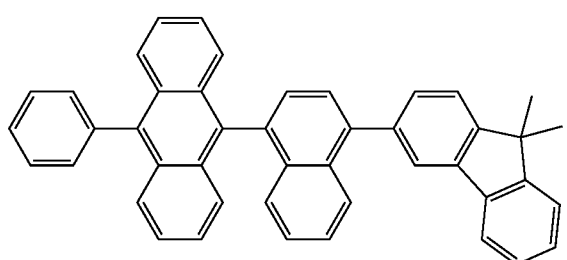
140
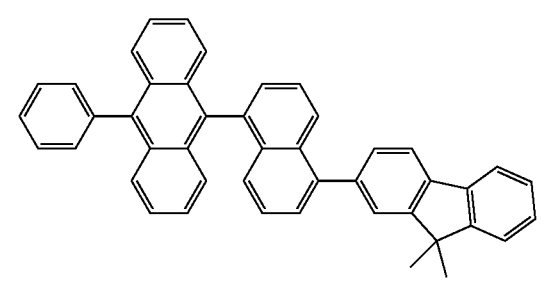
141
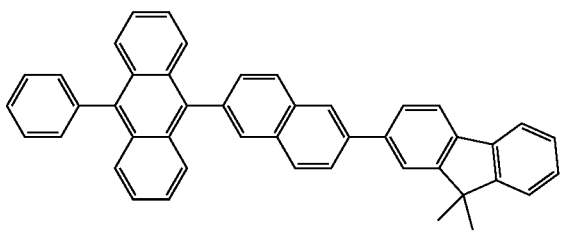
142
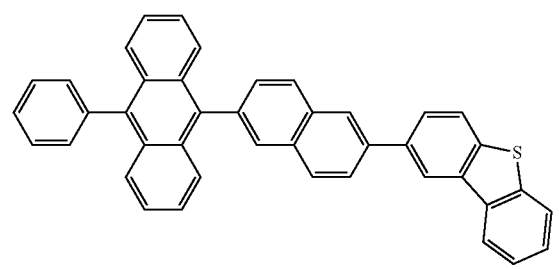
143
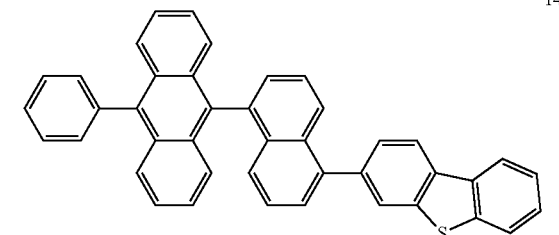
144
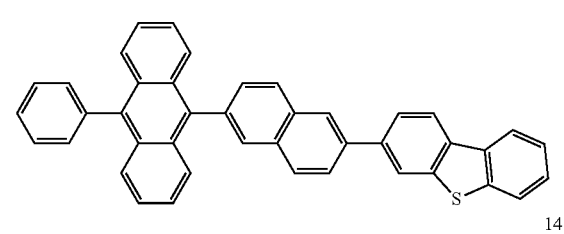
145
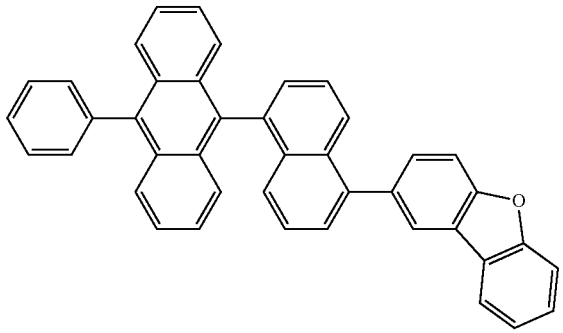
146
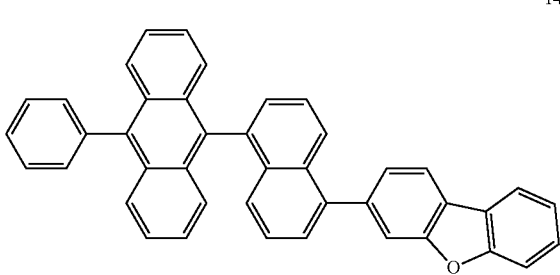
147

148
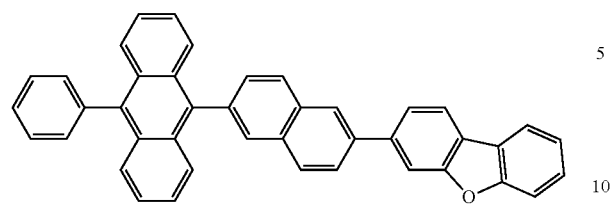
149
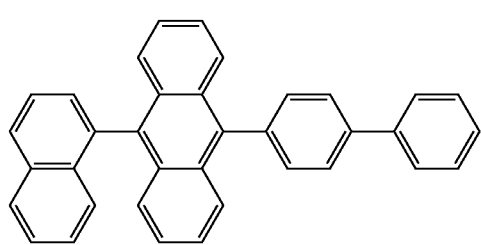
150
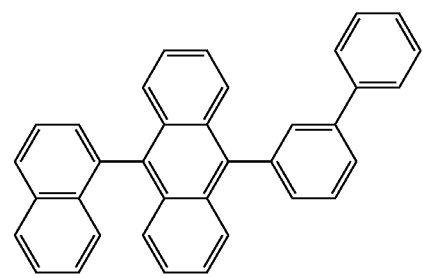
151
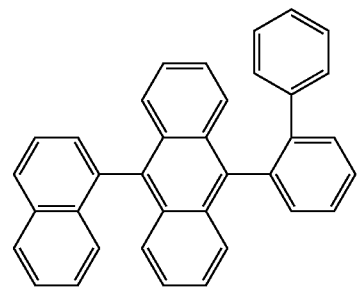
152
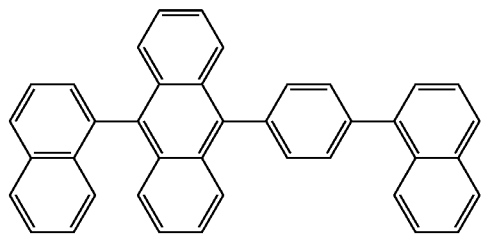
153
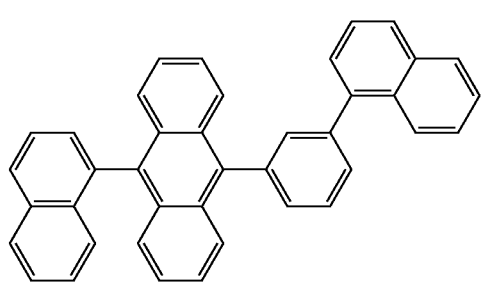
154
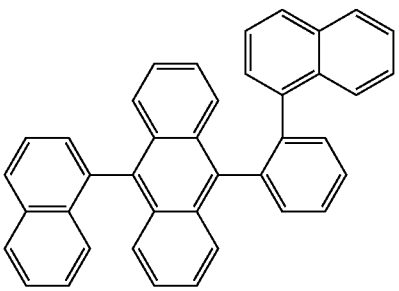
155
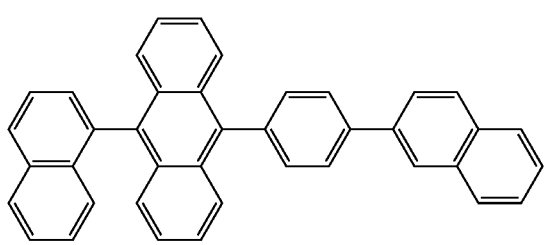
156
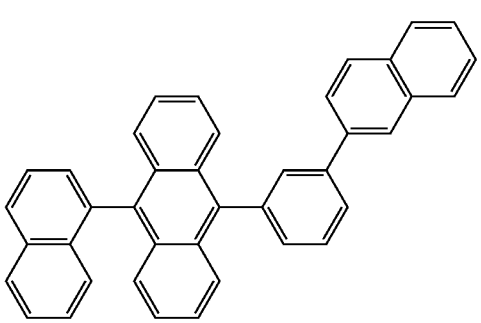
157
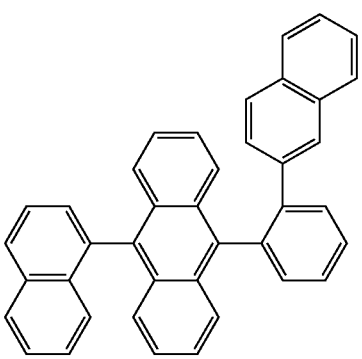
158
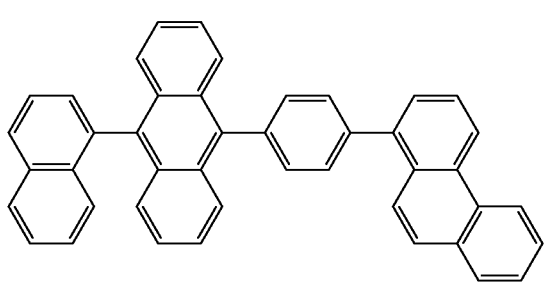

-continued
159
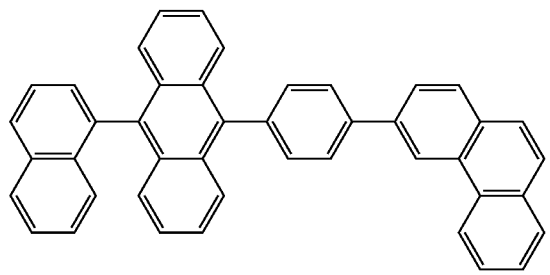
160
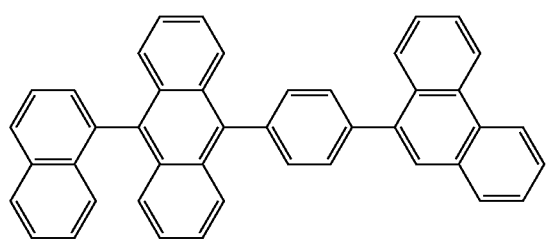
161
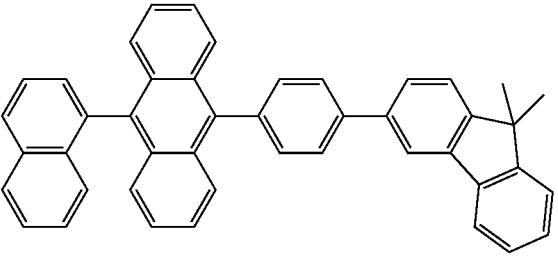
162
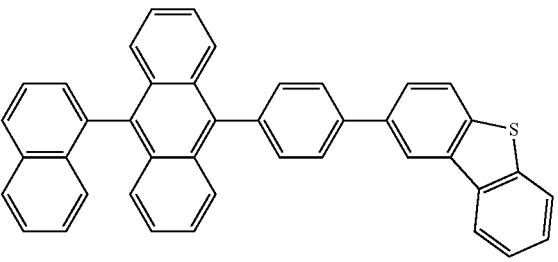
163
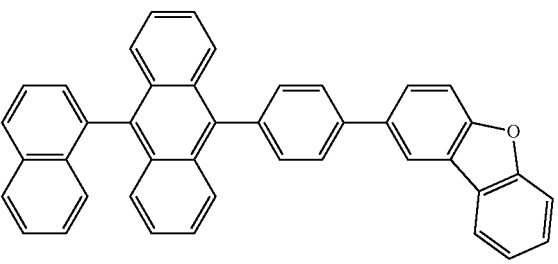
-continued
164
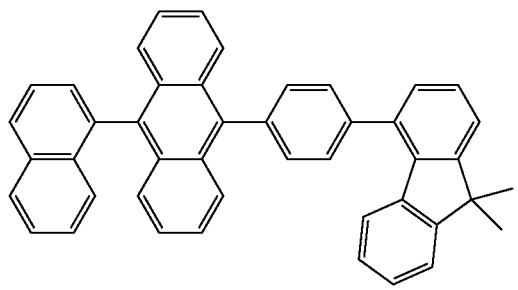
165
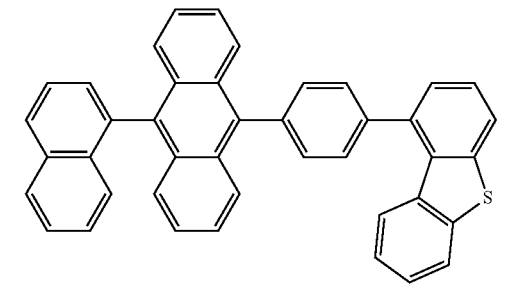
166
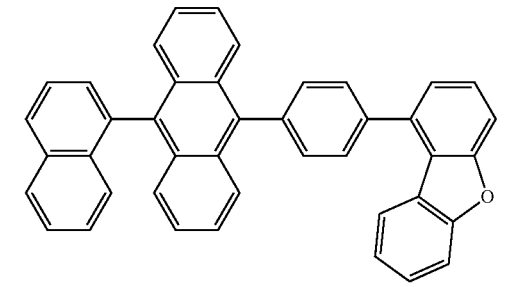
167
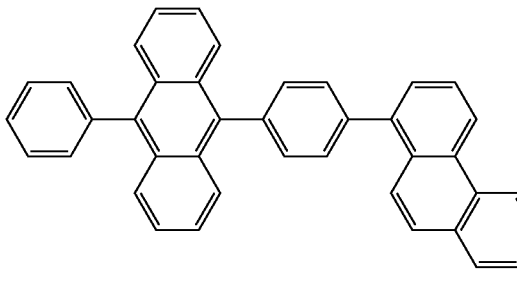
168
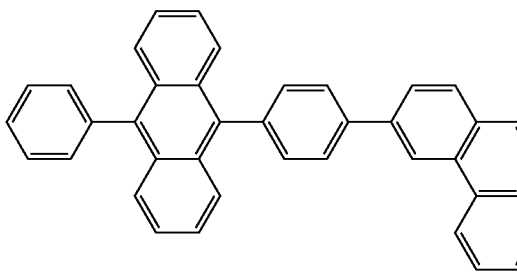

169
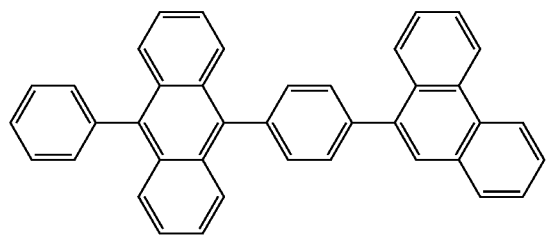
170
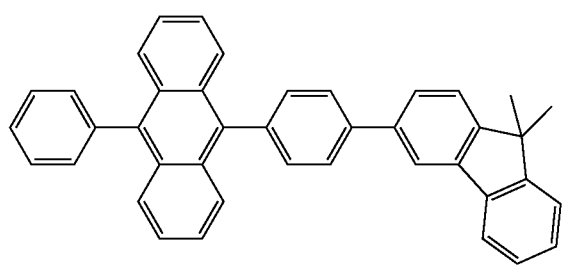
171
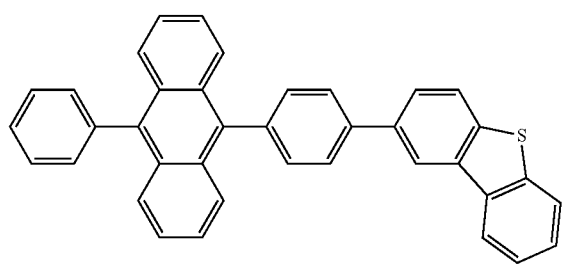
172
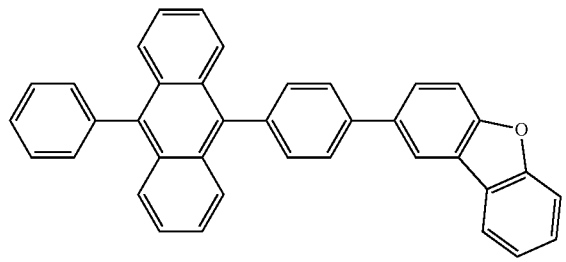
173
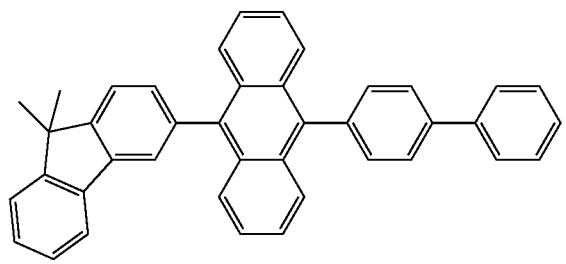
174
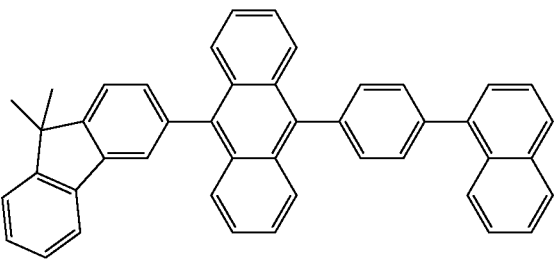
175
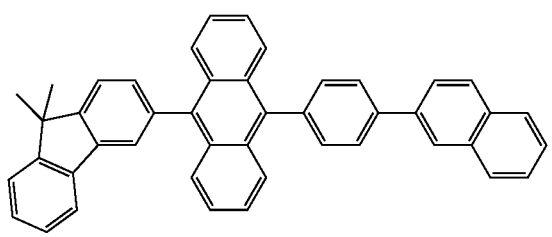
176
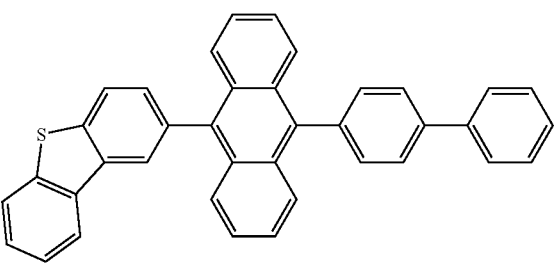
177
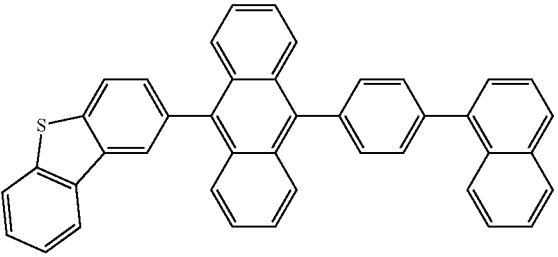
178
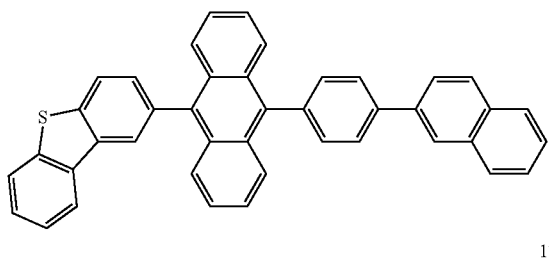
179
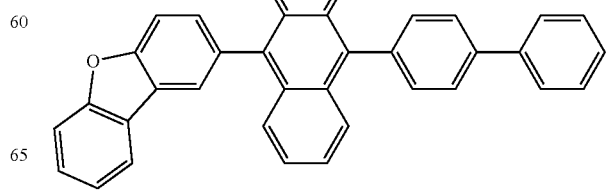

-continued
180
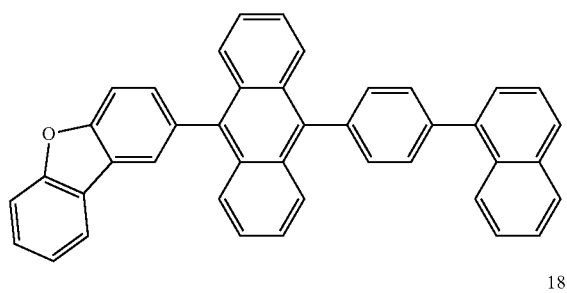
181
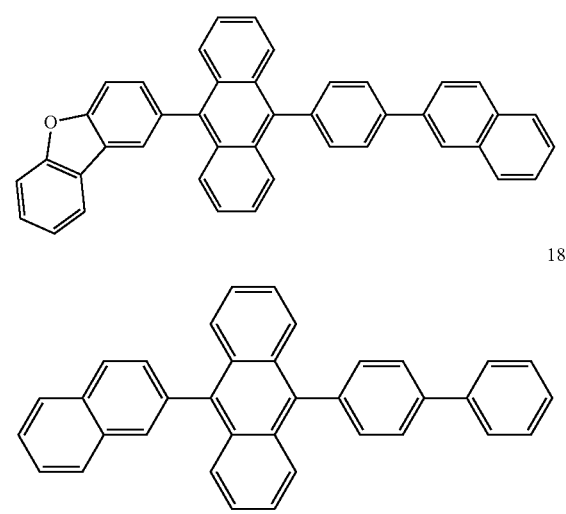
182
183
184
185
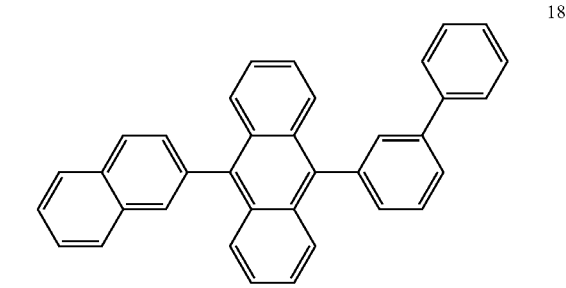
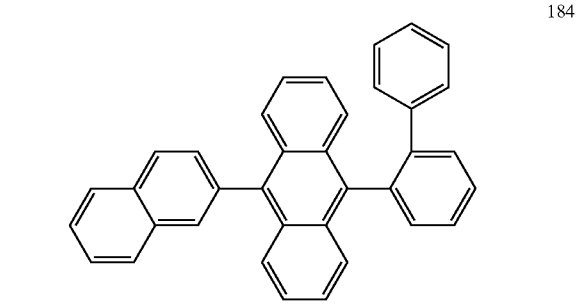
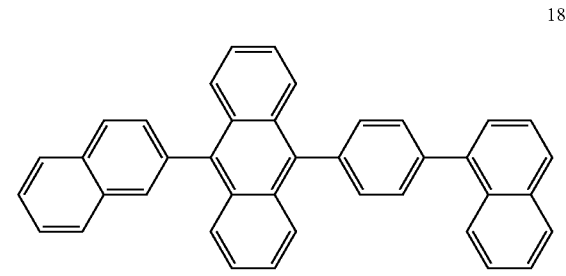
-continued
186
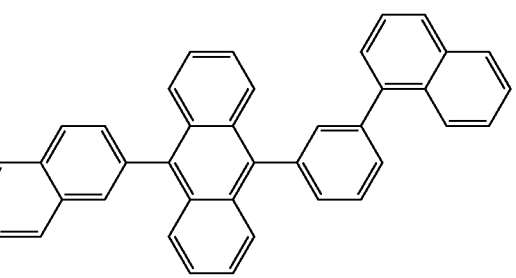
187
188
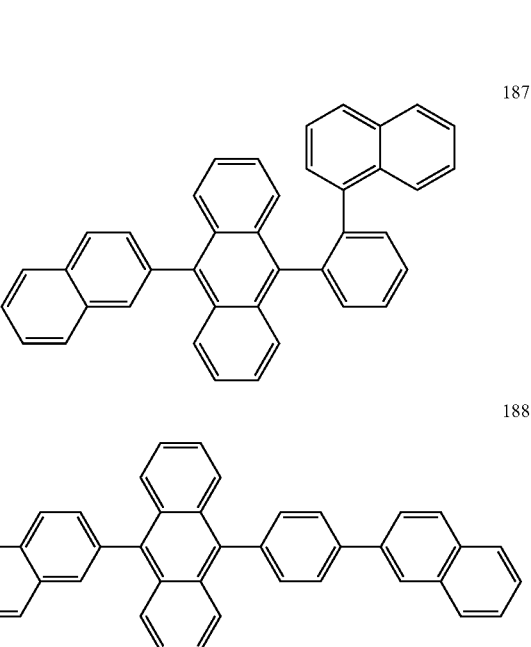
189
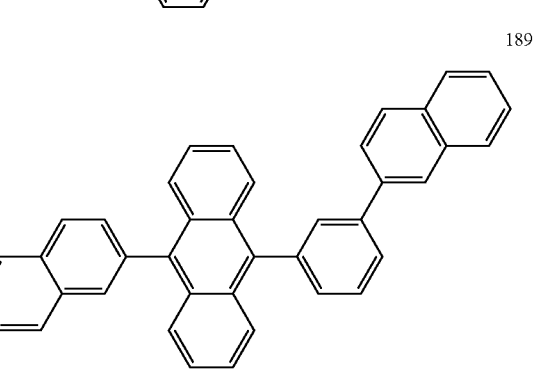
190
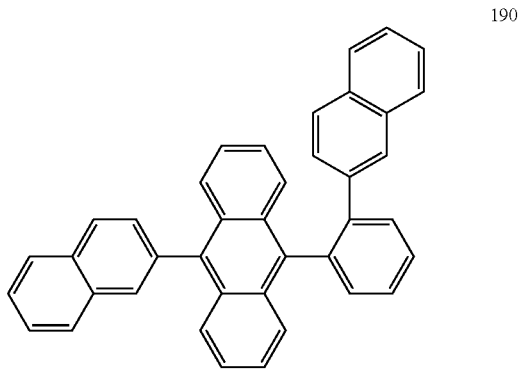

191
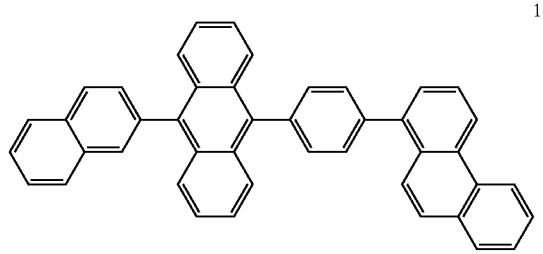
192
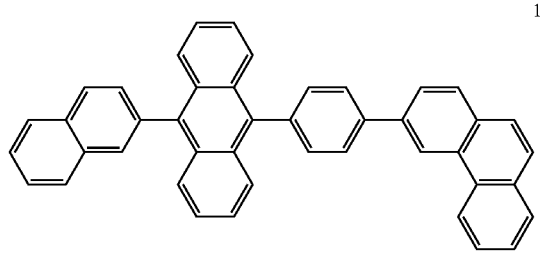
193
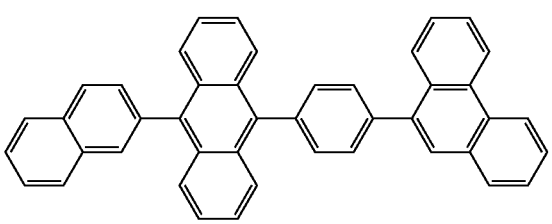
194
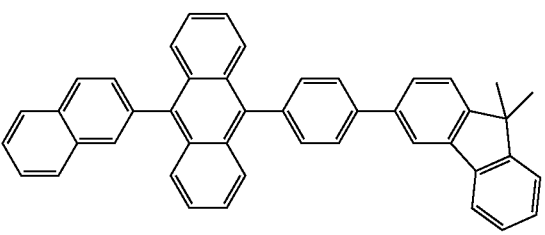
195
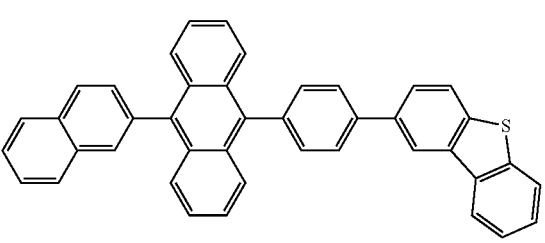
196
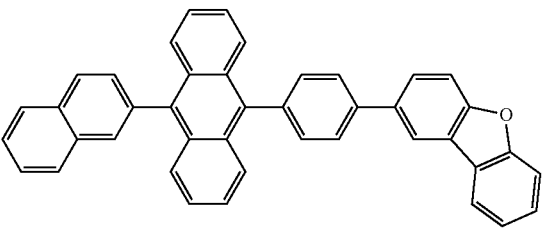
197
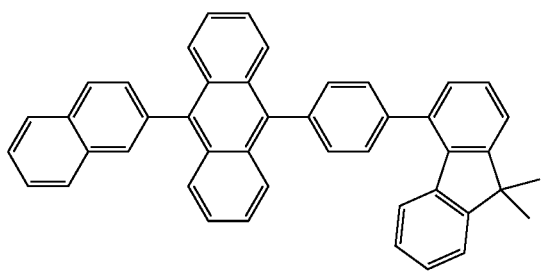
198
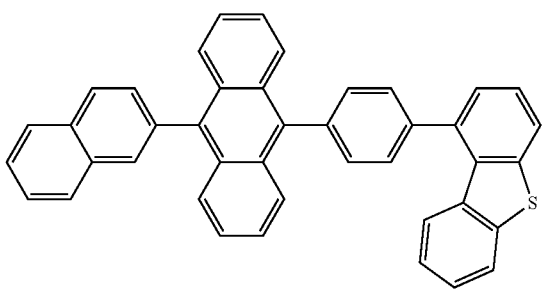
199
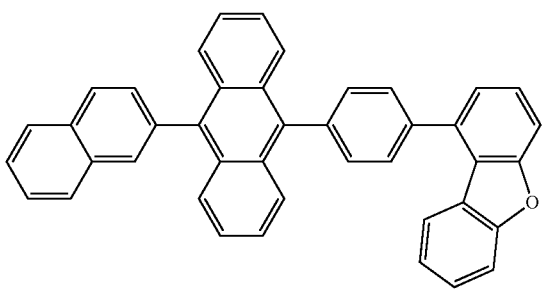
200
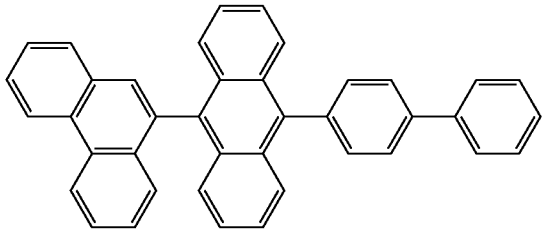
201
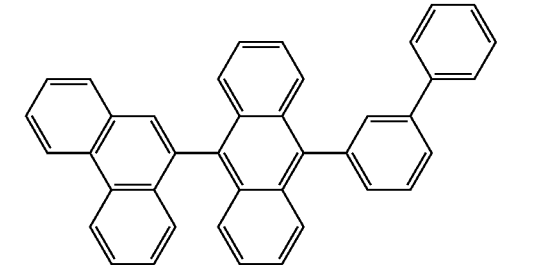

202
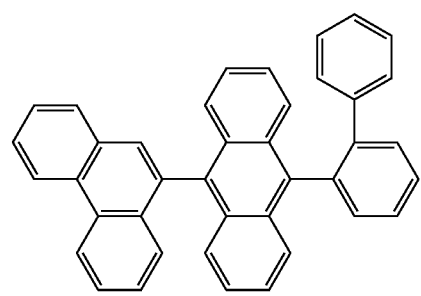
203
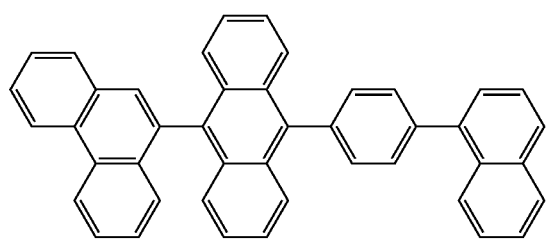
204
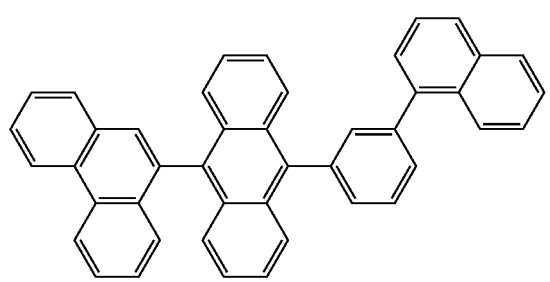
205
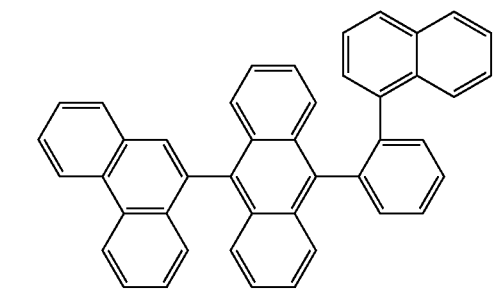
206
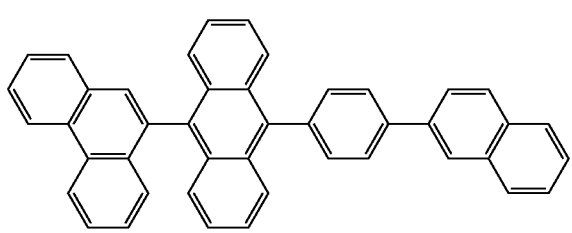
207
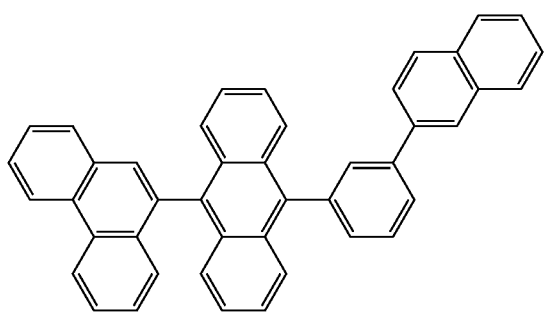
208
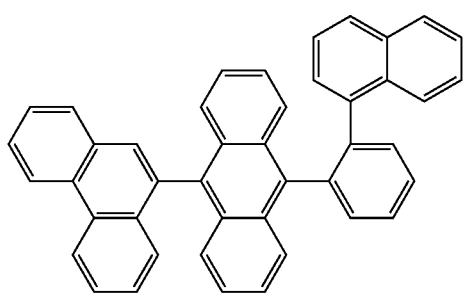
209
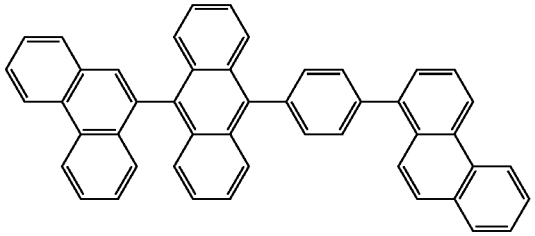
210
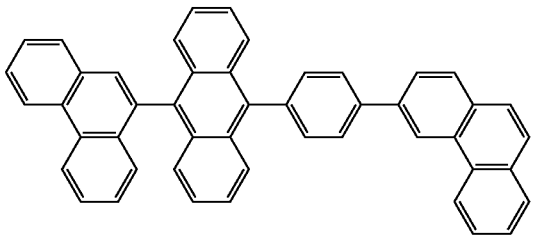
211
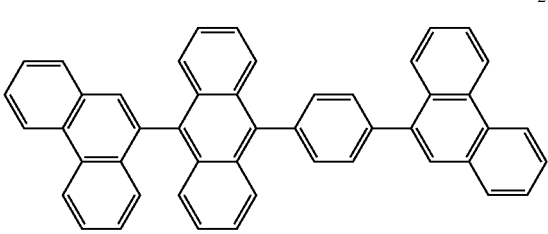

-continued
212
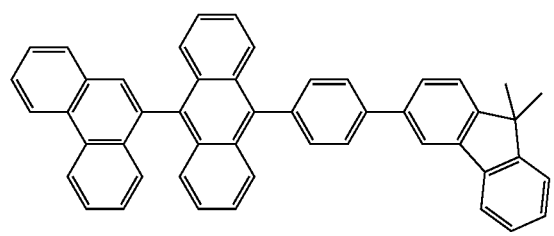
213
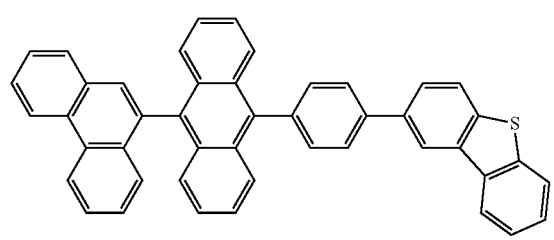
214
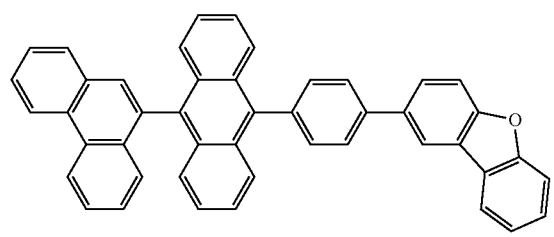
215
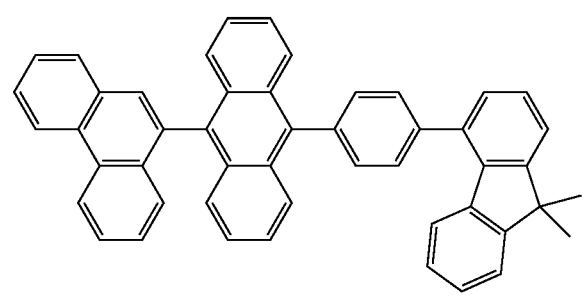
216
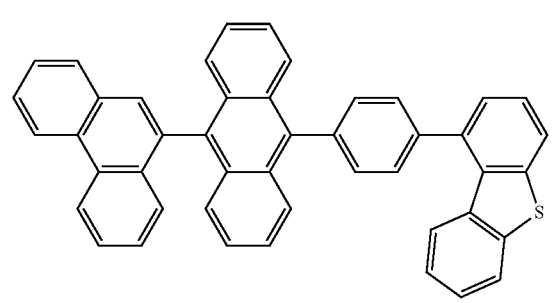
-continued
217
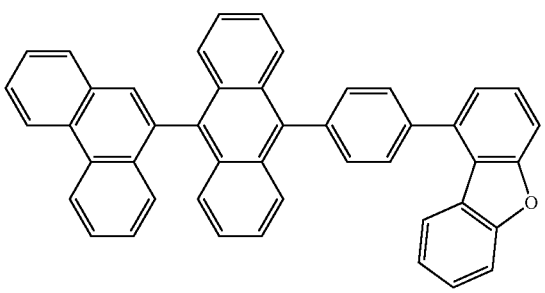
218
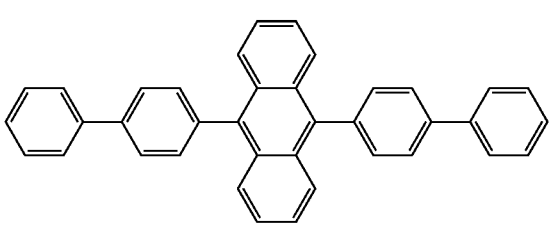
219
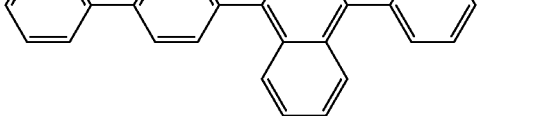
220
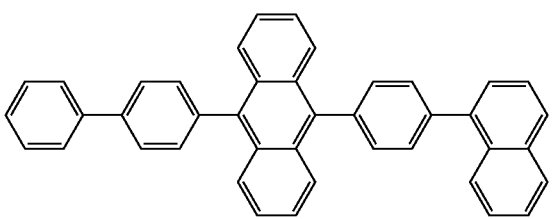
221
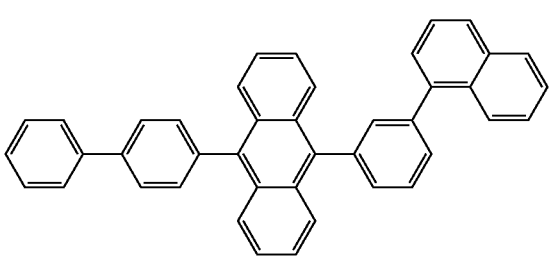
222

-continued
223
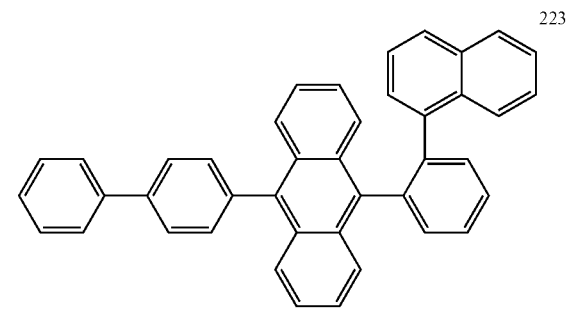
224
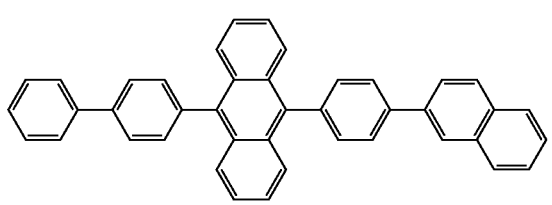
225
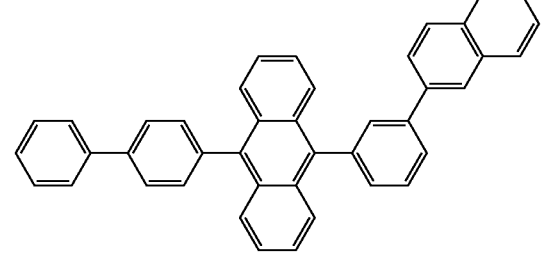
226
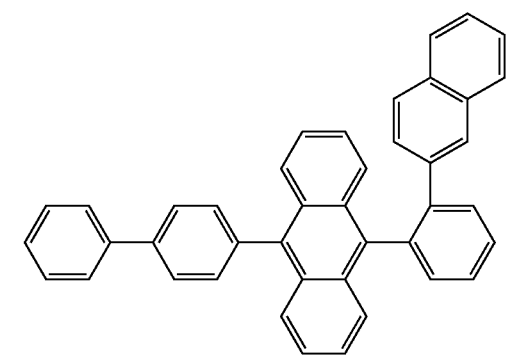
227
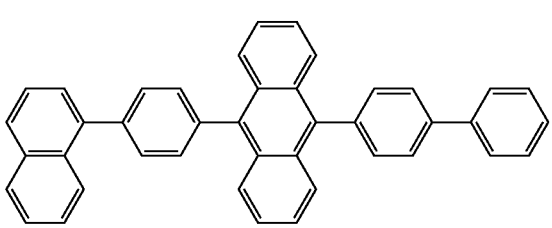
-continued
228
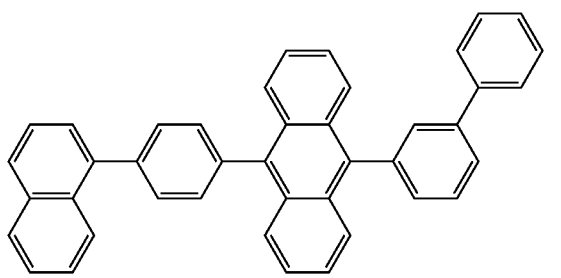
229
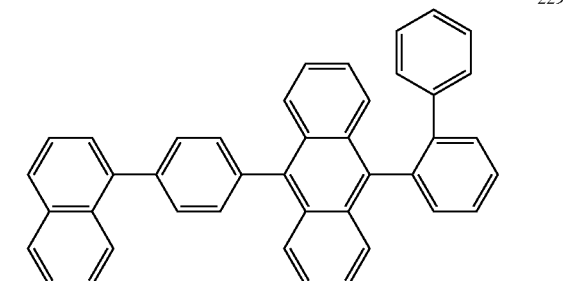
230
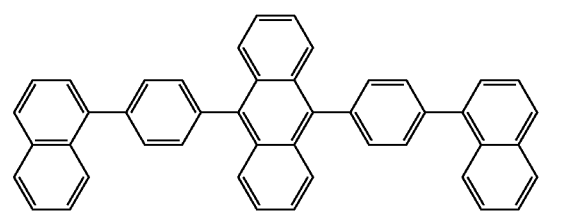
231
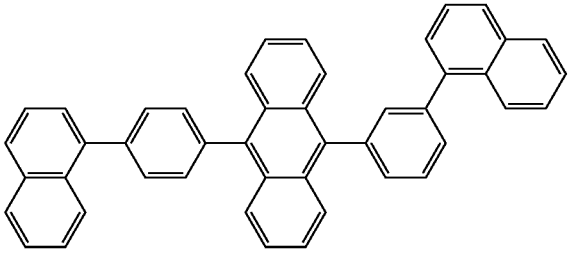
232
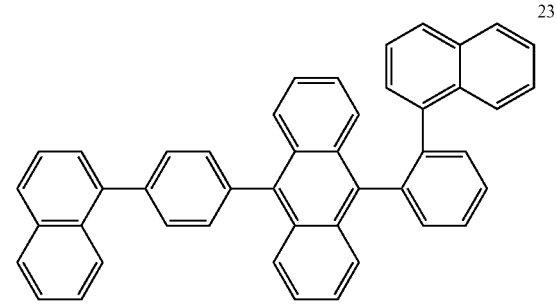
233
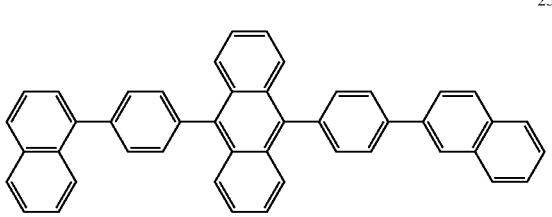

234
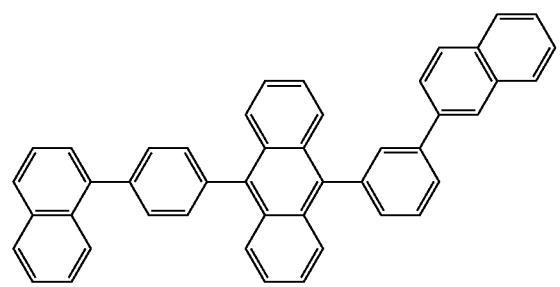
235
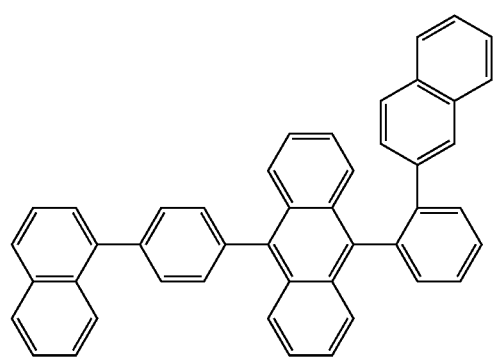
236
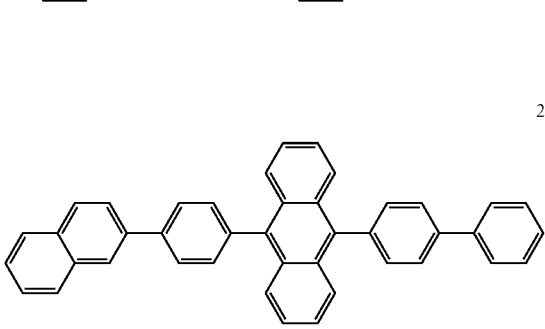
237
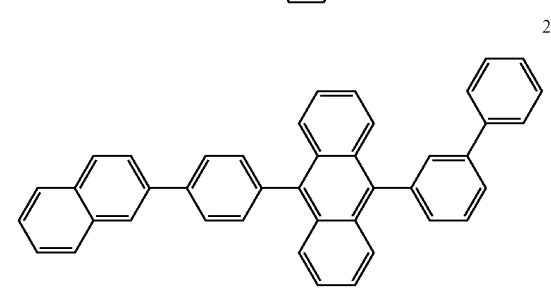
238
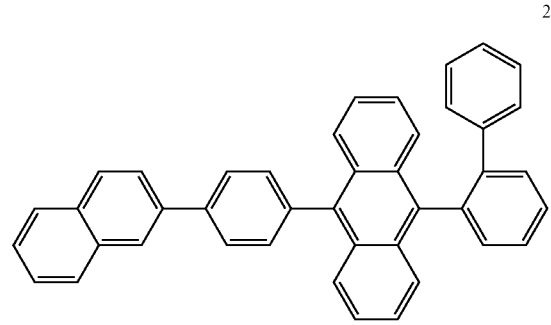
239
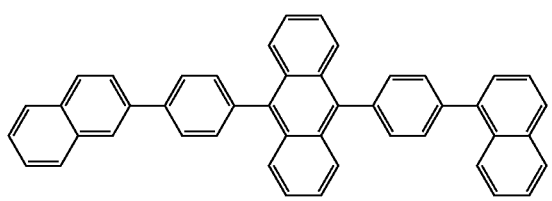
240
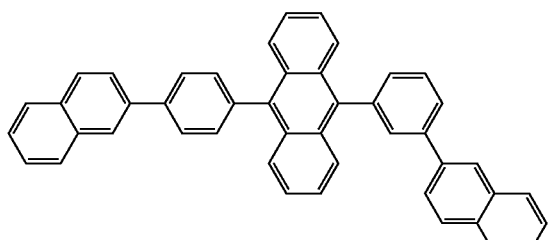
241
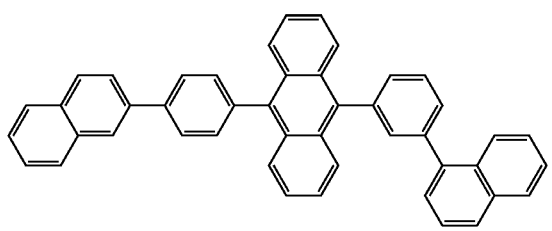
242
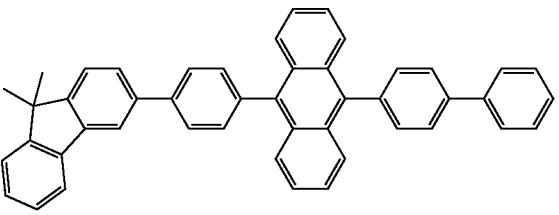
243
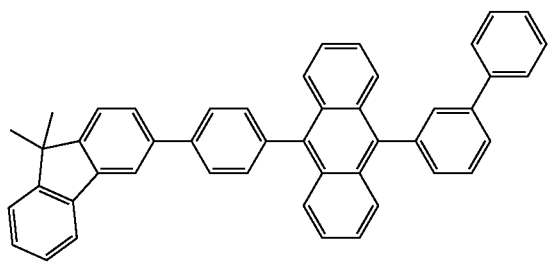
244
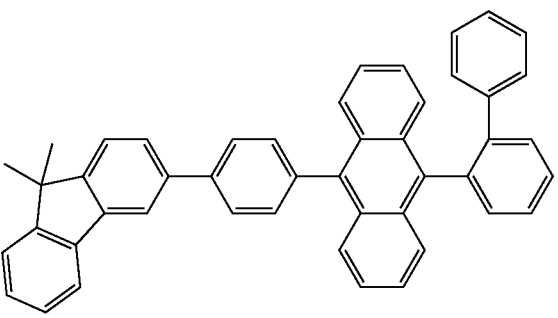

245
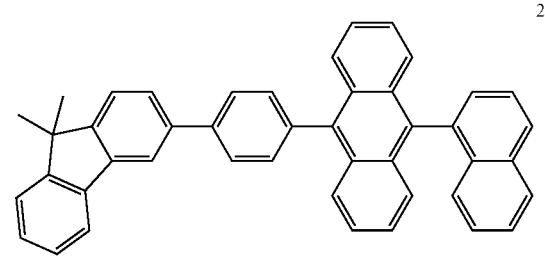
246
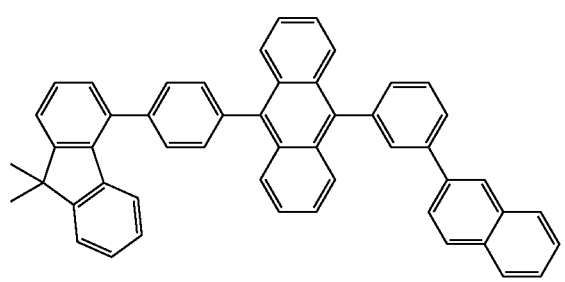
247
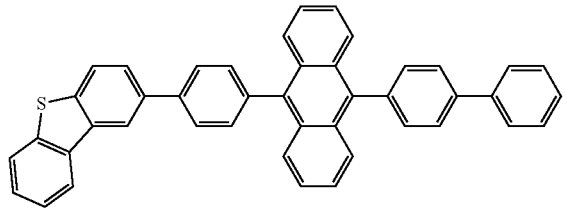
248
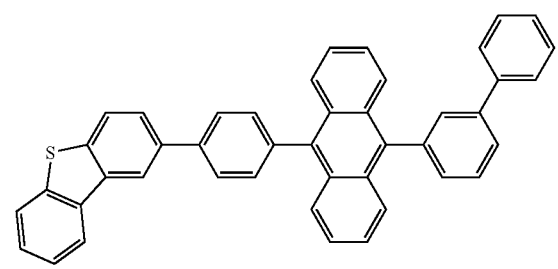
250
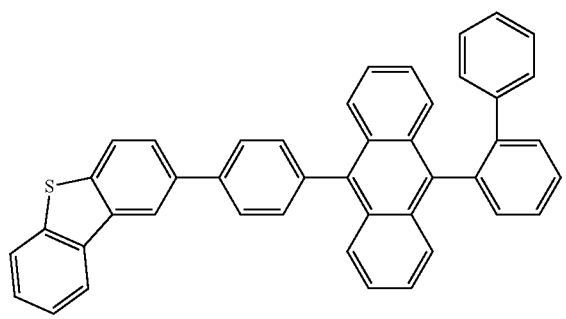
251
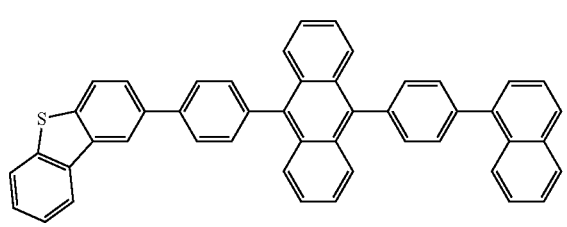
252
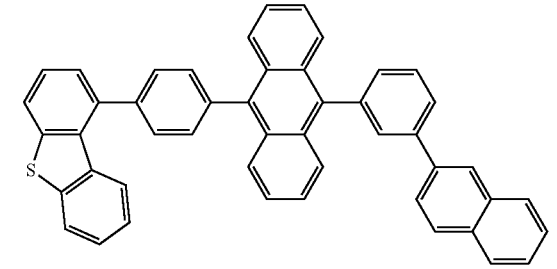
253
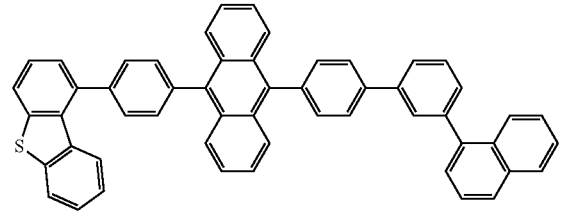
254
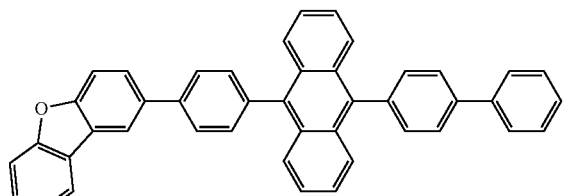
249
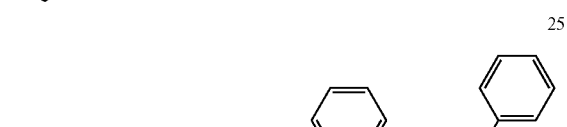
256
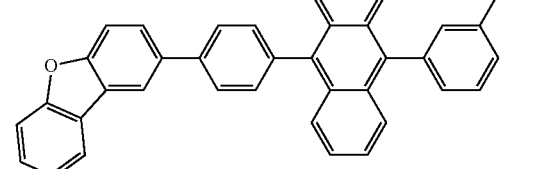

257
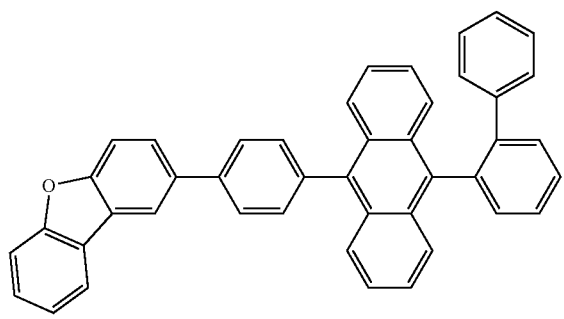
258
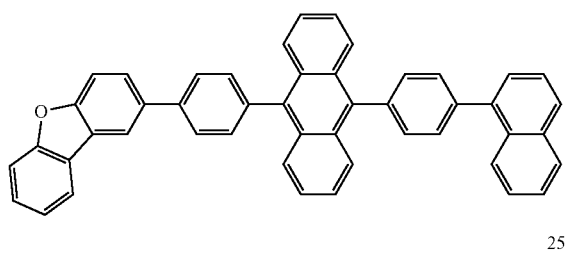
259
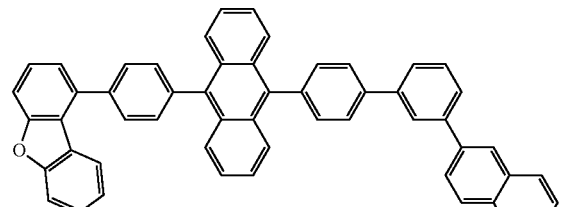
260
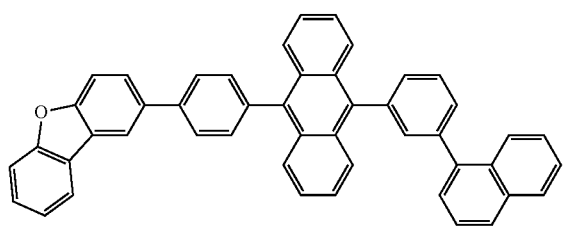
261
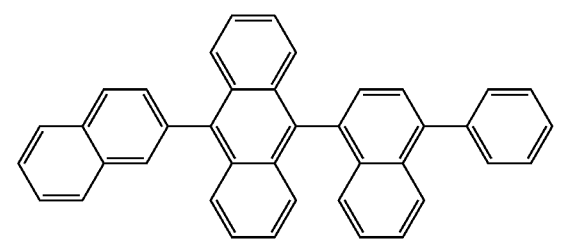
262
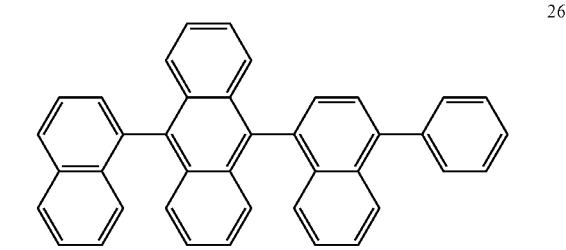
263
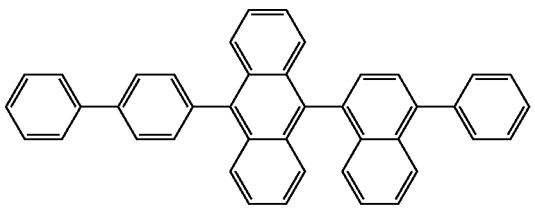
300
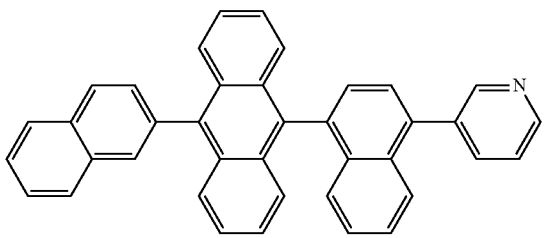
301
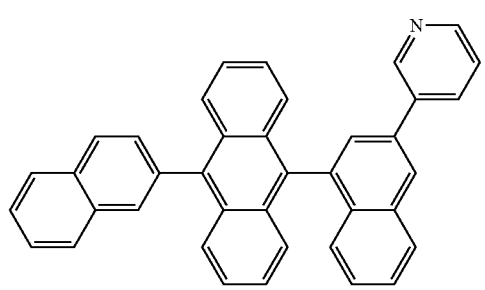
302
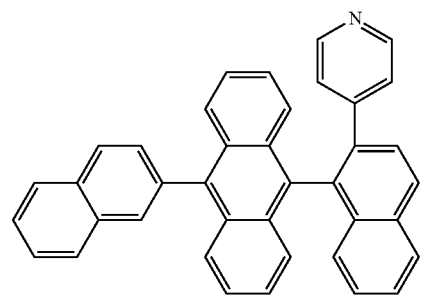
303
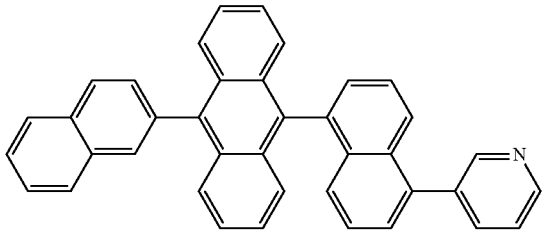

304
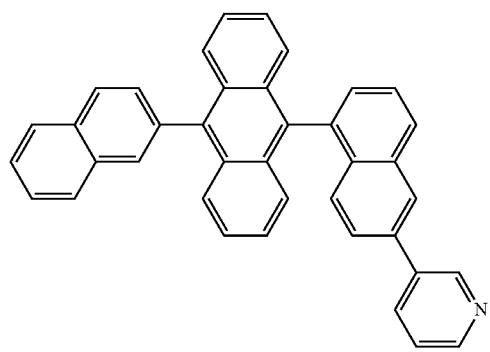
305
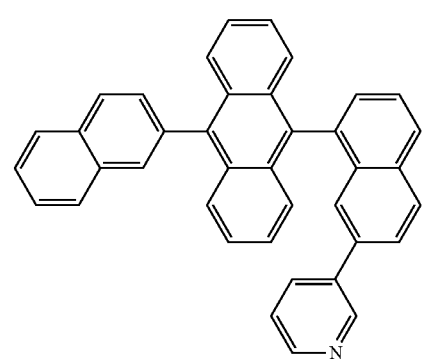
306
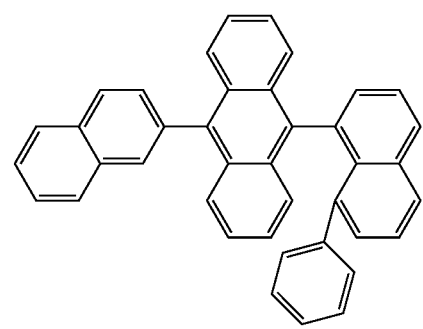
307
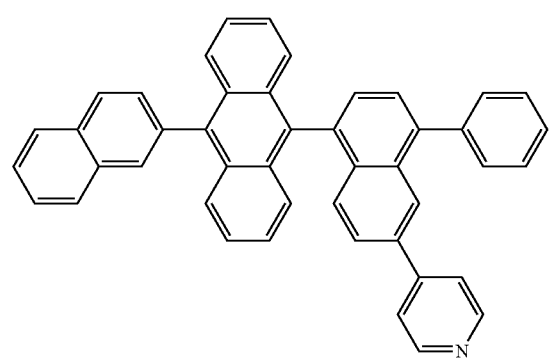
308
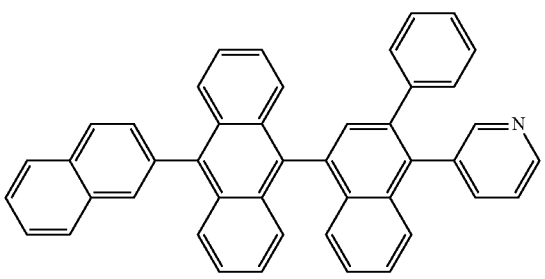
309
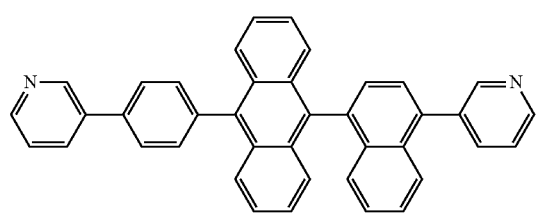
310
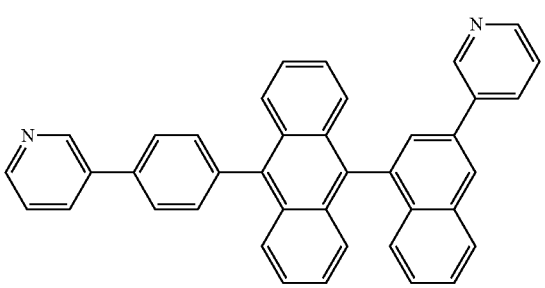
311
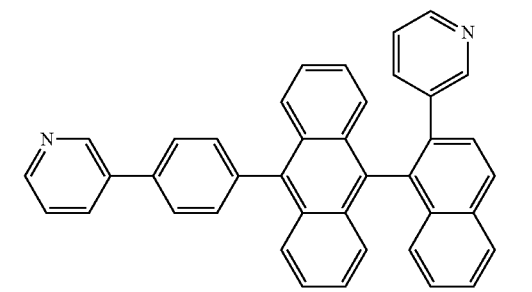
312
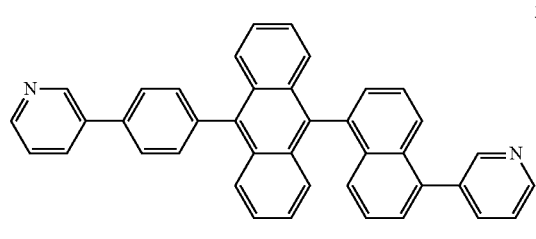

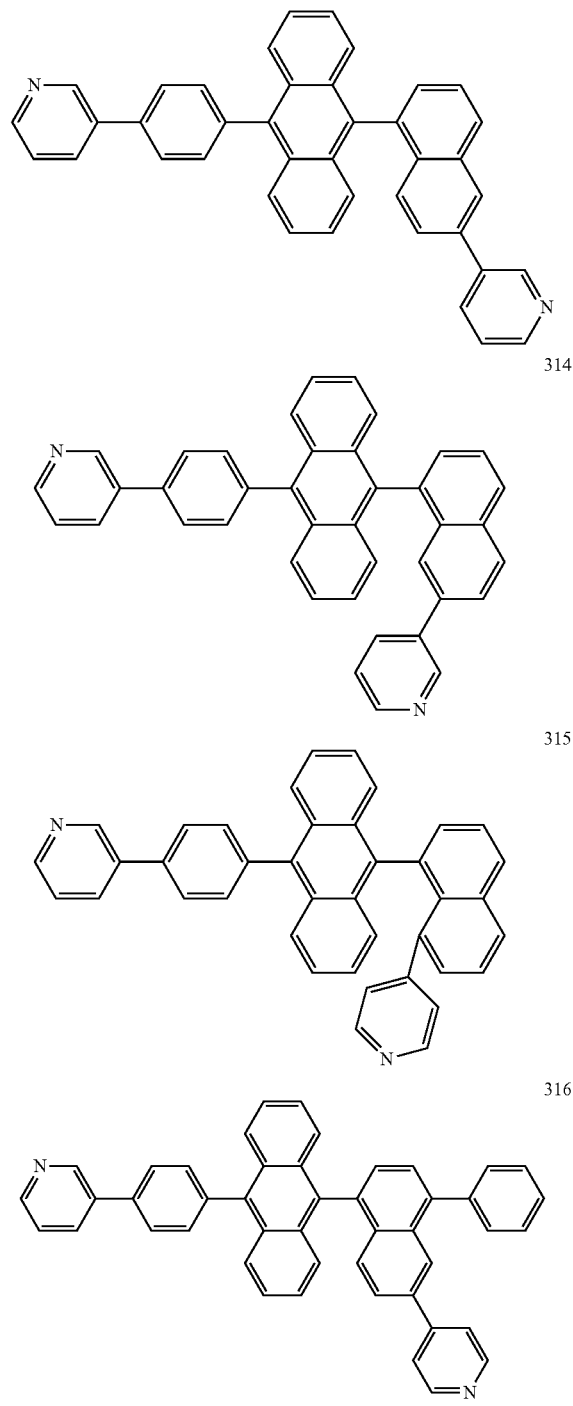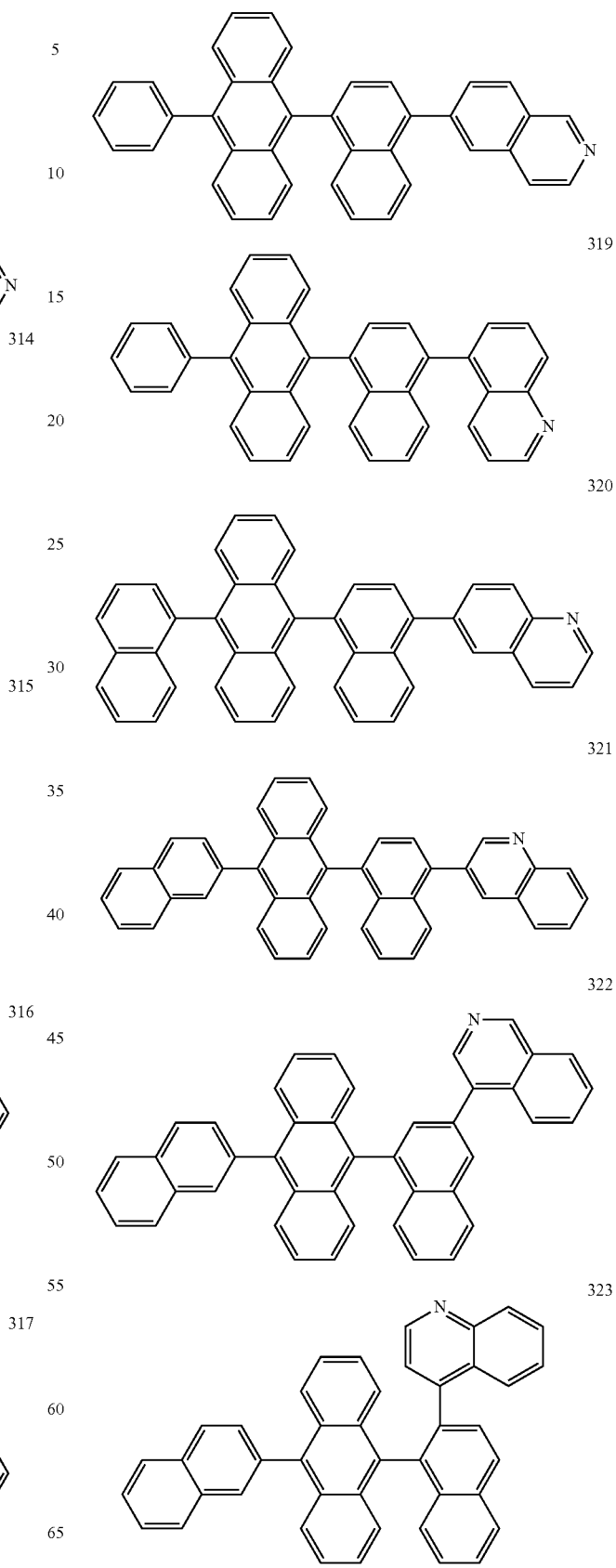

-continued
324
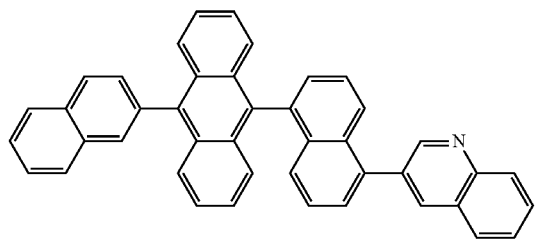
325
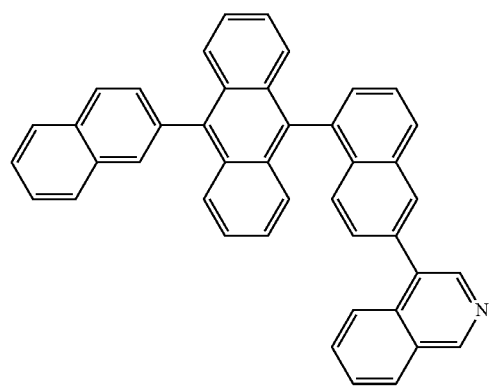
326
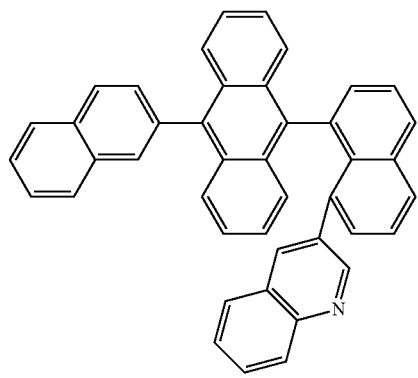
327
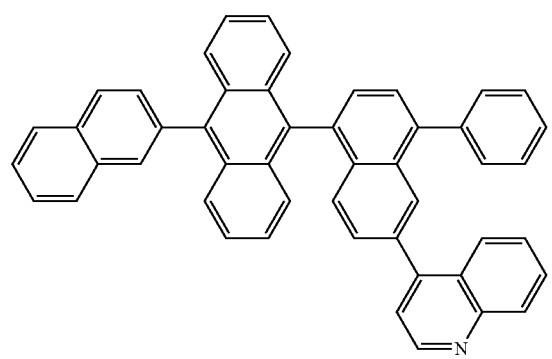
-continued
328
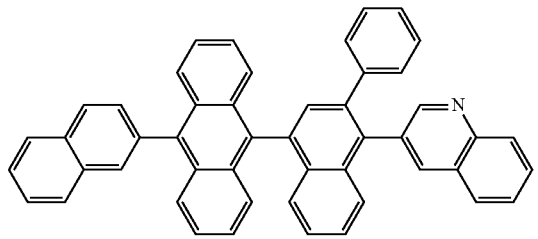
329
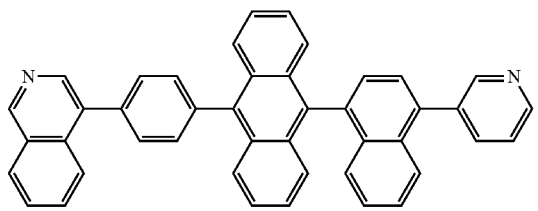
330
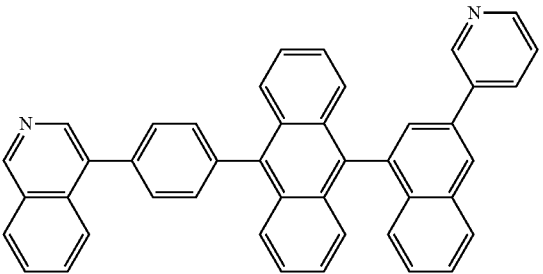
331
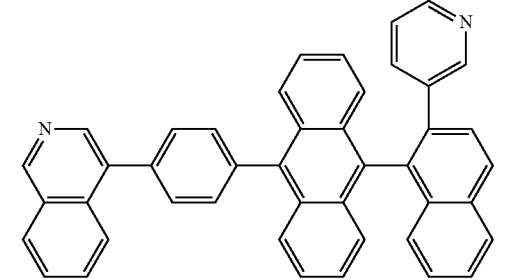
332
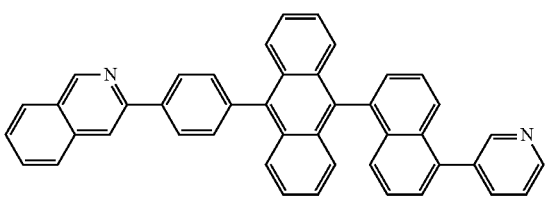
333
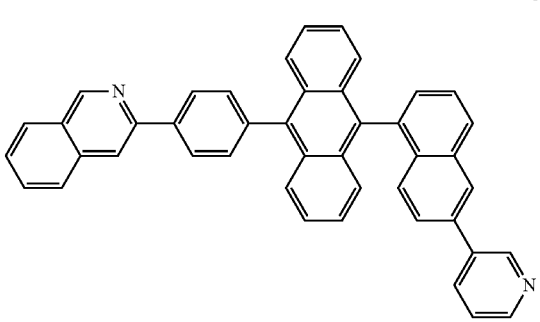

334
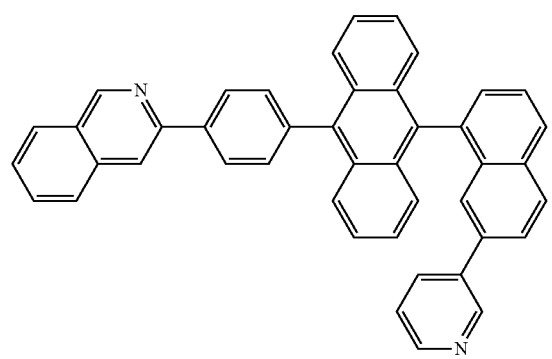
335
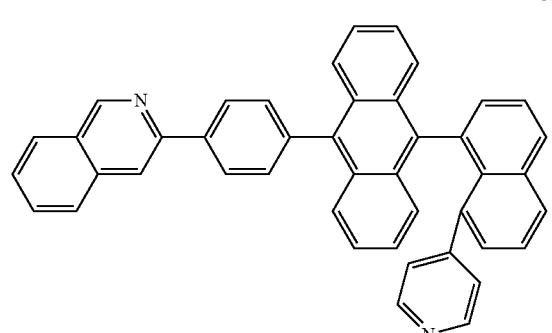
336
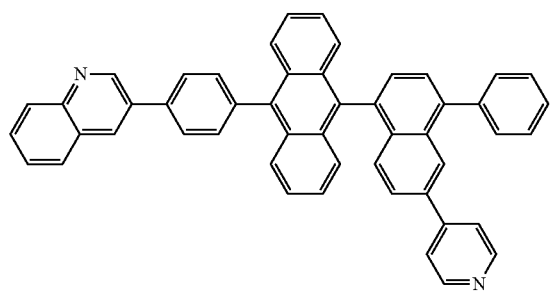
337
338
339
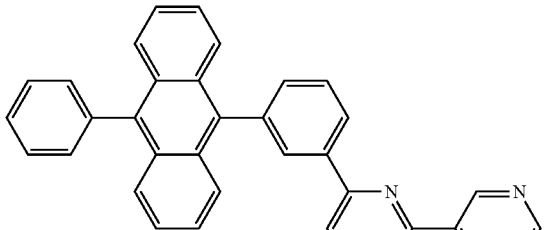
340
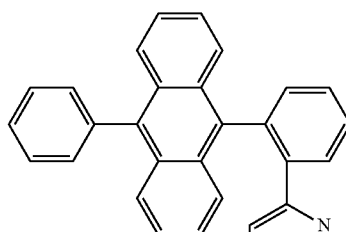
341
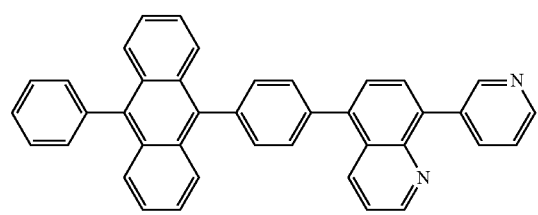
342
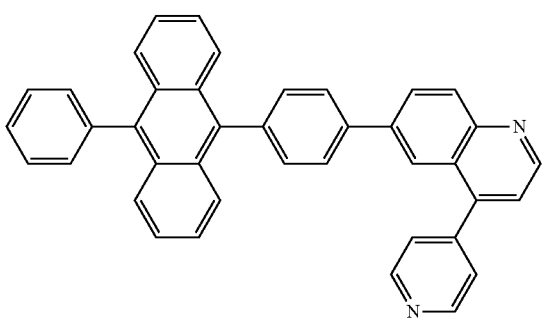
343
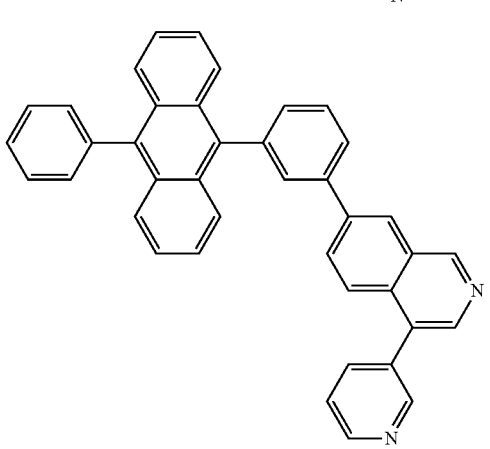

175
-continued
344
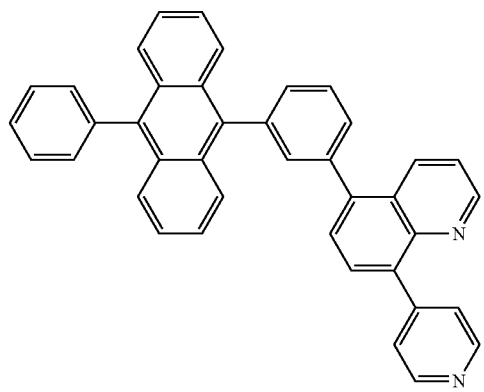
345
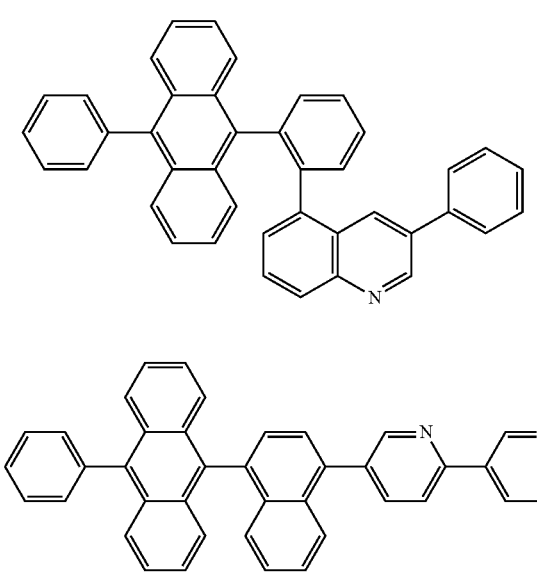
346
347
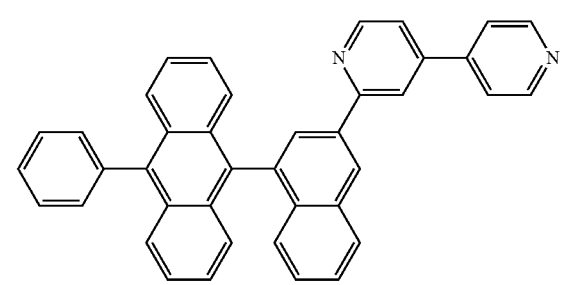
348
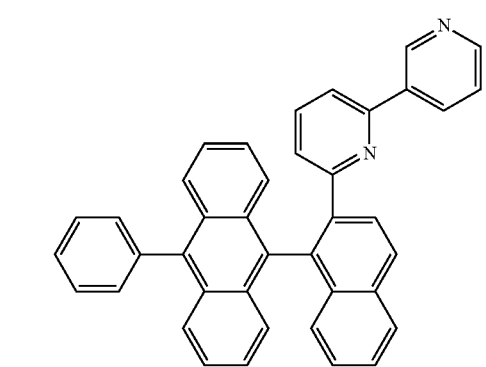
176
-continued
349
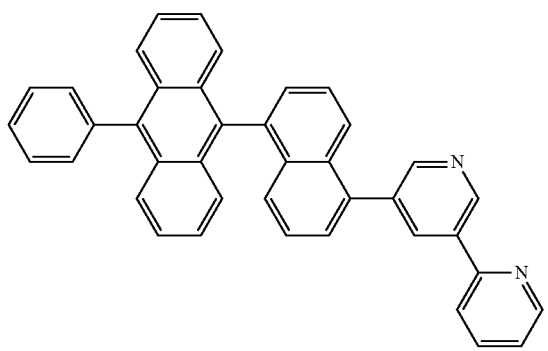
350
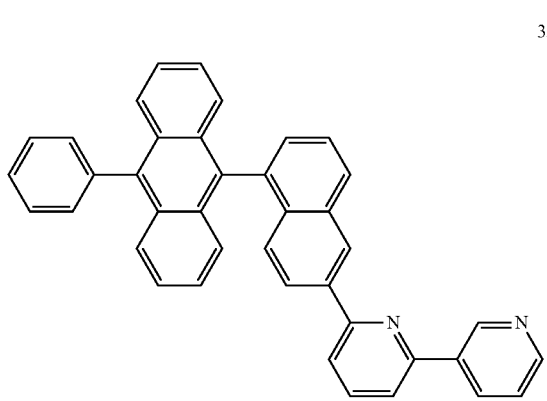
351
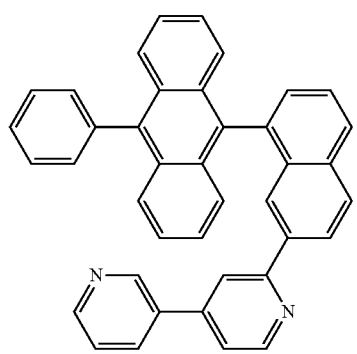
352
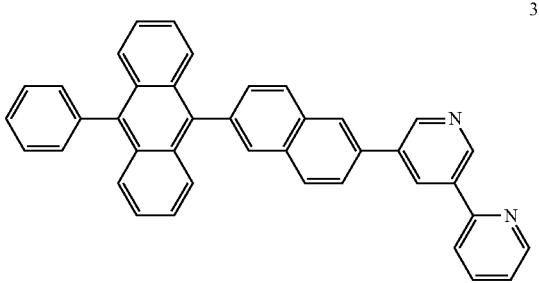

353
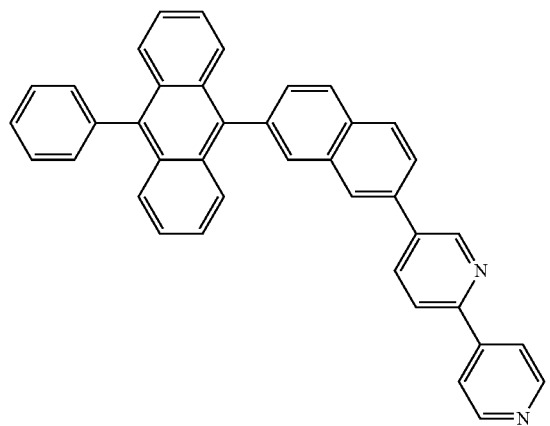
354
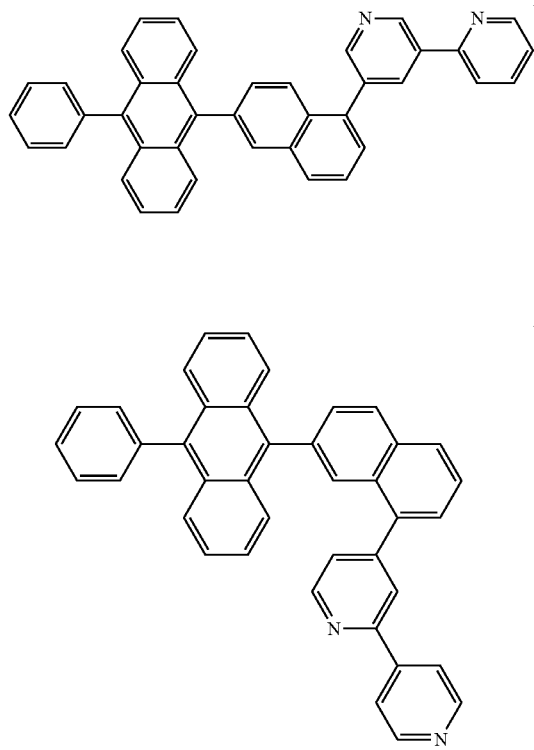
355
356
357
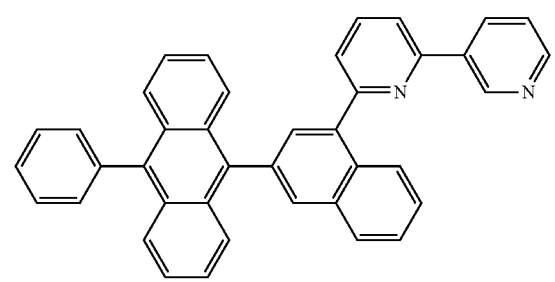
358
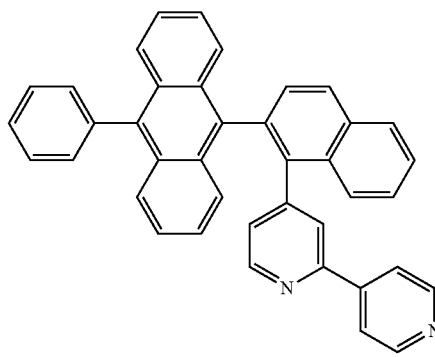
359
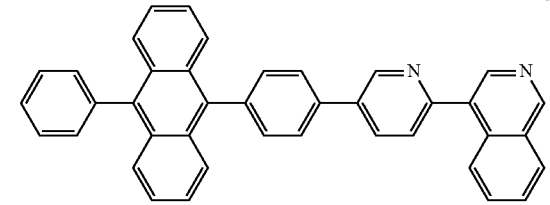
360
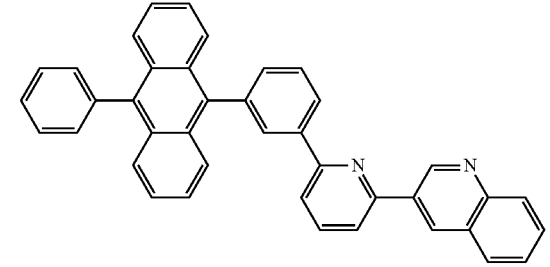
361
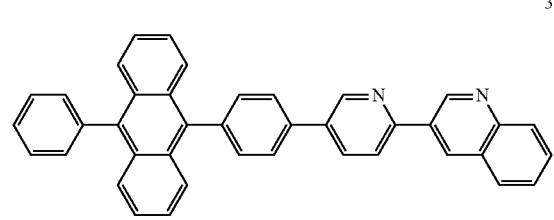
362
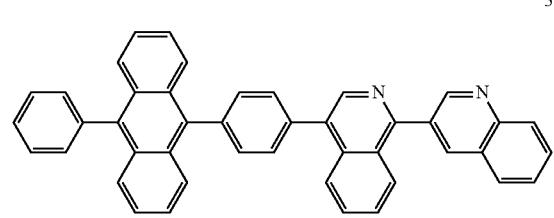

363
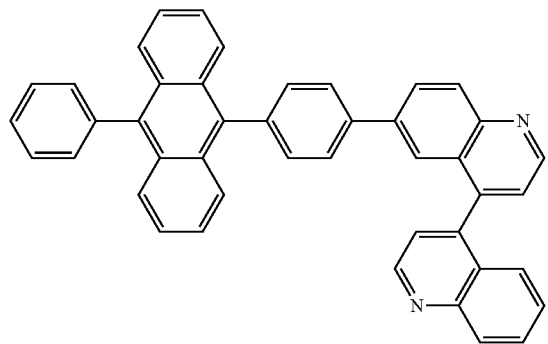
364
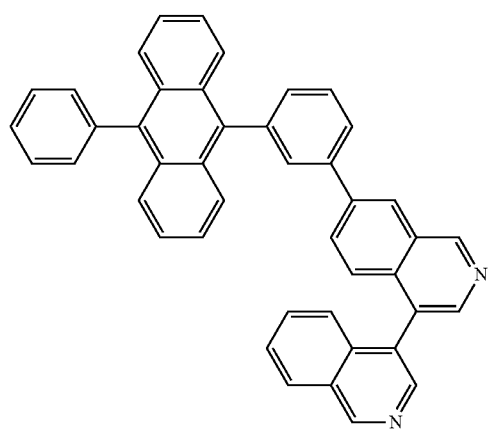
365
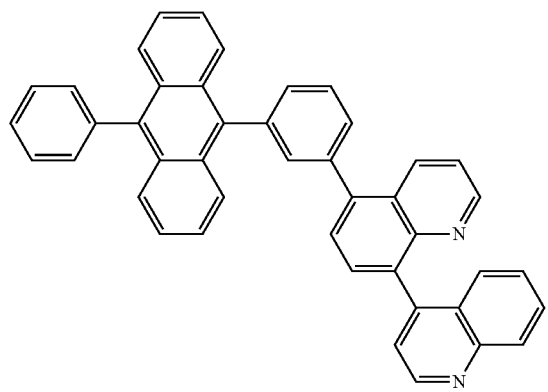
367
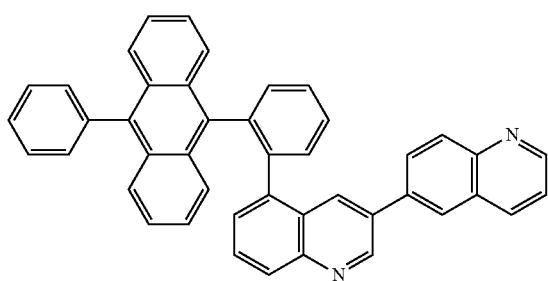
368
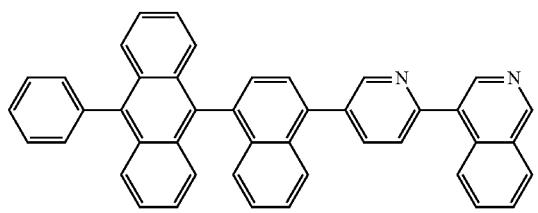
369
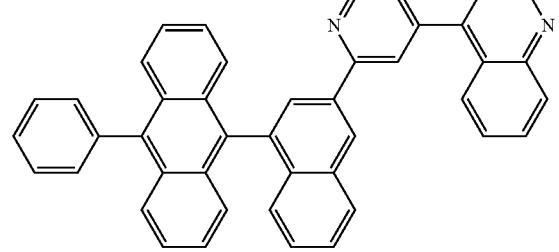
370
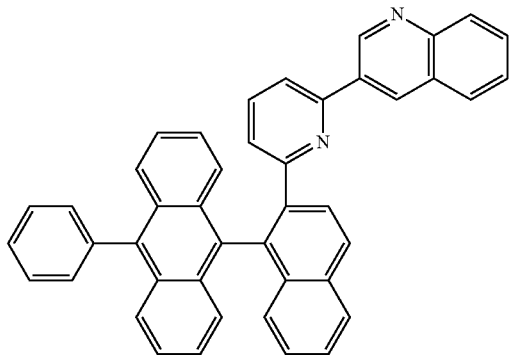
371
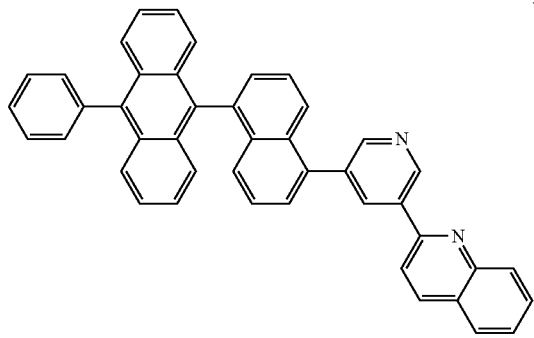
372
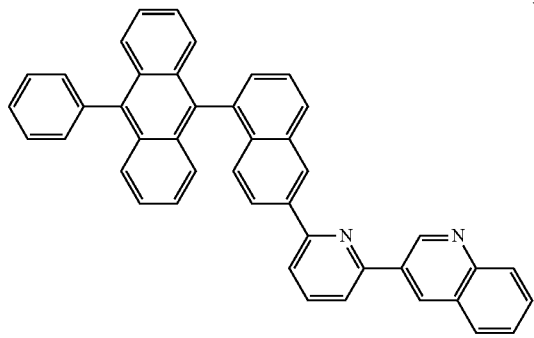

373
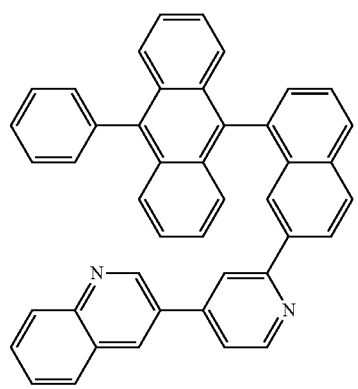
374
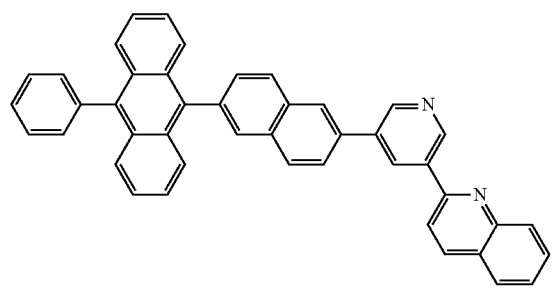
375
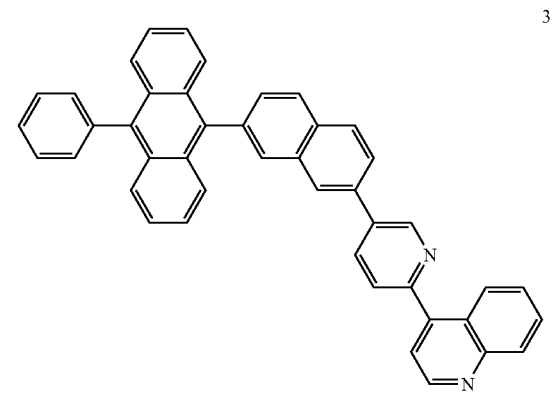
376
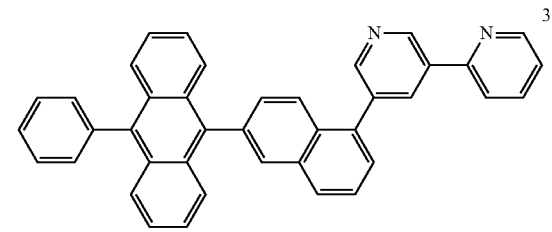
377
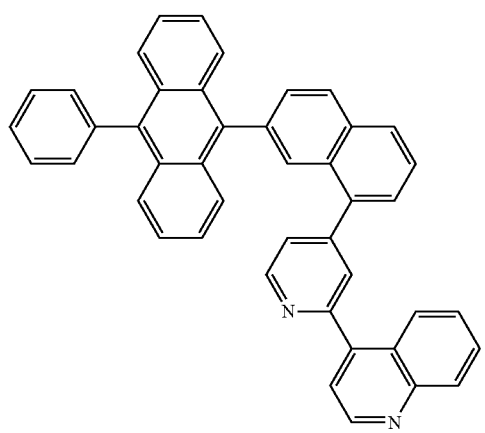
378
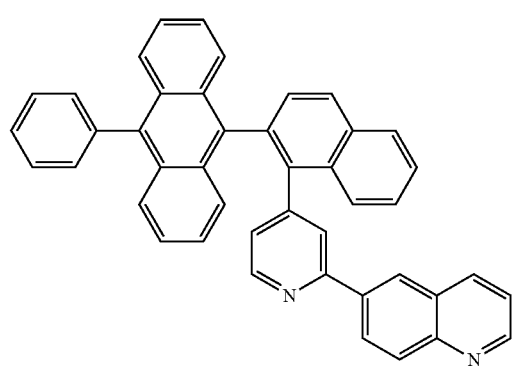
379
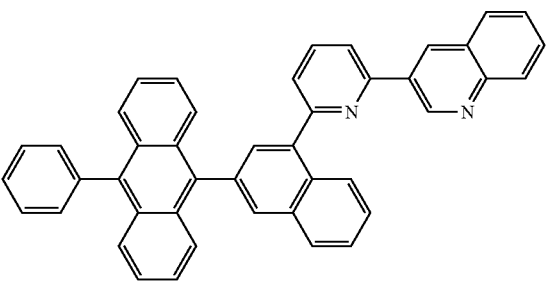
380
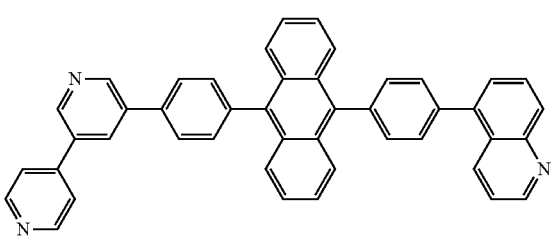
381
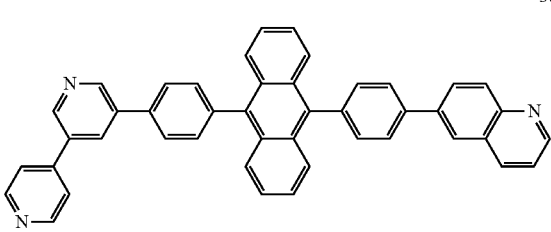

382
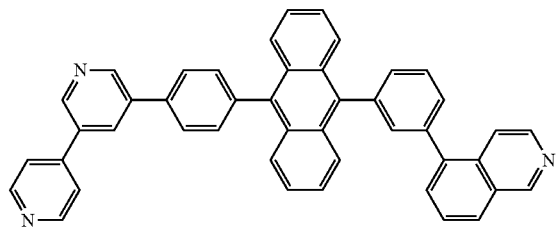
383
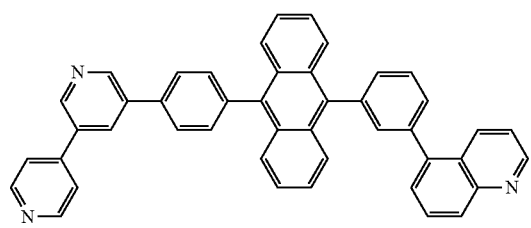
384
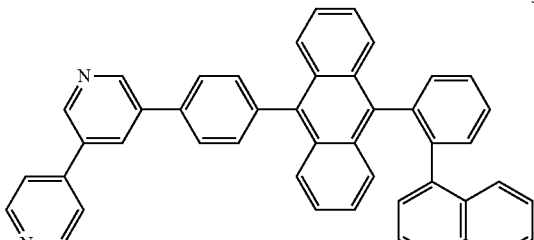
385
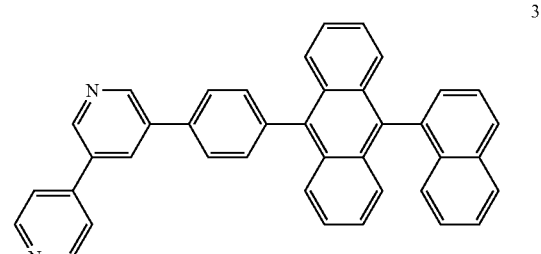
386
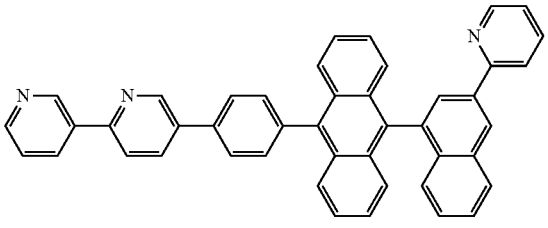
387
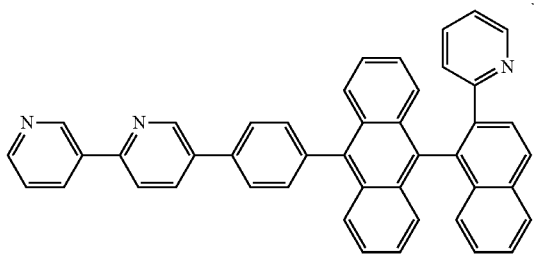
388
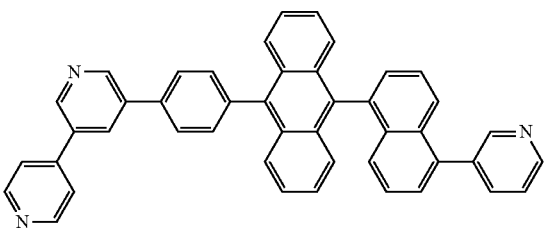
389
390
391
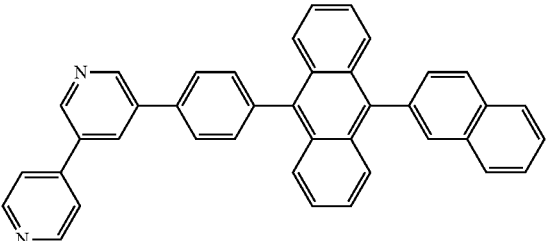
392
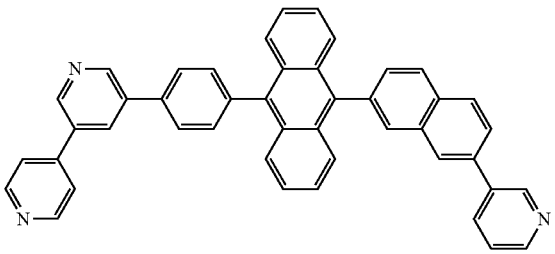

-continued

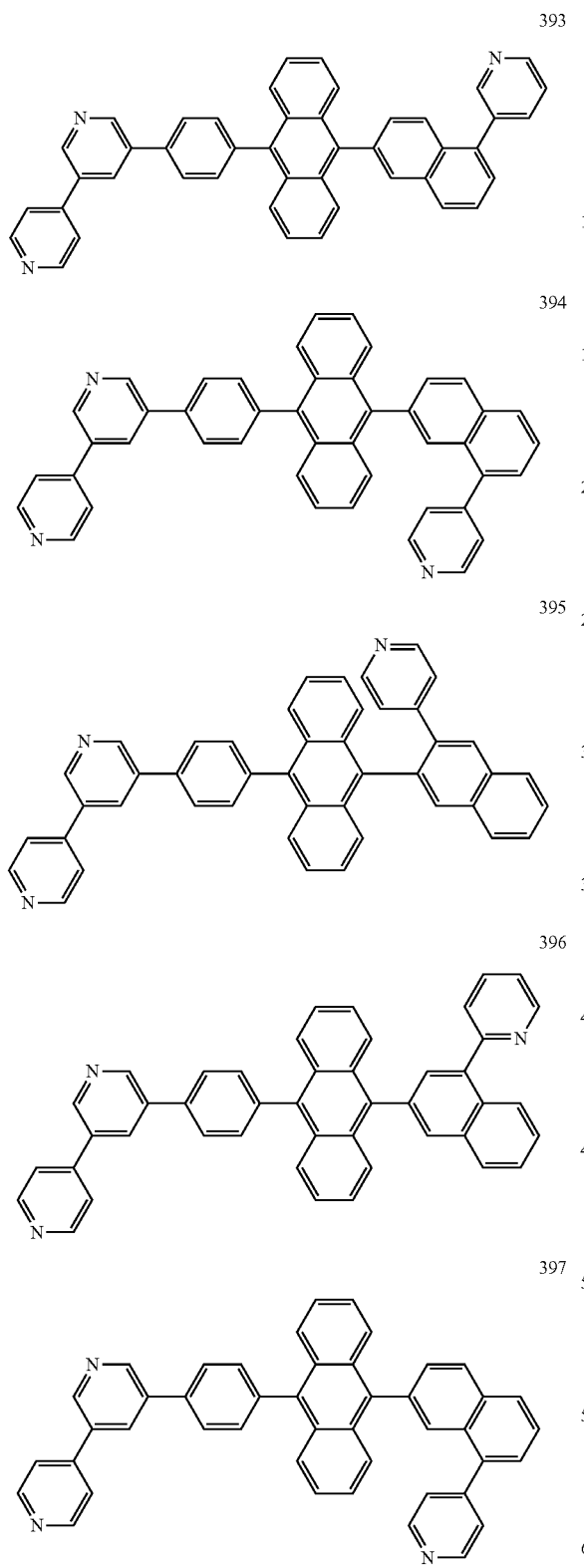

-continued

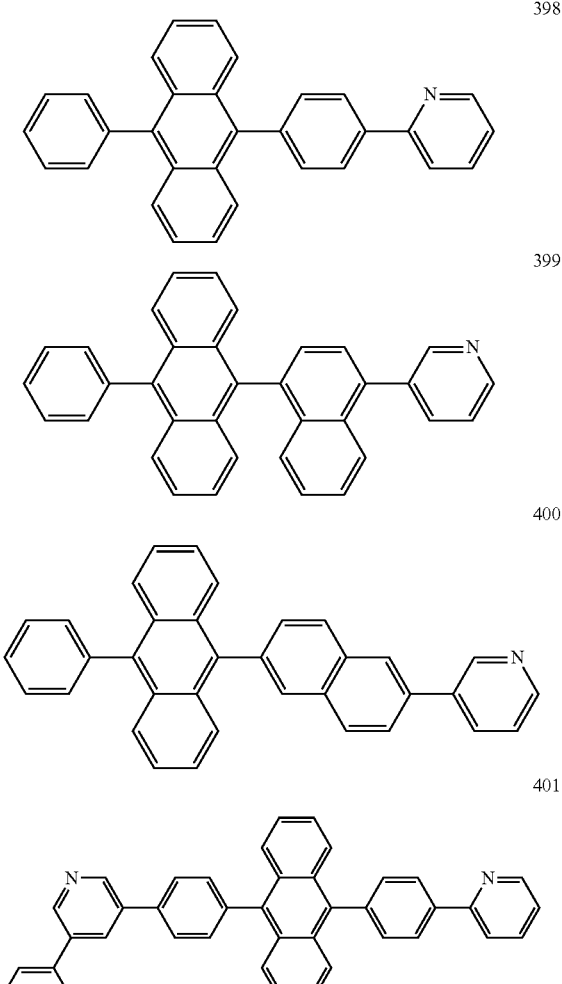

6. The organic light-emitting device as claimed in claim 1, wherein:
   the organic layer includes:
   an emission layer, and
   an electron transport region between the second electrode and the emission layer,
   the emission layer includes the at least one first material, and
   the electron transport region includes the at least one second material.

7. The organic light-emitting device as claimed in claim 6, wherein:
   the electron transport region includes an electron transport layer, and
   the electron transport layer includes the at least one second material.

8. The organic light-emitting device as claimed in claim 6, wherein:
   the electron transport region includes a buffer layer, and
   the buffer layer includes the at least one second material.

* * * * *